(12) United States Patent
Nagatsuka

(10) Patent No.: US 9,496,285 B2
(45) Date of Patent: Nov. 15, 2016

(54) SEMICONDUCTOR DEVICE AND DRIVING METHOD THEREOF

(71) Applicant: Semiconductor Energy Laboratory Co., Ltd., Kanagawa-ken (JP)

(72) Inventor: Shuhei Nagatsuka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/962,809

(22) Filed: Dec. 8, 2015

(65) Prior Publication Data
US 2016/0172383 A1 Jun. 16, 2016

(30) Foreign Application Priority Data

Dec. 10, 2014 (JP) .................. 2014-249820

(51) Int. Cl.
*H01L 27/12* (2006.01)
*H01L 29/786* (2006.01)

(52) U.S. Cl.
CPC ....... *H01L 27/1225* (2013.01); *H01L 27/1255* (2013.01); *H01L 29/7869* (2013.01)

(58) Field of Classification Search
CPC ........... H01L 27/1225; H01L 29/7869; H01L 27/1255
See application file for complete search history.

(56) References Cited

U.S. PATENT DOCUMENTS

| 4,466,081 A | 8/1984 | Masuoka |
|---|---|---|
| 4,609,986 A | 9/1986 | Hartmann et al. |
| 4,642,487 A | 2/1987 | Carter |
| 4,870,302 A | 9/1989 | Freeman |
| 4,902,637 A | 2/1990 | Kondou et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,314,017 B1 | 11/2001 | Emori et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

(Continued)

*Primary Examiner* — David Vu
(74) *Attorney, Agent, or Firm* — Husch Blackwell LLP

(57) ABSTRACT

The semiconductor device includes a transistor, first to N-th switches (N is a natural number of three or more), and first to (N−1)-th capacitors. A first terminal of the first capacitor (or a J-th capacitor) is electrically connected to a gate of the transistor (or a second terminal of a (J−1)-th capacitor (J is a natural number of two or more and (N−1) or less)). A first (or K-th) potential is supplied to the gate of the transistor through the first switch (or a second terminal of a (K−1)-th capacitor through a K-th switch (K is a natural number of two or more and N or less)). A capacitance value of the first capacitor is preferably equal to a gate capacitance value of the transistor, and a capacitance value of the J-th capacitor is preferably equal to a capacitance value of the (J−1)-th capacitor.

18 Claims, 41 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 6,781,865 B2 | 8/2004 | Ohtsuka et al. |
| 7,030,650 B1 | 4/2006 | Kaptanoglu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,054,121 B2 | 11/2011 | Kato |
| 8,314,637 B2 | 11/2012 | Kato et al. |
| 8,339,828 B2 | 12/2012 | Yamazaki et al. |
| 8,339,836 B2 | 12/2012 | Yamazaki et al. |
| 8,432,187 B2 * | 4/2013 | Kato .................. G11C 14/0054 326/46 |
| 8,520,426 B2 | 8/2013 | Ohnuki |
| 8,542,528 B2 | 9/2013 | Sekine et al. |
| 8,614,916 B2 | 12/2013 | Nagatsuka et al. |
| 8,659,935 B2 | 2/2014 | Yamazaki et al. |
| 8,686,415 B2 | 4/2014 | Kamata |
| 8,792,284 B2 | 7/2014 | Ohnuki |
| 8,848,464 B2 | 9/2014 | Sekine et al. |
| 8,854,865 B2 | 10/2014 | Saito |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0047286 A1 | 3/2007 | Miki |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280058 A1 | 11/2008 | Krunks et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2011/0114945 A1 | 5/2011 | Yamazaki et al. |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194332 A1 | 8/2011 | Saito |
| 2012/0161220 A1 | 6/2012 | Yamazaki |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293203 A1 | 11/2012 | Ohmaru et al. |
| 2012/0293206 A1 | 11/2012 | Yoneda et al. |
| 2012/0293242 A1 | 11/2012 | Kato |
| 2012/0306533 A1 | 12/2012 | Ohmaru |
| 2013/0308392 A1 | 11/2013 | Nishijima et al. |
| 2014/0177345 A1 | 6/2014 | Yamazaki et al. |
| 2014/0241054 A1 | 8/2014 | Koyama |
| 2014/0269063 A1 | 9/2014 | Nagatsuka et al. |

(56) References Cited

U.S. PATENT DOCUMENTS

| | | |
|---|---|---|
| 2014/0269099 A1 | 9/2014 | Nagatsuka et al. |
| 2014/0286073 A1 | 9/2014 | Onuki |
| 2014/0374747 A1 | 12/2014 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 A | 12/2012 |
| WO | WO 2004/114391 A1 | 12/2004 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M.J. et al., "Electron Microscopy of a Cholesteric Liquid Crystal and its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZNO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium—Gallium—Zinc Oxide TFTs Array," SID Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and its Bending Properties," SID Digest '09: SID International Symposium Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn]at Temperatures Over 1000°C..," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits , 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-666.

Lee, J-H. et al., "World'S Largest (15-Inch) XGA AMLCD Panel Using IGZO Oxide TFT," SID Digest '08: SID International Symposium Digest of Technical Papers, May 2, 2008, vol. 39, pp. 625-628.

(56) References Cited

OTHER PUBLICATIONS

Lee, M-H. et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "Suftla Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350°C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3:4.0 In. QVGA AMOLED Display Using In—Ga—Zn—Oxide TFTs With a Novel Passivation Layer," SID Digest '09: SID International Symposium Digest of Technical Papers, May 31, 2009, pp. 284-287.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Park, J-S. et al., "Amorphous Indium—Gallium—Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium—Gallium—Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by PEALD Grown ZnO TFT", IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 2996, vol. 68, No. 25, pp. 3650-3652.

Sakata, J. et al., "Development of 4.0-In. AMOLED Display With Driver Circuit Using Amorphous In—Ga—Zn—Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

* cited by examiner

10a

10b

200a

200b

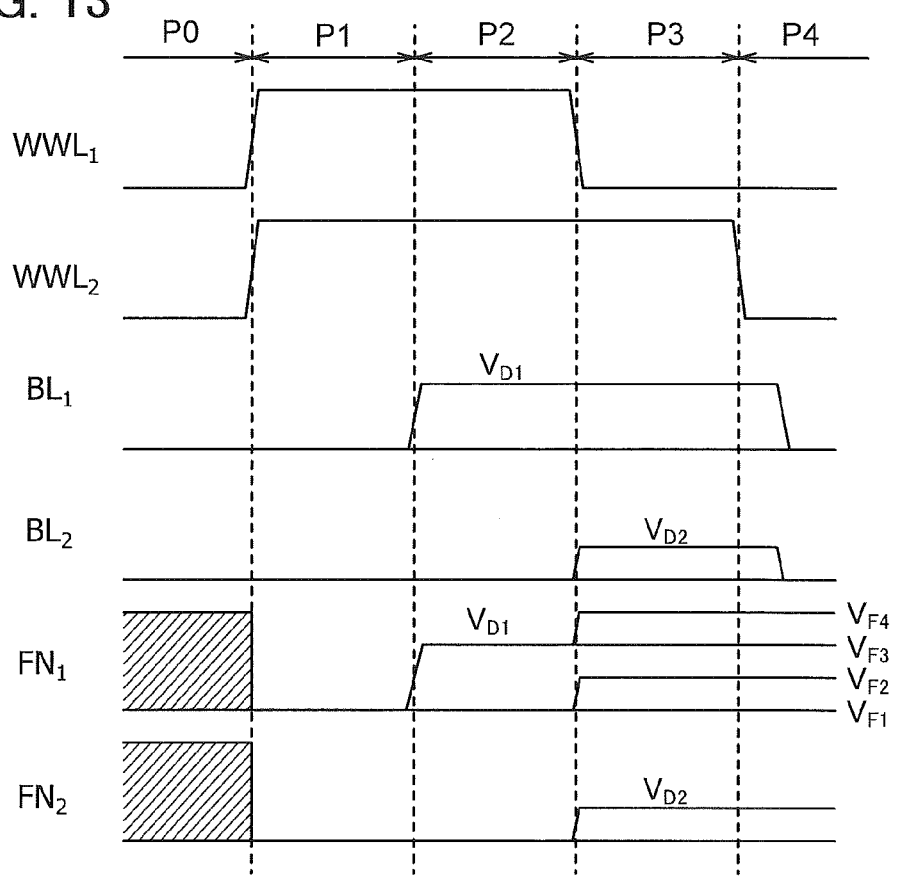

201a

201b

202a

202b

203a

203b

204a

204b

205a

205b

SEMICONDUCTOR DEVICE AND DRIVING METHOD THEREOF

BACKGROUND OF THE INVENTION

1. Field of the Invention

One embodiment of the present invention relates to a semiconductor device and a driving method thereof.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

Much attention has been focused on a semiconductor device that retains data by using a combination of a transistor in which silicon (Si) is used for a semiconductor layer and a transistor in which an oxide semiconductor (OS) is used for a semiconductor layer (hereinafter "OS transistor") (see Patent Document 1).

In recent years, with the increase in the amount of data manipulated, a semiconductor device having a large storage capacity has been required. In such situations, the semiconductor device disclosed in Patent Document 1 has a structure in which multilevel data is stored and read.

REFERENCE

Patent Document

[Patent Document 1] Japanese Published Patent Application No. 2012-256400

SUMMARY OF THE INVENTION

For example, in the semiconductor device disclosed in Patent Document 1, for writing 2-bit (4-level) data into one memory cell, four kinds of power supply potentials are necessary. For writing multilevel data of more levels into the memory cell, power supply potentials whose number corresponds to the number of data is necessary, so that the circuit configuration becomes complicated.

An object of one embodiment of the present invention is to provide a semiconductor device in which multilevel data can be written with a small number of power supply potentials. Another object of one embodiment of the present invention is to provide a semiconductor device in which multilevel data can be written and read. Another object of one embodiment of the present invention is to provide a driving method of a semiconductor device in which multilevel data can be written and read. Another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including a transistor, first and second switches; and a capacitor. A first terminal of the capacitor is electrically connected to a gate of the transistor. A first potential is supplied to the gate of the transistor through the first switch. A second potential is supplied to a second terminal of the capacitor through the second switch. A capacitance value of the capacitor is preferably equal to a gate capacitance value of the transistor.

In the above embodiment, the first and second switches are preferably transistors each including an oxide semiconductor in a channel formation region.

In the above embodiment, it is preferable that the first switch be positioned over the transistor and the second switch be positioned over the first switch.

Another embodiment of the present invention is a semiconductor device including a transistor, first to N-th switches (N is a natural number of three or more); and first to (N−1)-th capacitors. A first terminal of the first capacitor is electrically connected to a gate of the transistor. A first terminal of a J-th capacitor is electrically connected to a second terminal of a (J−1)-th capacitor (J is a natural number of two or more and (N−1) or less). A first potential is supplied to the gate of the transistor through the first switch. A K-th potential is supplied to a second terminal of a (K−1)-th capacitor through a K-th switch (K is a natural number of two or more and N or less). It is preferable that a capacitance value of the first capacitor be equal to a gate capacitance value of the transistor and a capacitance value of the J-th capacitor be equal to a capacitance value of the (J−1)-th capacitor.

In the above embodiment, the first to N-th switches are preferably transistors each including an oxide semiconductor in a channel formation region.

In the above embodiment, it is preferable that the first switch be positioned over the transistor, and the K-th switch be positioned over the (K−1)-th switch.

Another embodiment of the present invention is a semiconductor device including a transistor, first and second switches, and first and second capacitors. A first terminal of the first capacitor is electrically connected to a gate of the transistor. A first terminal of the second capacitor is electrically connected to the gate of the transistor. A first potential is supplied to the gate of the transistor through the first switch. A second potential is supplied to a second terminal of the first capacitor through the second switch. A third potential is supplied to a second terminal of the second capacitor. A capacitance value of the first capacitor is preferably equal to the sum of a gate capacitance value of the transistor and a capacitance value of the second capacitor.

In the above embodiment, the first and second switches are preferably transistors each including an oxide semiconductor in a channel formation region.

In the above embodiment, it is preferable that the first switch be positioned over the transistor, and the second switch be positioned over the first switch.

Another embodiment of the present invention is a semiconductor device including a transistor, first to N-th switches (N is a natural number of three or more), and first to N-th capacitors. A first terminal of the first capacitor is electrically connected to a gate of the transistor. A first terminal of the N-th capacitor is electrically connected to the gate of the transistor. A first terminal of a J-th capacitor is electrically connected to a second terminal of a (J−1)-th capacitor (J is a natural number of two or more and (N−1) or less). A first potential is supplied to the gate of the transistor through the first switch. A K-th potential is supplied to a second terminal of a (K−1)-th capacitor through a K-th switch (K is a natural number of two or more and N or less). An (N+1)-th potential is supplied to a second terminal of the N-th capacitor. It is preferable that a capacitance value of the first capacitor be equal to the sum of a gate capacitance value of the transistor and a capacitance value of the N-th capacitor and a capacitance value of the J-th capacitor be equal to a capacitance value of the (J−1)-th capacitor.

In the above embodiment, the first to N-th switches are preferably transistors each including an oxide semiconductor in a channel formation region.

In the above embodiment, it is preferable that the first switch be positioned over the transistor and the K-th switch be positioned over the (K−1)-th switch.

Another embodiment of the present invention is an electronic device that includes the semiconductor device according to any of the above embodiments and at least one of a microphone, a speaker, a display portion, and an operation key.

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, the scale is not necessarily limited to that illustrated in the drawings. Note that the drawings are schematically illustrated for clarity, and shapes or values are not limited to those illustrated in the drawings. For example, the following can be included: variation in signal, voltage, or current due to noise or difference in timing.

In this specification and the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" or "wirings" formed in an integrated manner.

In this specification and the like, the terms "voltage" and "potential" are interchangeable in appropriate cases. The term "voltage" refers to a potential difference between a given potential and a reference potential. When the reference potential is a ground potential, the term "voltage" can be replaced with the term "potential". The ground potential does not necessarily mean 0 V. Note that a potential is relative, and a potential supplied to wirings or the like may be changed depending on a reference potential.

In this specification and the like, the terms "film", "layer", and the like can be interchanged with each other depending on the case or circumstances. For example, the teen "conductive layer" can be changed into the term "conductive film" in some cases. Also, the term "insulating film" can be changed into the term "insulating layer" in some cases.

In this specification and the like, a switch is an element that is brought into a conduction state or a non-conduction state (is turned on or off) to determine whether to have a current flow therethrough or not. Alternatively, the switch is an element having a function of selecting and changing a current path.

For example, an electrical switch, a mechanical switch, or the like can be used as a switch. That is, any element can be used as a switch as long as it can control a current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source and a drain of the transistor are electrically short-circuited. Furthermore, an "off state" of the transistor refers to a state in which the source and drain of the transistor are electrically disconnected. Note that if the transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (is turned on or off) to determine whether a current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on a current), an electron emitter, a liquid crystal element, electronic ink, an electrophoretic element, a grating light valve (GLV), a plasma display panel (PDP), a display element using MEMS, a DMD, a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electric or magnetic effect may be included. Examples of a display device using an EL element include an EL display. Display devices using electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. Such provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Furthermore, in the present specification, any of the embodiments described below can be combined as appropriate. In the case where some structure examples are given in one embodiment, any of the structure examples can be combined as appropriate.

In one embodiment of the present invention, a semiconductor device in which multilevel data can be written with a small number of power supply potentials can be provided. Further, in one embodiment of the present invention, a semiconductor device in which multilevel data can be written and read can be provided. In one embodiment of the present invention, a driving method of a semiconductor device in which multilevel data can be written and read can be provided. Further, in one embodiment of the present invention, a novel semiconductor device can be provided.

Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

In the accompanying drawings:

FIG. 13 is a timing chart illustrating an operation example of a memory cell;

DETAILED DESCRIPTION OF THE INVENTION

Embodiments will be described below with reference to drawings. However, the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification, a high power supply potential is referred to as an H level (or potential $V_{DD}$), and a low power supply potential is referred to as an L level (or potential GND), in some cases.

In this specification, N is regarded as an integer of 3 or more, unless otherwise specified.

Embodiment 1

In this embodiment, configuration examples of a semiconductor device of one embodiment of the present invention will be described with reference to FIGS. 1A and 1B, FIGS. 2A to 2D, FIGS. 3A and 3B, FIG. 4, FIG. 5, FIGS. 6A and 6B, FIGS. 7A and 7B, FIGS. 8A and 8B, FIGS. 9A and 9B, FIGS. 39A and 39B, and FIGS. 40A and 40B.

<Basic Configuration of Memory Cell>

Figure 1A:
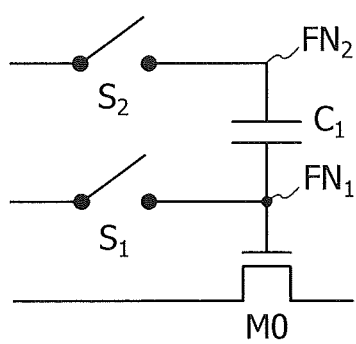
FIGS. 1A and 1B are circuit diagrams each illustrating a configuration example of a memory cell.
Figure 1B:
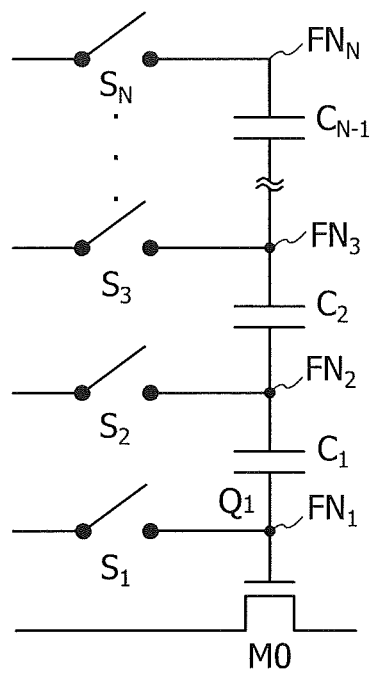

FIG. 1A is a circuit diagram illustrating a configuration example of a memory cell 10a to which multilevel data can be written. Furthermore, FIG. 1B is a circuit diagram illustrating a configuration example of a memory cell 10b to which multilevel data can be written.

The memory cell 10a includes a transistor M0, a switch $S_1$, a switch $S_2$, and a capacitor $C_1$.

In the memory cell 10a, a first terminal of the capacitor $C_1$ is electrically connected to a gate of the transistor M0 and a first terminal of the switch $S_1$. A second terminal of the capacitor $C_1$ is electrically connected to a first terminal of the switch $S_2$.

Note that as illustrated in FIG. 1A, a node of the gate of the transistor M0, the first terminal of the capacitor $C_1$, and the first terminal of the switch $S_1$ is referred to as a node $FN_1$, and a node of the second terminal of the capacitor $C_1$ and the first terminal of the switch $S_2$ is referred to as a node $FN_2$.

The memory cell 10b includes the transistor M0, switches $S_1$ to $S_N$, and capacitors $C_1$ to $C_{(N-1)}$.

In the memory cell 10b, the first terminal of the capacitor $C_1$ is electrically connected to the gate of the transistor M0 and the first terminal of the switch $S_1$. A first terminal of the capacitor $C_2$ is electrically connected to the second terminal of the capacitor $C_1$ and the first terminal of the switch $S_2$. A first terminal of the capacitor $C_3$ is electrically connected to a second terminal of the capacitor $C_2$ and a first terminal of the switch $S_3$. In this manner, the above connection relationship is repeated until a first terminal of the capacitor $C_{(N-1)}$ is electrically connected to a second terminal of the capacitor $C_{(N-2)}$ and a first terminal of the switch $S_{(N-1)}$. A second terminal of the capacitor $C_{(N-1)}$ is electrically connected to a first terminal of the switch $S_N$.

Note that as illustrated in FIG. 1B, nodes of the switches $S_1$ to $S_N$ and the first or second terminal of the capacitors $C_1$ to $C_{(N-1)}$ are referred to as nodes $FN_1$ to $FN_N$.

FIGS. 2A to 2D illustrate a writing operation example of the memory cell 10b. A writing operation of the memory cell 10b is described below. Note that the memory cell 10a can be regarded as the memory cell 10b in the case where N=2. Thus, the description for the operation of the memory cell 10b can be used for the memory cell 10a without any change.

The case where potentials $V_{D1}$ to $V_{DN}$ each include binary (1-bit) data at an H level and an L level is shown below.

Figure 2A:
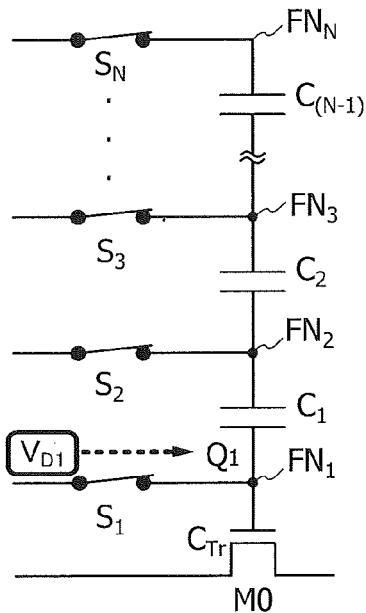
FIGS. 2A to 2D are circuit diagrams illustrating an operation example of a memory cell.
Figure 2B:
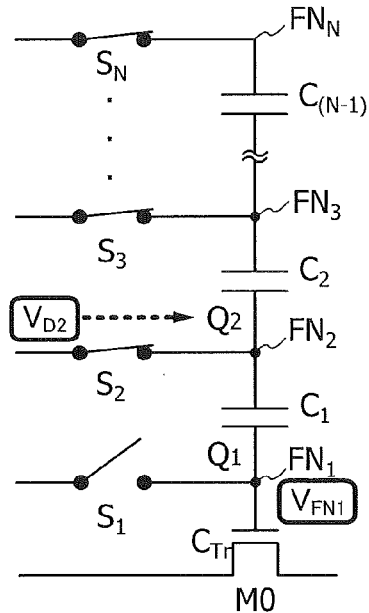

First, the switches $S_2$ to $S_N$ are turned on, and then the potential $V_{D1}$ is supplied to the node $FN_1$ through the switch $S_1$. Electric charge $Q_1$ is written to the node $FN_1$ (FIG. 2A). At this time, L-level potentials are supplied to the nodes $FN_2$ to $FN_N$, for example. Then, the switch $S_1$ is turned off, and the node $FN_1$ becomes electrically floating. After that, the potential $V_{D2}$ is supplied to the node $FN_2$ through the switch $S_2$. Electric charge $Q_2$ is written to the node $FN_2$ (FIG. 2B). The potential of the node $FN_1$ is changed to a potential $V_{FN1}$ owing to capacitive coupling with the potential supplied to the node $FN_2$. Here, the potential $V_{FN1}$ contains 4-level (2-bit: $V_{D1}(H)V_{D2}(H)$, $V_{D1}(H)V_{D2}(L)$, $V_{D1}(L)V_{D2}(H)$, and $V_{D1}(L)V_{D2}(L)$) data.

Figure 2C:
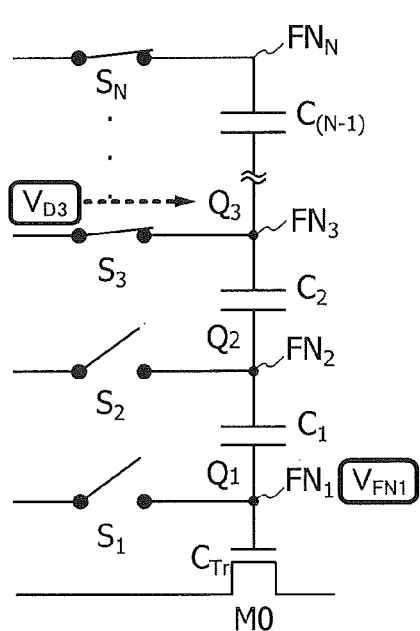

Next, the switch $S_2$ is turned off to make the node $FN_2$ electrically floating. Then, the potential $V_{D3}$ is supplied to a node $FN_3$ through the switch $S_3$. Electric charge $Q_3$ is written to the node $FN_3$ (FIG. 2C). At this time, the potential $V_{FN1}$ contains 8-level (3-bit) data.

Figure 2D:
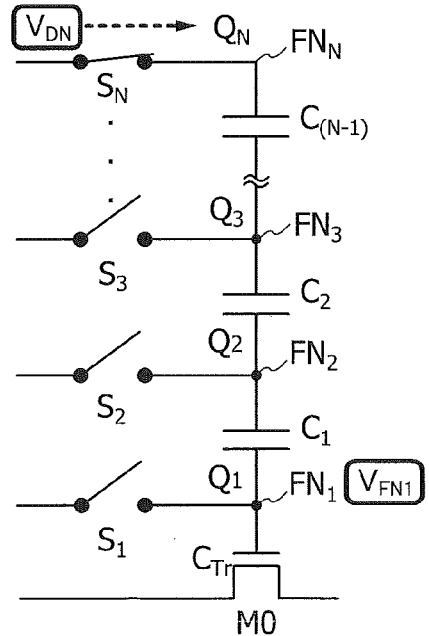

In this manner, the above operation is repeated until the potential $V_{DN}$ is supplied to the node $FN_N$ through the switch $S_N$ and the electric charge $Q_N$ is written (FIG. 2D). Finally, the potential $V_{FN1}$ contains $2^N$-level (N-bit) data. For example, in the case where N=8, the potential $V_{FN1}$ contains $2^8(=256)$-level (8-bit) data.

The $2^N$-level potentials need to be different from each other. For that purpose, capacitance values of the capacitors $C_1$ to $C_{(N-1)}$ need to be adjusted. A method for determining capacitance values of the capacitors $C_1$ to $C_{(N-1)}$ is described below.

First, the capacitor $C_1$ is considered. The amount of change in the potential of the node $FN_1$ ($\Delta V_{FN1}$) and the amount of change in the potential of the node $FN_2$ ($\Delta V_{FN2}$) due to capacitive coupling, and the capacitance value of the capacitor $C_1$ satisfy the following relational expression. In the formula (1), $C_{Tr}$ represents a gate capacitance value of the transistor M0.

$$C_1 \times \Delta V_{FN2} = (C_1 + C_{Tr}) \times \Delta V_{FN1} \qquad (1)$$

For example, the case where the H-level potential is 1 V and the L-level potential is 0 V is considered. That is, the case where $V_{D1}=(1\ V, 0\ V)$ and $V_{D2}=(1\ V, 0\ V)$ is considered.

In the case where a potential of 1 V is supplied as the potential $V_{D2}$, the potential of the node $FN_1$ is preferably changed by 0.5 V owing to capacitive coupling. Accordingly, the potential $V_{FN1}$ can have 4-level potentials uniformly ($V_{FN1}=0\ V, 0.5\ V, 1.0\ V$, and 1.5 V). Thus, 1 V and 0.5 V are respectively substituted for $\Delta V_{FN2}$ and $\Delta V_{FN1}$ in the formula (1). As a result, the formula (2) is given.

$$C_1 = (C_1 + C_{Tr})/2 \qquad (2)$$

When the formula (2) is modified, the formula (3) is given.

$$C_1 = C_{Tr} \qquad (3)$$

Next, the capacitor $C_2$ is considered. The capacitor $C_2$ and the capacitor $C_1$ satisfy the following relational expression. In the formula (4), $\Delta V_{FN3}$ represents the amount of change in the potential of the node $FN_3$ and $\Delta V_{FN2}$ represents the amount of change in the potential of the node $FN_2$.

$$C_2 \times \Delta V_{FN3} = (C_2 + C_1) \times \Delta V_{FN2} \qquad (4)$$

In the case where a potential of 1 V is supplied as the potential $V_{D3}$, the potential of the node $FN_2$ is preferably changed by only 0.5 V and the potential of the node $FN_1$ is preferably changed by only 0.25 V owing to capacitive coupling. Accordingly, the potential of the node $FN_1$ can have 8-level potentials uniformly ($V_{FN1}=0\ V, 0.25\ V, 0.5\ V, 0.75\ V, 1.0\ V, 1.25\ V, 1.5\ V$, and 1.75 V). Thus, 1 V and 0.5 V are respectively substituted for $\Delta V_{FN3}$ and $\Delta V_{FN2}$ in the formula (4). As a result, the formula (5) is given.

$$C_2 = C_1 \qquad (5)$$

In this manner, after the capacitor $C_{(N-1)}$ is considered, the capacitors $C_1$ to $C_{(N-1)}$ satisfy the following relational expression.

$$C_{(N-1)} = C_{(N-2)} = C_2 = C_1 \qquad (6)$$

According to the formulae (3) and (6), in the memory cell $10b$, it is preferable that the capacitance value of the capacitor $C_1$ be equal to the gate capacitance value of the transistor M0 and the capacitance value of the capacitor $C_J$ be equal to the capacitance value of the capacitor $C_{(J-1)}$ (J is a natural number of two or more and (N−1) or less).

In the memory cell $10a$, only the capacitor $C_1$ is considered; thus, only the formula (3) is considered. That is, in the memory cell $10a$, the capacitance value of the capacitor $C_1$ is preferably equal to the gate capacitance value of the transistor M0.

In this specification, "the capacitance values are equal to each other" refers to the case where the absolute value of the difference between two capacitance values is within 20% of each capacitance value.

As described above, 4-level (2-bit) data can be written to the memory cell $10a$ and $2^N$-level (N-bit) data can be written to the memory cell $10b$.

In the case where 4-level data is written to the memory cell $10a$, four power supply potentials do not need to be supplied to the memory cell $10a$, and only two power supply potentials at an H level and an L level are supplied. Thus, the circuit configuration of the memory cell $10a$ can be simplified.

Similarly, in the case where $2^N$-level data is written to the memory cell $10b$, $2^N$ power supply potentials do not need to be supplied to the memory cell $10b$, and only two power supply potentials at an H level and an L level are supplied. Thus, the circuit configuration of the memory cell $10b$ can be simplified.

The case where binary potentials are supplied as each of the potentials $V_{D1}$ to $V_{DN}$ is described above; however, one embodiment of the present invention is not limited thereto. For example, 3-level potentials, 4-level potentials, or potentials having more levels can be supplied as each of the potentials $V_{D1}$ to $V_{DN}$.

In the case where, for example, M-bit ($2^M$-level) potentials are supplied to each of the potentials $V_{D1}$ and $V_{D2}$ in the memory cell $10a$ (M is a natural number of two or more), the potential $V_{FN1}$ can be M×2-bit ($2^{M \times 2}$-level) potentials. That is, M×2-bit data can be written to the memory cell $10a$. In this case, not $2^{M \times 2}$ but $2^M$ power supply potentials are supplied to the memory cell $10a$, so that the circuit configuration can be simplified.

In the case where M-bit ($2^M$ level) potentials are supplied to each of the potentials $V_{D1}$ to $V_{DN}$ in the memory cell $10b$, the potential $V_{FN1}$ can be M×N-bit ($2^{M \times N}$-level) potentials. That is, M×N-bit data can be written to the memory cell $10b$. In this case, not $2^{M \times N}$ but $2^M$ power supply potentials are supplied to the memory cell $10b$, so that the circuit configuration can be simplified.

In the memory cells $10a$ and $10b$, the switches $S_1$ to $S_N$ are formed using transistors, for example. In particular, an OS transistor including an oxide semiconductor in its channel formation region is preferably used. An OS transistor has a low off-state current. When OS transistors are used for the switches $S_1$ to $S_N$, leakage current when the switch is off can be small and charges written to the nodes $FN_1$ to $FN_N$ can be held for a long time. Note that the low off-state current means that normalized off-state current per micrometer of channel width at room temperature is lower than or equal to $10 \times 10^{-21}$ A.

Unless otherwise specified, the off-state current in this specification refers to a drain current of a transistor in the off state. Unless otherwise specified, the off state of an n-channel transistor means that a difference between gate voltage and source voltage (Vgs) is lower than the threshold voltage (Vth), and the off state of a p-channel transistor means that Vgs is higher than Vth. For example, the off-state current of an n-channel transistor sometimes refers to a drain current that flows when Vgs is lower than Vth. The off-state current of a transistor depends on Vgs in some cases. Thus, "the off-state current of a transistor is lower than or equal to $10^{-21}$ A" may mean "there is Vgs with which the off-state current of the transistor becomes lower than or equal to $10^{-21}$ A".

The off-state current of a transistor depends on voltage (Vds) between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current of a transistor may be an off-state current at Vds that is used in a semiconductor device or the like including the transistor.

It is supposed that 1-bit data is retained in the node $FN_1$ for 10 years, for example. In the case where the power source voltage is higher than or equal to 2 V and lower than or equal to 3.5 V, the storage capacitance ($C_1 + C_{Tr}$) is 21 fF, and the acceptable amount of change in stored potential is less than 0.5 V, the leakage current from the node $FN_1$ needs to be lower than $33 \times 10^{-24}$ A in order that a change in stored potential is less than the acceptable range at 85° C. for 10 years. In the case where the leakage current from other components is much lower than the above and a leakage current occurs almost exclusively in the switch $S_1$, each OS transistor used for the switch $S_1$ with a channel width of 350 nm preferably has a leakage current per unit area of lower than $93 \times 10^{-24}$ A/μm. In the memory cell $10a$ having the above configuration, data can be retained at 85° C. for 10 years.

It is supposed that 4-bit data is retained in the node $FN_1$ for 10 years, for example. In the case where the power source voltage is higher than or equal to 2 V and lower than or equal to 3.5 V, the storage capacitance $(C_1+C_{Tr})$ is 0.1 fF, the distribution width of a stored potential is less than 30 mV, and the acceptable amount of change in stored potential is less than 80 mV, the leakage current from the node $FN_1$ needs to be lower than $0.025 \times 10^{-24}$ A in order that a change in stored potential is less than the acceptable range at 85° C. for 10 years. In the case where the leakage current from other components is much lower than the above and a leakage current occurs almost exclusively in the switch $S_1$, each OS transistor used for the switch $S_1$ with a channel width of 60 nm preferably has a leakage current per unit area of lower than $0.423 \times 10^{-24}$ A/μm. In the memory cell $10a$ having the above configuration, data can be retained at 85° C. for 10 years.

It is supposed that 8-bit data is retained in the node $FN_1$, for 10 years, for example. In the case where the power source voltage is higher than or equal to 2 V and lower than or equal to 3.5 V, the storage capacitance $(C_1+C_{Tr})$ is 0.1 fF, the distribution width of a stored potential is less than 2 mV, and the acceptable amount of change in stored potential is less than 5 mV, the leakage current from the node $FN_1$ needs to be lower than $0.0016 \times 10^{-24}$ A in order that a change in stored potential is less than the acceptable range at 85° C. for 10 years. In the case where the leakage current from other components is much lower than the above and a leakage current occurs almost exclusively in the switch $S_1$, each OS transistor used for the switch $S_1$ with a channel width of 60 nm preferably has a leakage current per unit area of lower than $0.026 \times 10^{-24}$ A/μm. In the memory cell $10a$ having the above configuration, data can be retained at 85° C. for 10 years.

Furthermore, an OS transistor can be formed over a substrate over which another transistor has been already formed. For example, the memory cell $10a$ can be formed in the following manner: the transistor M0 is formed over a silicon wafer; an OS transistor serving as the switch $S_1$ is formed thereover; and an OS transistor serving as the switch $S_2$ is further formed thereover.

Similarly, the above steps are repeated until an OS transistor serving as the switch $S_N$ is formed, whereby the memory cell $10b$ can be formed.

(Configuration Example of Memory Cell)

Figure 3A:
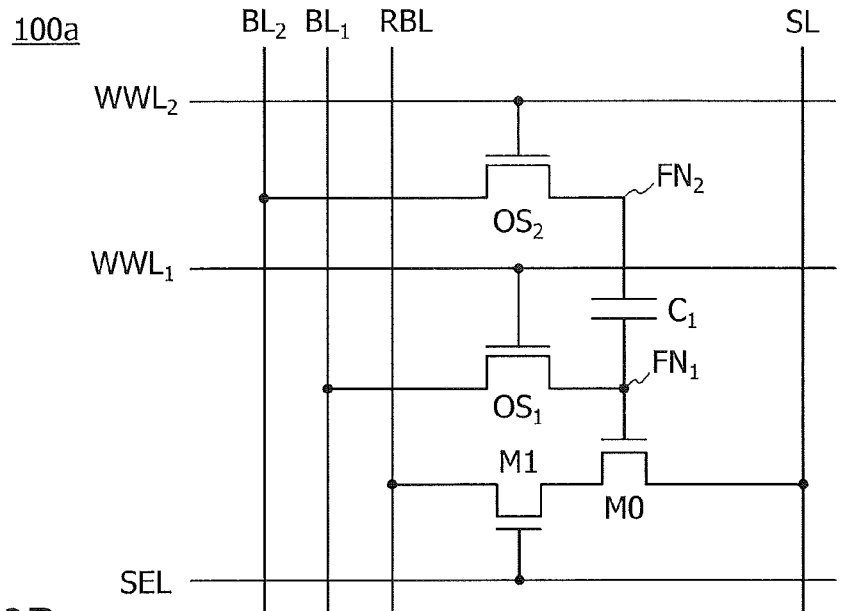
FIGS. 3A and 3B are circuit diagrams each illustrating a configuration example of a memory cell.
Figure 3B:
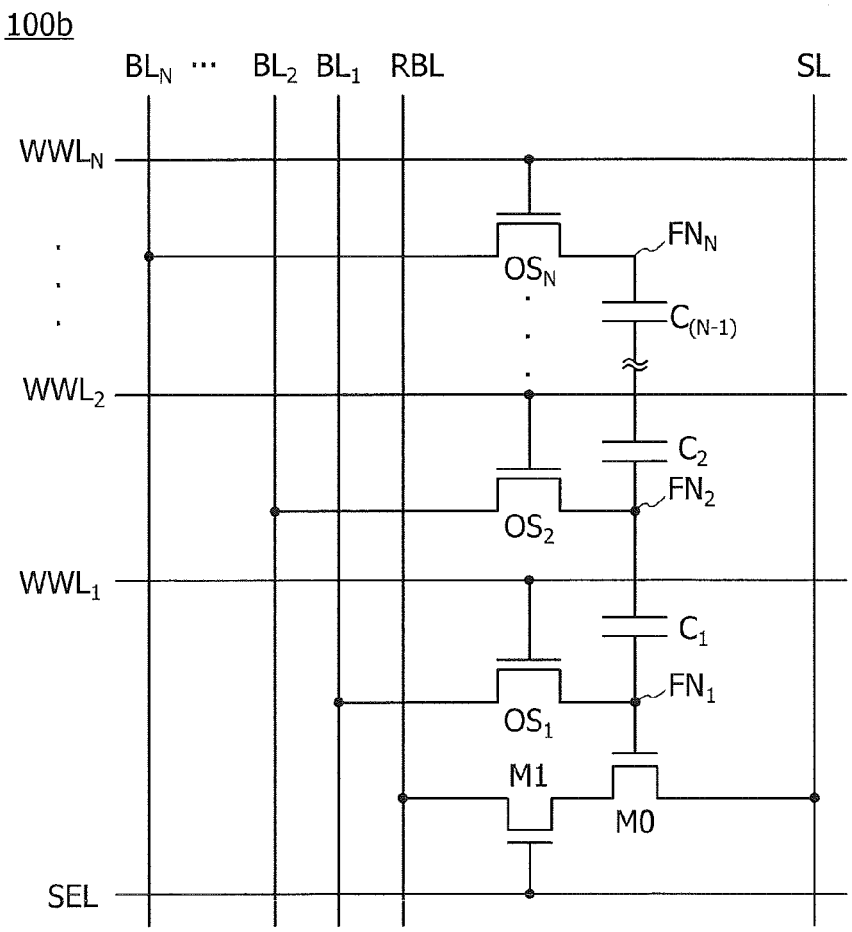

FIG. 3A is a circuit diagram illustrating a configuration example of a memory cell $100a$ to and from which multilevel data can be written and read. FIG. 3B is a circuit diagram illustrating a configuration example of a memory cell $100b$ to and from which multilevel data can be written and read.

The memory cell $100a$ has a configuration example where wirings and transistors are added to the memory cell $10a$ of FIG. 1A from which data can be read. Similarly, the memory cell $100b$ has a configuration example where wirings and transistors are added to the memory cell $10b$ of FIG. 1B from which data can be read.

The memory cell $100a$ includes transistors $OS_1$ and $OS_2$, transistors M0 and M1, the capacitor $C_1$, wirings $WWL_1$ and $WWL_2$, wirings $BL_1$ and $BL_2$, a wiring RBL, a wiring SEL, and a wiring SL.

In the memory cell $100a$, a first terminal of the capacitor $C_1$ is electrically connected to a gate of the transistor M0. One of a source and a drain of the transistor $OS_1$ is electrically connected to the gate of the transistor M0. The other of the source and the drain of the transistor $OS_1$ is electrically connected to the wiring $BL_1$. A gate of the transistor $OS_1$ is electrically connected to the wiring $WWL_1$. One of a source and a drain of the transistor $OS_2$ is electrically connected to a second terminal of the capacitor $C_1$. The other of the source and the drain of the transistor $OS_2$ is electrically connected to the wiring $BL_2$. A gate of the transistor $OS_2$ is electrically connected to the wiring $WWL_2$. A gate of the transistor M1 is electrically connected to the wiring SEL. One of a source and a drain of the transistor M1 is electrically connected to the wiring RBL. The other of the source and the drain of the transistor M1 is electrically connected to one of a source and a drain of the transistor M0. The other of the source and the drain of the transistor M0 is electrically connected to the wiring SL.

The memory cell $100b$ includes transistors $OS_1$ to $OS_N$, the transistors M0 and M1, capacitors $C_1$ to $C_{(N-1)}$, wirings $WWL_1$ to $WWL_N$, wirings $BL_1$ to $BL_N$, the wiring RBL, the wiring SEL, and the wiring SL.

In the memory cell $100b$, the first terminal of the capacitor $C_1$ is electrically connected to the gate of the transistor M0. One of the source and the drain of the transistor $OS_1$ is electrically connected to the gate of the transistor M0. The other of the source and the drain of the transistor $OS_1$ is electrically connected to the wiring $BL_1$. The gate of the transistor $OS_1$ is electrically connected to the wiring $WWL_1$. A first terminal of the capacitor $C_2$ is electrically connected to the second terminal of the capacitor $C_1$. One of the source and the drain of the transistor $OS_2$ is electrically connected to the second terminal of the capacitor $C_1$. The other of the source and the drain of the transistor $OS_2$ is electrically connected to the wiring $BL_2$. The gate of the transistor $OS_2$ is electrically connected to the wiring $WWL_2$. In this manner, the above connection relationship is repeated until a first terminal of the capacitor $C_{(N-1)}$ is electrically connected to a second terminal of the capacitor $C_{(N-2)}$. One of a source and a drain of the transistor $OS_{(N-1)}$ is electrically connected to the second terminal of the capacitor $C_{(N-2)}$. The other of the source and the drain of the transistor $OS_{(N-1)}$ is electrically connected to the wiring $BL_{(N-1)}$. A gate of the transistor $OS_{(N-1)}$ is electrically connected to the wiring $WWL_{(N-1)}$. In addition, one of a source and a drain of the transistor $OS_N$ is electrically connected to a second terminal of the capacitor $C_{(N-1)}$. The other of the source and the drain of the transistor $OS_N$ is electrically connected to the wiring $BL_N$. A gate of the transistor $OS_N$ is electrically connected to the wiring $WWL_N$. In addition, the gate of the transistor M1 is electrically connected to the wiring SEL. One of the source and the drain of the transistor M1 is electrically connected to the wiring RBL. The other of the source and the drain of the transistor M1 is electrically connected to one of the source and the drain of the transistor M0. The other of the source and the drain of the transistor M0 is electrically connected to the wiring SL.

The transistors $OS_1$ to $OS_N$ and the transistors M0 and M1 are described below as n-channel transistors.

<Operation Example of Memory Cell (Writing Operation)>

Next, a writing operation example of the memory cell 100a is described with reference to FIG. 4. Note that the following description can be applied to the memory cell 100b.

Figure 4:
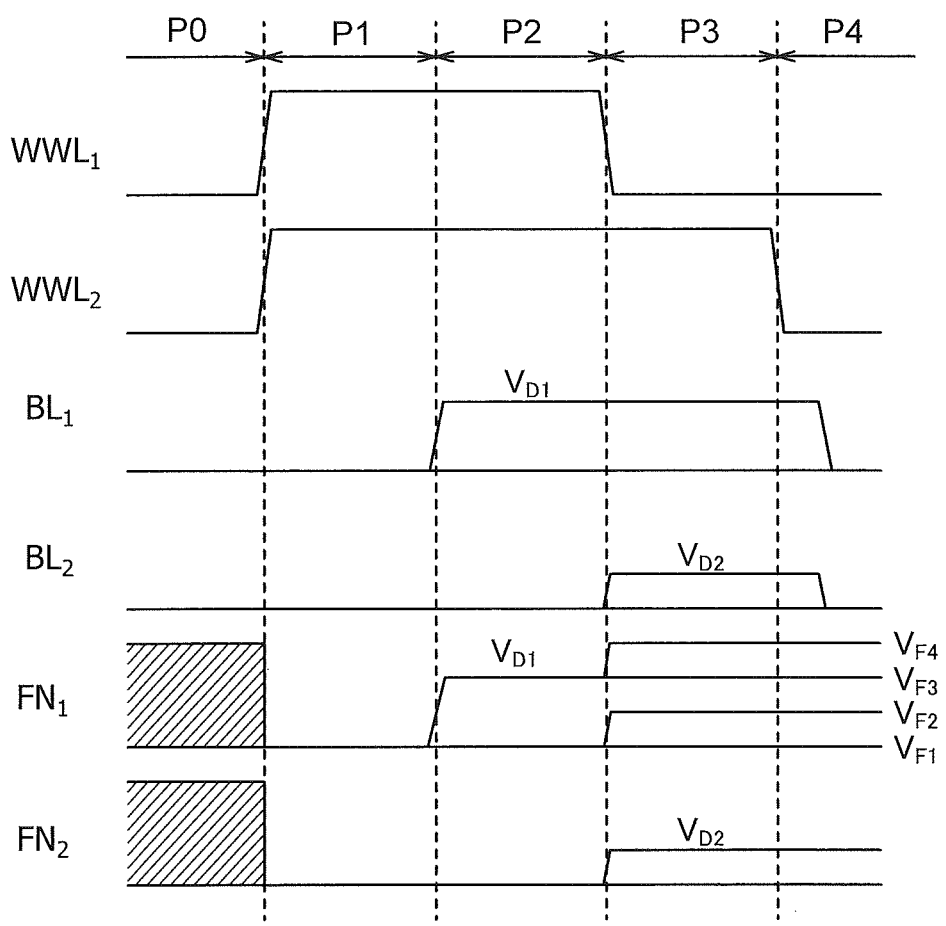
FIG. 4 is a timing chart illustrating an operation example of a memory cell.

FIG. 4 is a timing chart of a writing operation of the memory cell 100a. From the top, the potentials of the wiring $WWL_1$, the wiring $WWL_2$, the wiring $BL_1$, the wiring $BL_2$, the node $FN_1$, and the node $FN_2$ are shown sequentially. Furthermore, the timing chart is divided into periods P0 to P4 to show timing of operations.

Although not shown, during the periods P0 to P4, L-level potentials are supplied to the wirings RBL, SL, and SEL.

First, the period P0 is a preparation period, during which the wirings $WWL_1$, $WWL_2$, $BL_1$, and $BL_2$ are at L levels.

Next, in the period P1, H-level potentials are supplied to the wirings $WWL_1$ and $WWL_2$ and the transistors $OS_1$ and $OS_2$ are turned on.

Then, in the period P2, the potential $V_{D1}$ is supplied to the wiring $BL_1$ and written to the node $FN_1$.

Then, in the period P3, an L-level potential is supplied to the wiring $WWL_1$, and the transistor $OS_1$ is turned off. As a result, the node $FN_1$ is brought into an electrically floating state. In addition, the potential $V_{D2}$ is supplied to the wiring $BL_2$ and written to the node $FN_2$. As a result, the potential of the node $FN_1$ is changed owing to capacitive coupling. The potential of the node $FN_1$ can have four potentials (4-level potentials) of $V_{F1}$ to $V_{F4}$ in accordance with the values of the potentials $V_{D1}$ and $V_{D2}$.

Next, in the period P4, an L-level potential is supplied to the wiring $WWL_2$, and the transistor $OS_2$ is turned off. As a result, the charges written to the nodes $FN_1$ and $FN_2$ are held.

Through the above operations, multilevel (4-level, in this case) data is written to the memory cell 100a.

<Operation Example of Memory Cell (Reading Operation)>

Next, a reading operation example of the memory cell 100a is described with reference to FIG. 5. Note that the following description can be applied to the memory cell 100b.

Figure 5:
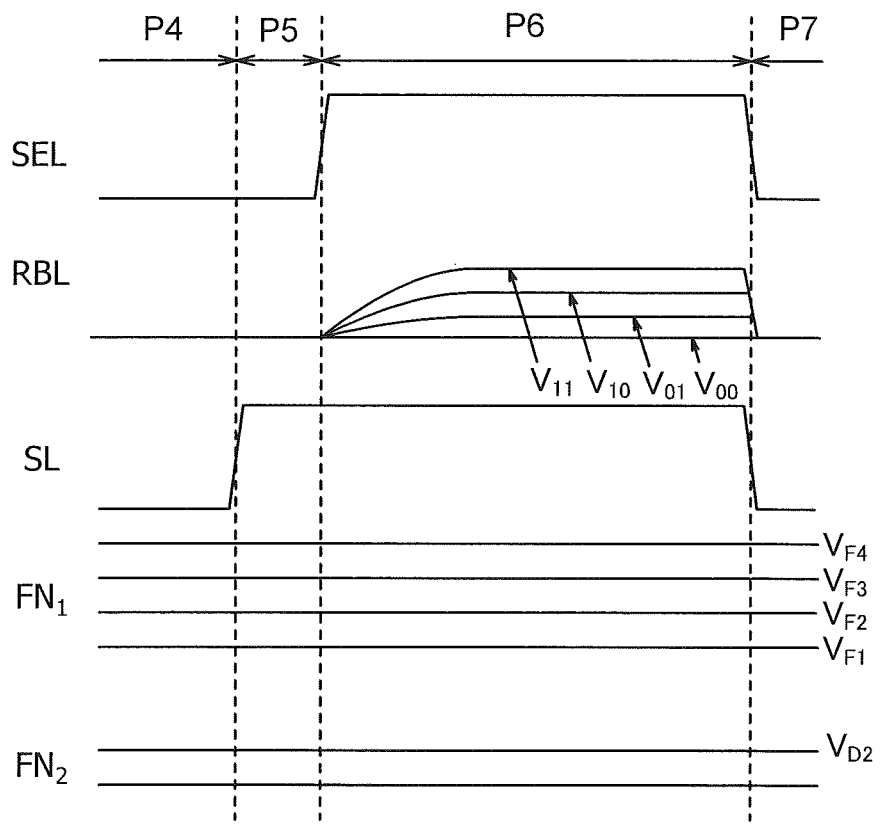
FIG. 5 is a timing chart illustrating an operation example of a memory cell.

FIG. 5 is a timing chart of a reading operation of the memory cell 100a. From the top, the potentials of the wiring SEL, the wiring RBL, the wiring SL, the node $FN_1$, and the node $FN_2$ are shown sequentially. Furthermore, the timing chart is divided into periods P4 to P7 to show timing of operations.

The period P4 in FIG. 5 is taken over from the period P4 in FIG. 4.

Although not shown, during the periods P4 to P7, L-level potentials are supplied to the wirings $WWL_1$ and $WWL_2$. That is, the transistors $OS_1$ and $OS_2$ maintain an off state, and the charges written to the nodes $FN_1$ and $FN_2$ are kept held.

Then, in the period P5, an H-level potential is supplied to the wiring SL, and a potential difference between the wirings RBL and SL occurs. Since the transistor M1 maintains an off state, current does not flow between the wirings RBL and SL.

Next, in the period P6, an H-level potential is supplied to the wiring SEL. As a result, the transistor M1 is turned on. At the same time, the wiring RBL is shut off from the power source and brought into an electrically floating state. When $V_{GS}$ (a potential difference between a gate and a source) of the transistor M0 is higher than $V_{TH}$ (a threshold voltage of the transistor M0), current flows through the transistor M0 in accordance with the potential of the node $FN_1$.

When the transistors M0 and M1 are turned on, current flows between the wirings RBL and SL. The wiring RBL is electrically floating; thus, the potential of the wiring RBL gradually increases. Finally, when $V_{GS}$ of the transistor M0 becomes lower than $V_{TH}$, flow of current is stopped and an increase in potential of the wiring RBL is stopped.

The potential of the wiring RBL at this time is converted into digital data, whereby data written to the nodes $FN_1$ and $FN_2$ can be read.

Then, in the period P7, L-level potentials are supplied to the wiring RBL and the wiring SEL, whereby the memory cell 100a is returned to the state in the period P4.

Through the above operations, multilevel data written to the memory cell 100a can be read.

Although, in FIG. 4 and FIG. 5, an example where 1-bit (binary) potentials are supplied to each of the potentials $V_{D1}$ and $V_{D2}$ and 2-bit (4-level) potentials are written to the memory cell 100a is illustrated, one embodiment of the present invention is not limited thereto. For example, M-bit ($2^M$ level) potentials may be supplied to each of the potentials $V_{D1}$ and $V_{D2}$ (M is a natural number of two or more), and M×2-bit ($2^{M \times 2}$-level) potentials may be written to the memory cell 100a.

Modification examples of the memory cells 100a and 100b are described below.

Modification Example 1

Figure 6A:
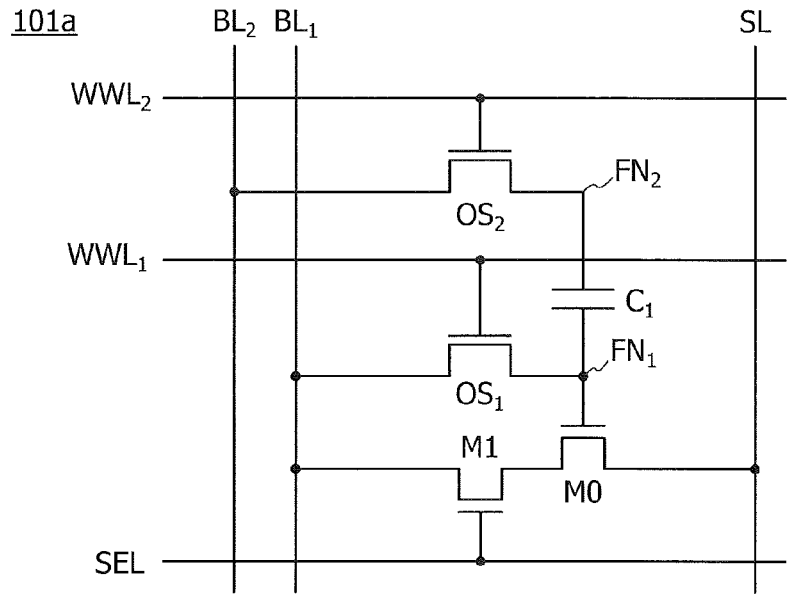
FIGS. 6A and 6B are circuit diagrams each illustrating a configuration example of a memory cell.
Figure 6B:
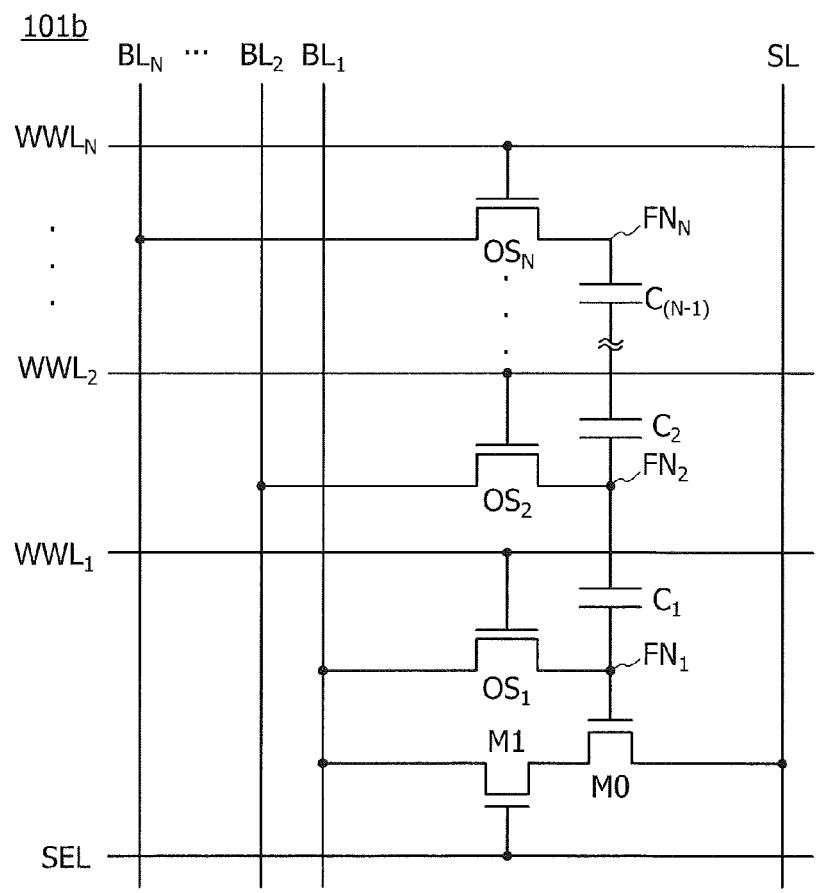

In the memory cells 100a and 100b, one wiring may serve as both the wiring RBL and the wiring $BL_1$. FIGS. 6A and 6B illustrate circuit diagrams in that case. In memory cells 101a and 101b shown in FIGS. 6A and 6B, the wiring $BL_1$ also serves as the wiring RBL. With such a configuration, for example, data written to the memory cell 101a or 101b can be read through the wiring $BL_1$, the data can be corrected by a correction circuit provided outside, and the corrected data can be written to the node $FN_1$ through the wiring $BL_1$.

Modification Example 2

Figure 7A:
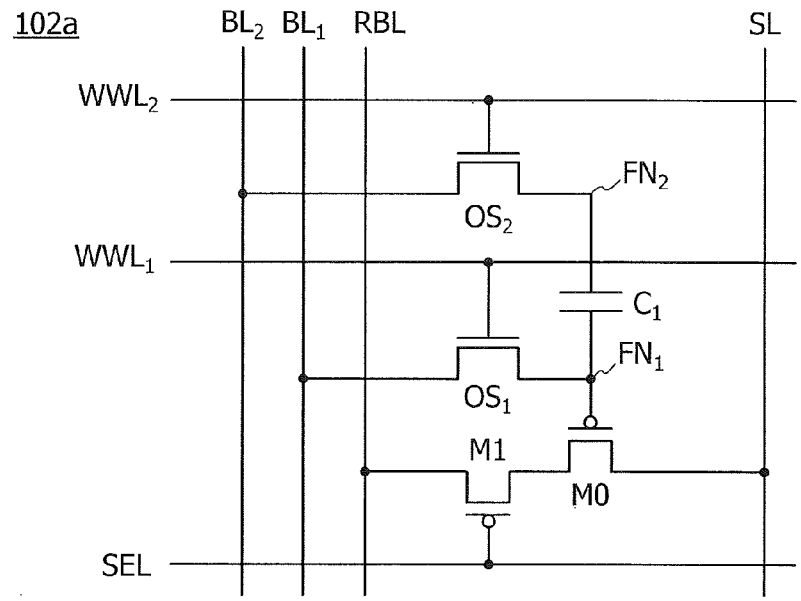
FIGS. 7A and 7B are circuit diagrams each illustrating a configuration example of a memory cell.
Figure 7B:
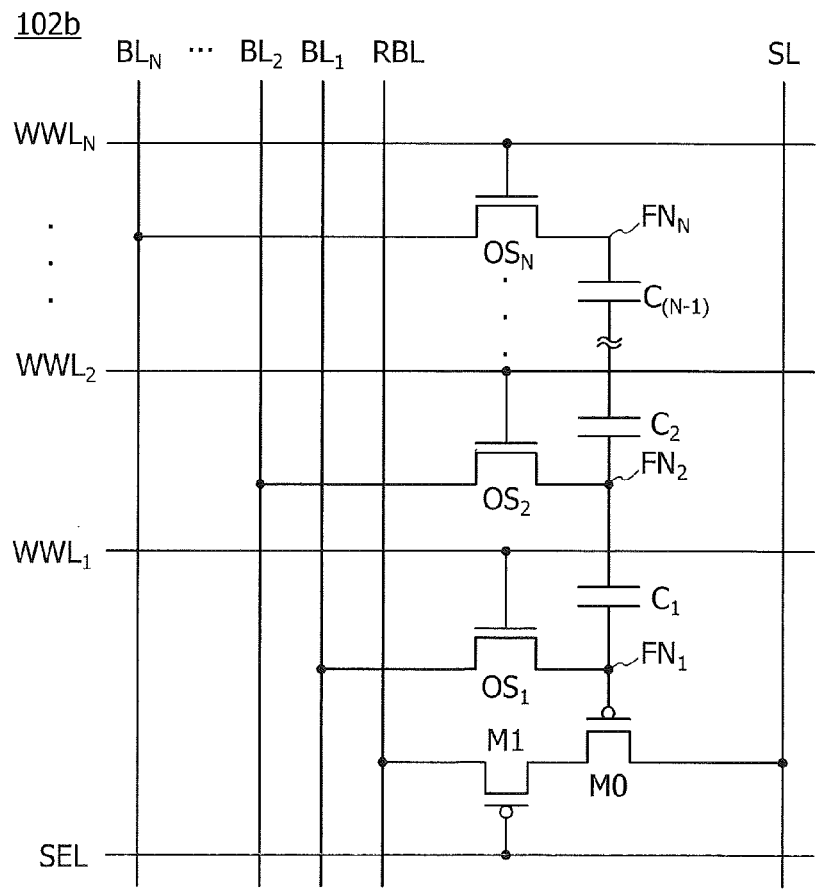

In the memory cells 100a and 100b, the transistors M0 and M1 may be p-channel transistors. FIGS. 7A and 7B illustrate circuit diagrams in that case. In memory cells 102a and 102b shown in FIGS. 7A and 7B, the transistors M0 and M1 operate as p-channel transistors.

Modification Example 3

Figure 8A:
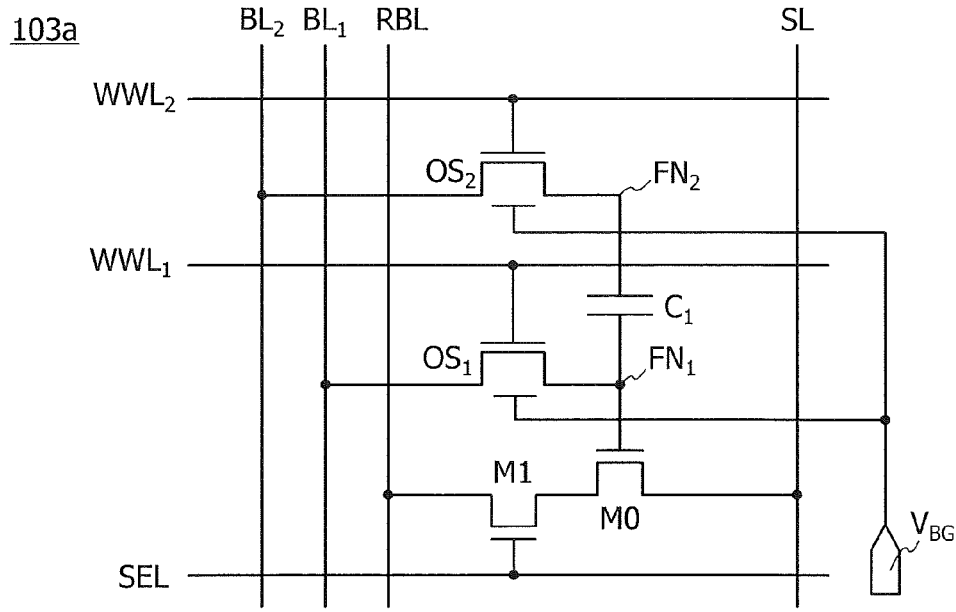
FIGS. 8A and 8B are circuit diagrams each illustrating a configuration example of a memory cell.
Figure 8B:
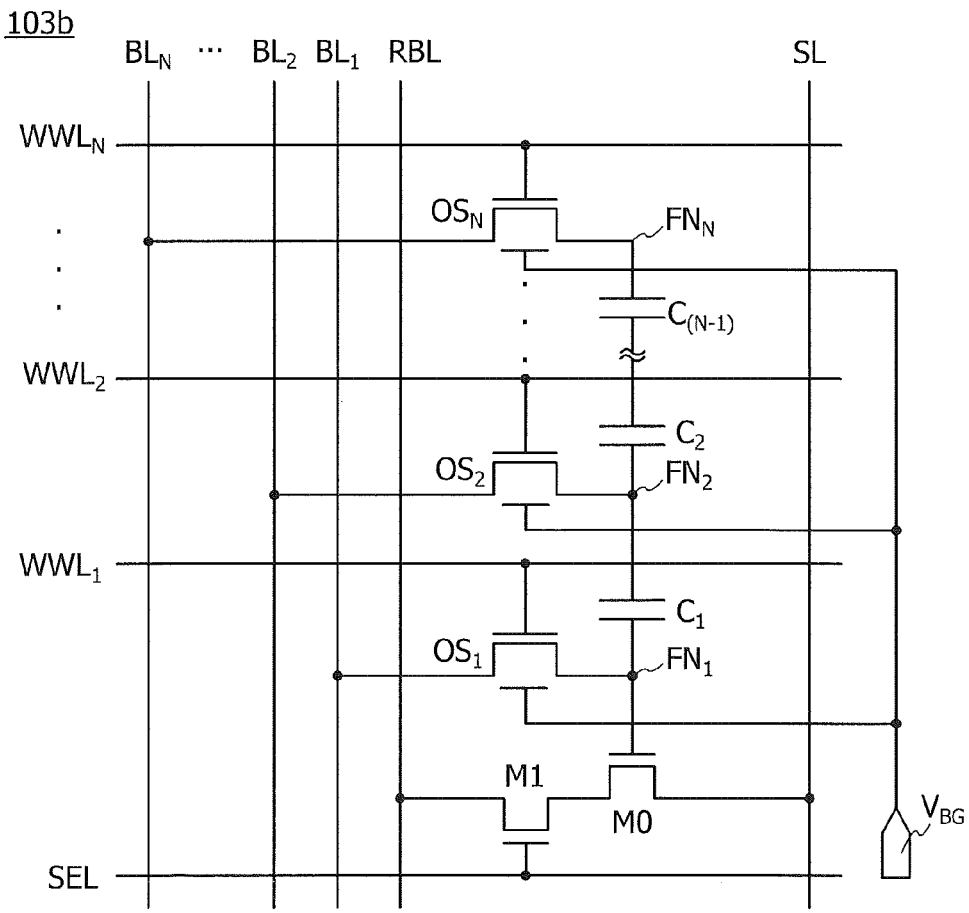

In the memory cells 100a and 100b, the transistors $OS_1$ to $OS_N$ each may be provided with a second gate. FIGS. 8A and 8B illustrate circuit diagrams in that case. In memory cells 103a and 103b shown in FIGS. 8A and 8B, each of the transistors $OS_1$ to $OS_N$ is provided with a second gate, and a potential $V_{BG}$ is supplied to the second gate. When each of the transistors $OS_1$ to $OS_N$ is provided with a second gate, the threshold voltage of the transistor can be controlled to achieve a normally-off transistor. Note that the second gate of each of the transistors $OS_1$ to $OS_N$ may be provided to overlap with a first gate with a semiconductor layer provided therebetween.

Modification Example 4

Figure 9A:
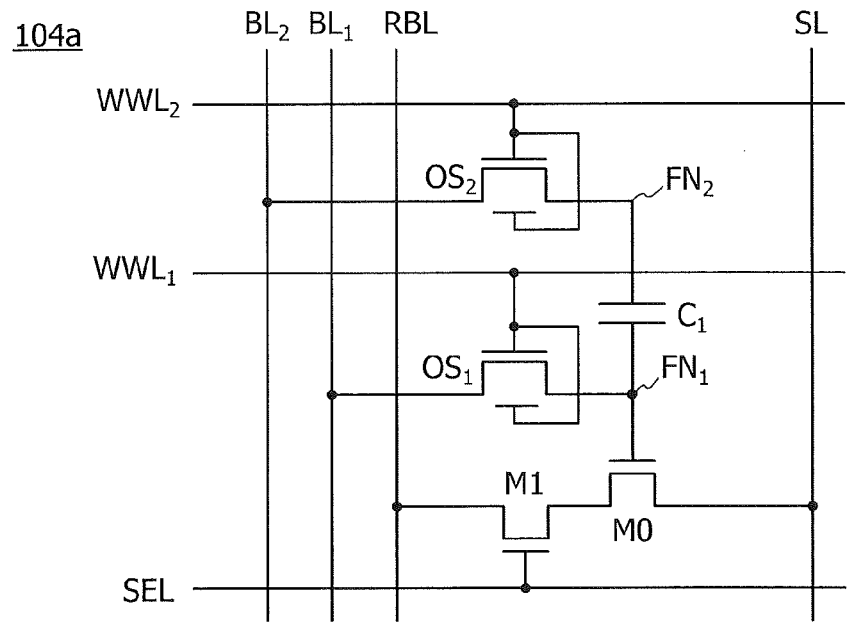
FIGS. 9A and 9B are circuit diagrams each illustrating a configuration example of a memory cell.
Figure 9B:
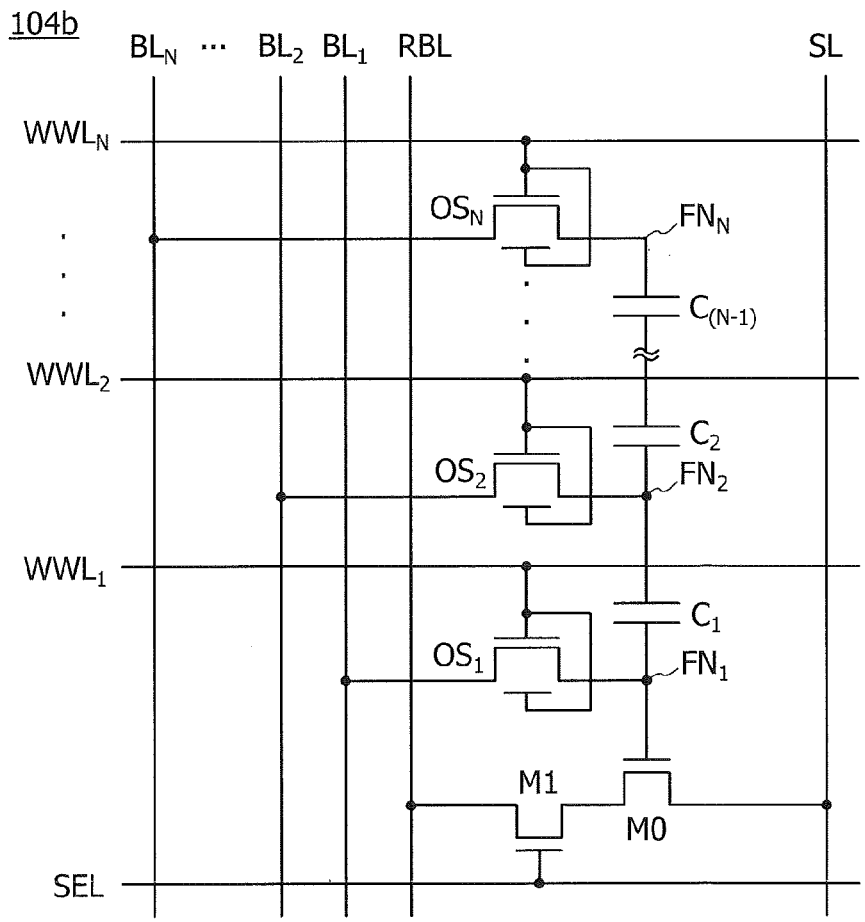

In the memory cells 100a and 100b, the transistors $OS_1$ to $OS_N$ each may be provided with a second gate, and the second gate may be connected to a first gate. FIGS. 9A and 9B illustrate circuit diagrams in that case. In memory cells 104a and 104b shown in FIGS. 9A and 9B, each of the transistors $OS_1$ to $OS_N$ is provided with a second gate, and the second gate is connected to a first gate. The first gate and the second gate are connected to each other, whereby the on-state current of the transistors $OS_1$ to $OS_N$ can be increased. Note that the second gate of each of the transistors $OS_1$ to $OS_N$ may be provided to overlap with the first gate with a semiconductor layer provided therebetween.

Modification Example 5

Figure 39A:
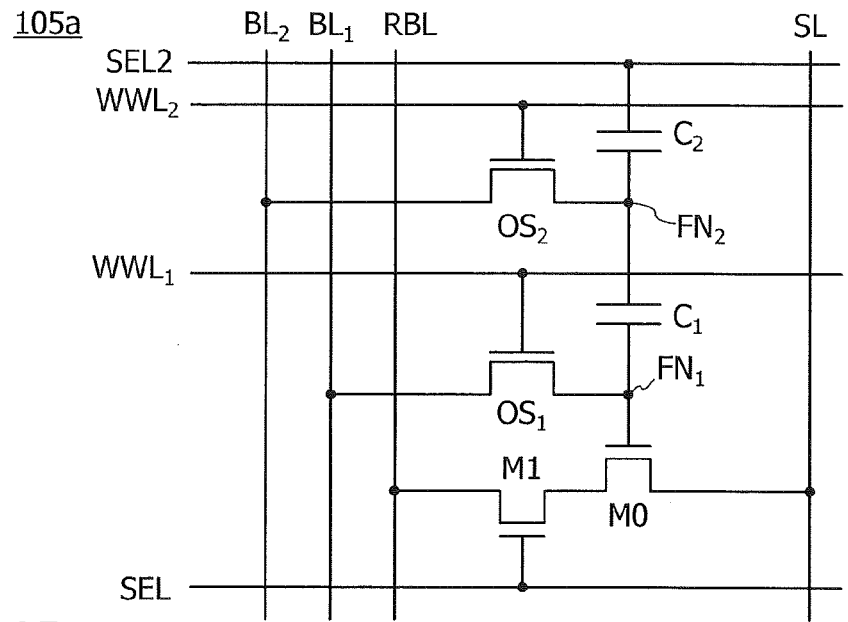
FIGS. 39A and 39B are circuit diagrams each illustrating a configuration example of a memory cell.

In the memory cell 100a, the node $FN_2$ may be provided with a capacitor $C_2$. FIG. 39A illustrates a circuit diagram in that case. In a memory cell 105a shown in FIG. 39A, a first terminal of the capacitor $C_2$ is electrically connected to the node $FN_2$, and a second terminal of the capacitor $C_2$ is electrically connected to a wiring SEL2. The potentials of the wirings SEL and SEL2 are controlled, whereby data can be read from the memory cell 105a.

Figure 39B:
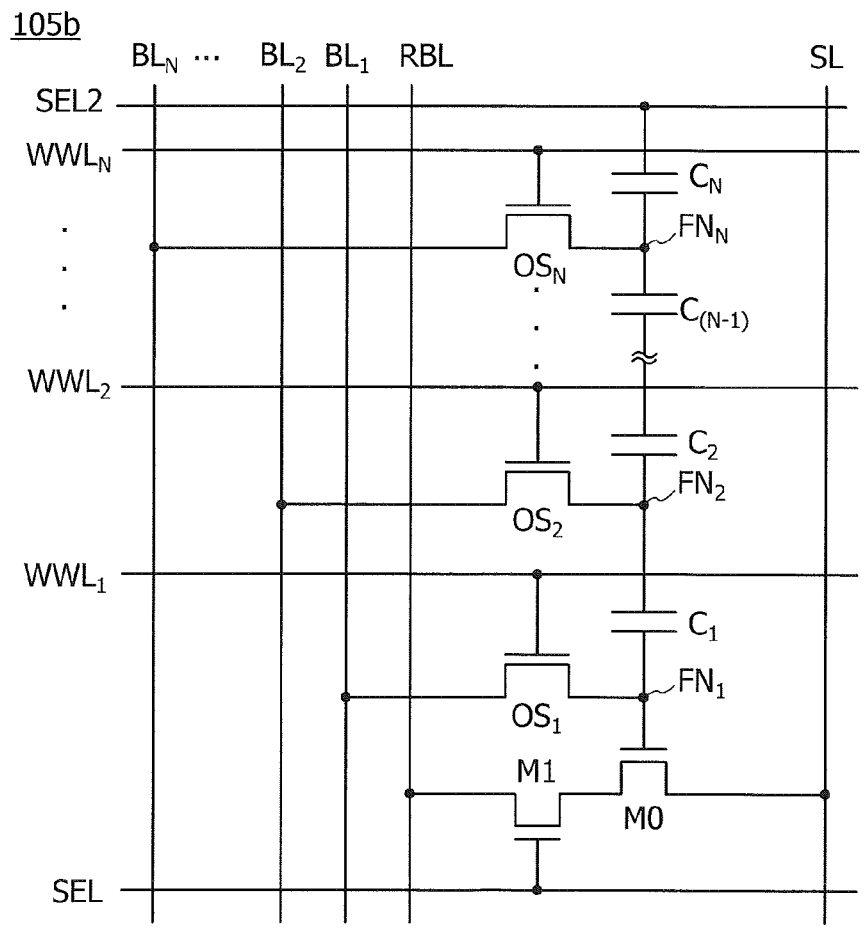

Similarly, in the memory cell 100b, the node $FN_N$ may be provided with a capacitor $C_N$. FIG. 39B illustrates a circuit diagram in that case. In a memory cell 105b shown in FIG. 39B, a first terminal of the capacitor $C_N$ is electrically connected to the node $FN_N$, and a second terminal of the capacitor $C_N$ is electrically connected to a wiring SEL2. The potentials of the wirings SEL and SEL2 are controlled, whereby data can be read from the memory cell 105b.

Modification Example 6

Figure 40A:
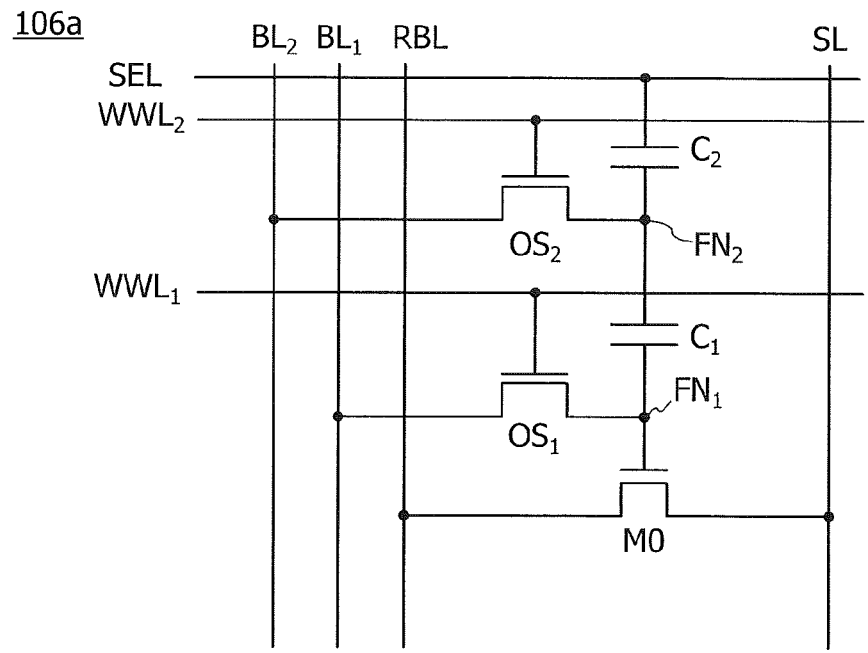
FIGS. 40A and 40B are circuit diagrams each illustrating a configuration example of a memory cell.

In the memory cell 100a, the transistor M1 may be omitted, and the node $FN_2$ may be provided with a capacitor $C_2$. FIG. 40A illustrates a circuit diagram in that case. In a memory cell 106a shown in FIG. 40A, a first terminal of the capacitor $C_2$ is electrically connected to the node $FN_2$, and a second terminal of the capacitor $C_2$ is electrically connected to the wiring SEL. The potential of the wiring SEL is controlled, whereby data can be read from the memory cell 106a.

Figure 40B:
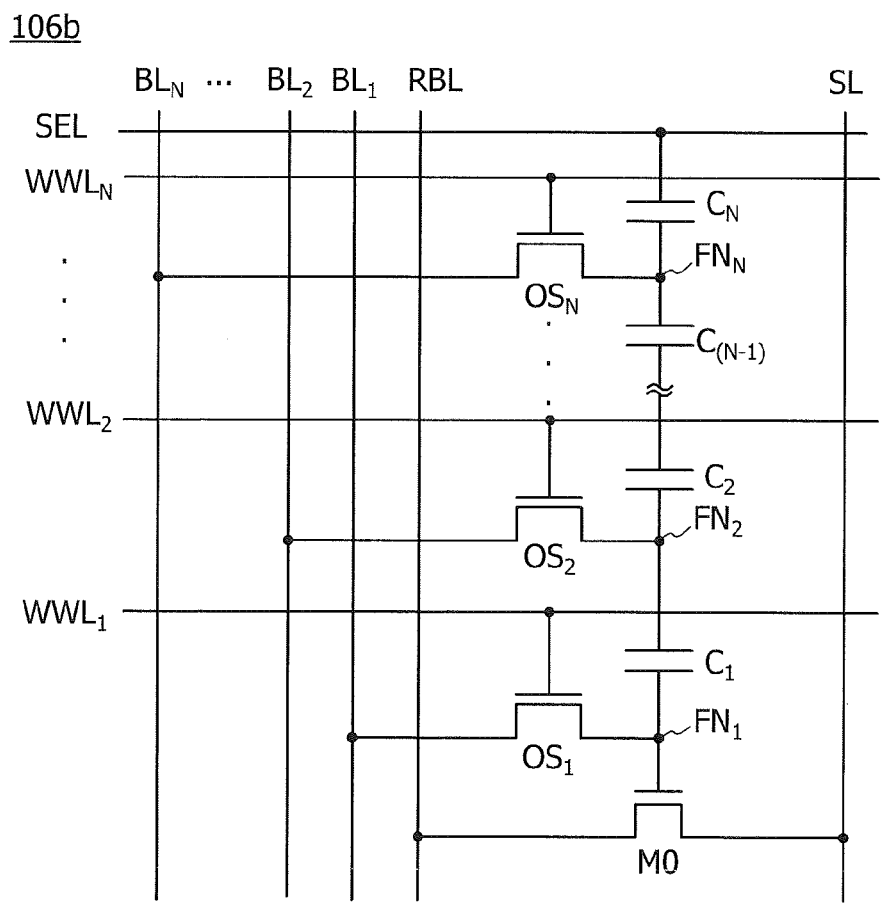

Similarly, in the memory cell 100b, the transistor M1 may be omitted, and the node $FN_N$ may be provided with a capacitor $C_N$. FIG. 40B illustrates a circuit diagram in that case. In a memory cell 106b shown in FIG. 40B, a first terminal of the capacitor $C_N$ is electrically connected to the node $FN_N$, and a second terminal of the capacitor $C_N$ is electrically connected to the wiring SEL. The potential of the wiring SEL is controlled, whereby data can be read from the memory cell 106b.

Embodiment 2

Figure 10A:
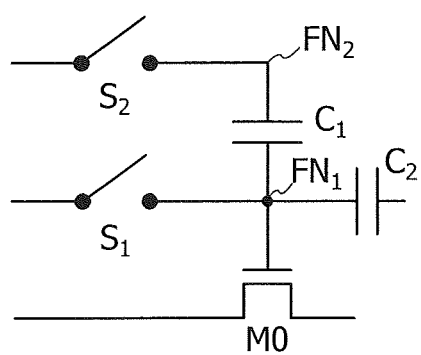
FIGS. 10A and 10B are circuit diagrams each illustrating a configuration example of a memory cell.
Figure 10B:
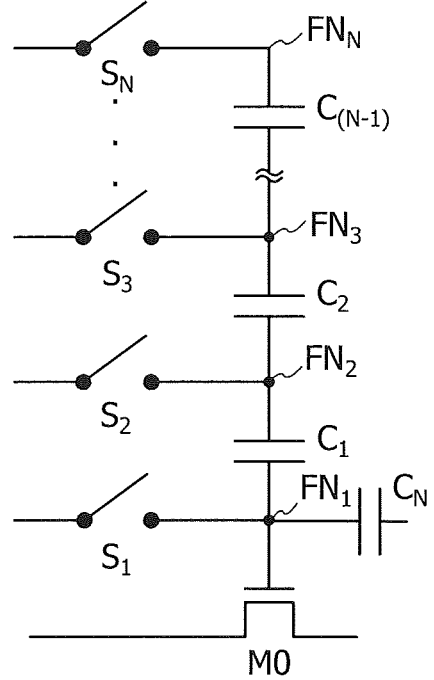

In this embodiment, configuration examples of a semiconductor device of one embodiment of the present invention will be described with reference to FIGS. 10A and 10B, FIGS. 11A to 11D, FIGS. 12A and 12B, FIG. 13, FIG. 14, FIGS. 15A and 15B, FIGS. 16A and 16B, FIGS. 17A and 17B, FIGS. 18A and 18B, and FIGS. 41A and 41B.
<Basic Configuration of Memory Cell>
FIG. 10A is a circuit diagram illustrating a configuration example of a memory cell 20a to which multilevel data can be written. Furthermore, FIG. 10B is a circuit diagram illustrating a configuration example of a memory cell 20b to which multilevel data can be written.

The memory cell 20a includes a transistor M0, a switch $S_1$, a switch $S_2$, a capacitor $C_1$, and a capacitor $C_2$.

In the memory cell 20a, a first terminal of the capacitor $C_1$ is electrically connected to a gate of the transistor M0, a first terminal of the capacitor $C_2$, and a first terminal of the switch $S_1$. A second terminal of the capacitor $C_1$ is electrically connected to a first terminal of the switch $S_2$.

Note that as illustrated in FIG. 10A, a node of the gate of the transistor M0, the first terminal of the capacitor $C_1$, the first terminal of the capacitor $C_2$, and the first terminal of the switch $S_1$ is referred to as a node $FN_1$, and a node of the second terminal of the capacitor $C_1$ and the first terminal of the switch $S_2$ is referred to as a node $FN_2$.

The memory cell 20b includes the transistor M0, switches $S_1$ to $S_N$, and capacitors $C_1$ to $C_N$.

In the memory cell 20b, the first terminal of the capacitor $C_1$ is electrically connected to the gate of the transistor M0, the first terminal of the capacitor $C_N$, and the first terminal of the switch $S_1$. The first terminal of the capacitor $C_2$ is electrically connected to the second terminal of the capacitor $C_1$ and the first terminal of the switch $S_2$. A first terminal of the capacitor $C_3$ is electrically connected to a second terminal of the capacitor $C_2$ and a first terminal of the switch $S_3$. In this manner, the above connection relationship is repeated until a first terminal of the capacitor $C_{(N-1)}$ is electrically connected to a second terminal of the capacitor $C_{(N-2)}$ and a first terminal of the switch $S_{(N-1)}$. A second terminal of the capacitor $C_{(N-1)}$ is electrically connected to a first terminal of the switch $S_N$.

Note that as illustrated in FIG. 10B, nodes of the switches $S_1$ to $S_N$ and the first or second terminal of the capacitors $C_1$ to $C_N$ are referred to as nodes $FN_1$ to $FN_N$.

The memory cell 20a is obtained by addition of the capacitor $C_2$ to the memory cell 10a. Similarly, the memory cell 20b is obtained by addition of the capacitor $C_N$ to the memory cell 10b.

FIGS. 11A to 11D illustrate a writing operation example of the memory cell 20b. A writing operation of the memory cell 20b can be described in a manner similar to that of the writing operation of the memory cell 10b in FIGS. 2A to 2D. Note that the memory cell 20a can be regarded as the memory cell 20b in the case where N=2. Thus, the description for the operation of the memory cell 20b can be used for the memory cell 20a without any change.

As in the description of the operation of the memory cell 10b, the case where potentials $V_{D1}$ to $V_{DN}$ each include binary (1-bit) data at an H level and an L level is shown below.

Figure 11A:
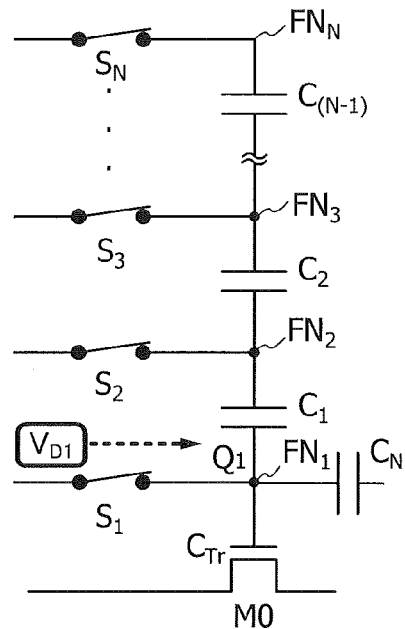
FIGS. 11A to 11D are circuit diagrams illustrating an operation example of a memory cell.
Figure 11B:
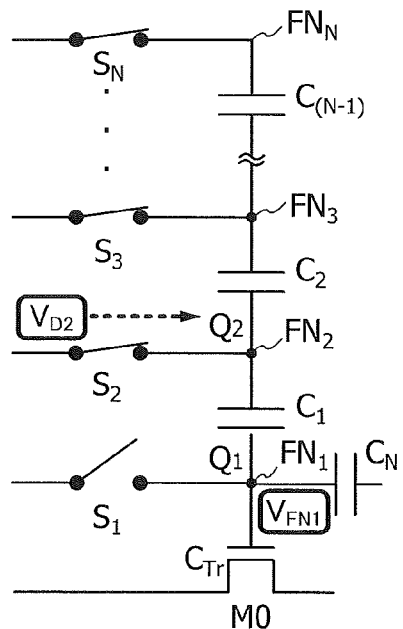

First, the switches $S_2$ to $S_N$ are turned on, and then the potential $V_{D1}$ is supplied to the node $FN_1$ through the switch $S_1$ (FIG. 11A). At this time, L-level potentials are supplied to the nodes $FN_2$ to $FN_N$, for example. Then, the switch $S_1$ is turned off, and the node $FN_1$ becomes electrically floating. After that, the potential $V_{D2}$ is supplied to the node $FN_2$ through the switch $S_2$ (FIG. 11B). The potential of the node $FN_1$ is changed to a potential $V_{FN1}$ owing to capacitive coupling with the potential supplied to the node $FN_2$. Here, the potential $V_{FN1}$ contains 4-level (2-bit) data.

Figure 11C:
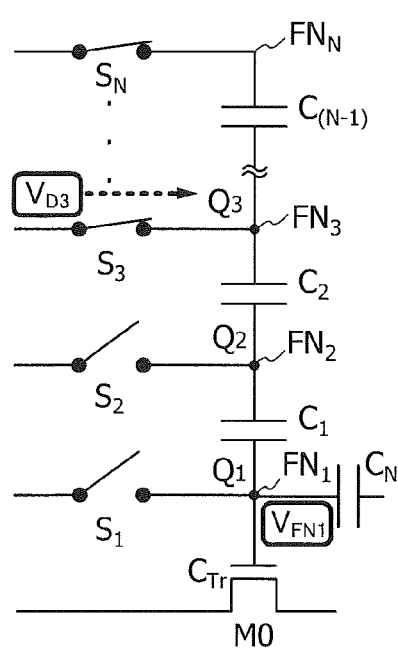

Next, the switch $S_2$ is turned off to make the node $FN_2$ electrically floating. Then, the potential $V_{D3}$ is supplied to a node $FN_3$ through the switch $S_3$ (FIG. 11C). At this time, the potential $V_{FN1}$ contains 8-level (3-bit) data.

Figure 11D:
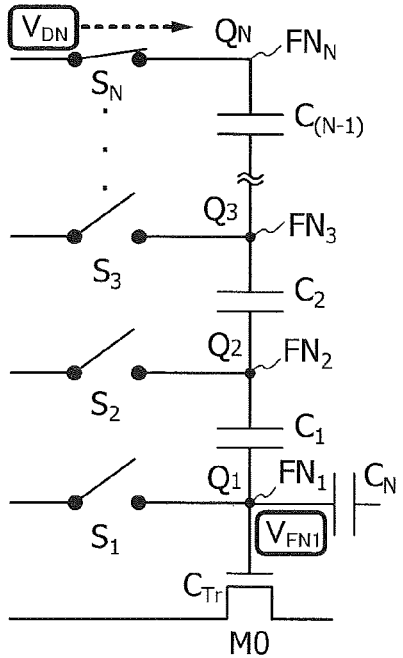

In this manner, the above operation is repeated until the potential $V_{DN}$ is supplied to the second terminal of the capacitor $C_{(N-1)}$ through the switch $S_N$ (FIG. 11D). Finally, the potential $V_{FN1}$ contains $2^N$-level (N-bit) data.

In the memory cell 20b, as in the memory cell 10b, capacitance values of the capacitors $C_1$ to $C_{(N-1)}$ need to be adjusted. Capacitance values of the capacitors $C_1$ to $C_{(N-1)}$ can be determined in manners similar to those of deriving methods of the formulae (1) to (6).

First, as for the capacitor $C_1$, the formula (7) is given. In the formula (7), $C_{Tr}$ represents a gate capacitance value of the transistor M0.

$$C_1 C_N + C_{Tr} \quad (7)$$

In addition, the capacitors $C_1$ to $C_{(N-1)}$ satisfy the following relational expression.

$$C_{(N-1)} = C_{(N-2)} = C_2 = C_1 \quad (8)$$

According to the formulae (7) and (8), in the memory cell 20b, it is preferable that the capacitance value of the capacitor $C_1$ be equal to the sum of the capacitance value of the capacitor $C_N$ and the gate capacitance value of the transistor M0, and the capacitance value of the capacitor $C_J$ be equal to the capacitance value of the capacitor $C_{(J-1)}$ (J is a natural number of two or more and (N−1) or less).

Furthermore, as for the memory cell 20a, from the formula (7), the formula (9) is given.

$$C_1 = C_2 + C_{Tr} \quad (9)$$

That is, in the memory cell 20a, the capacitance value of the capacitor $C_1$ is preferably equal to the sum of the capacitance value of the capacitor $C_2$ and the gate capacitance value of the transistor M0.

As described above, 4-level data can be written to the memory cell 20a and $2^N$-level data can be written to the memory cell 20b.

In the case where 4-level data is written to the memory cell 20a, four power supply potentials do not need to be supplied to the memory cell 20a, and only two power supply potentials at an H level and an L level are supplied. Thus, the circuit configuration of the memory cell 20a can be simplified.

Similarly, in the case where $2^N$-level data is written to the memory cell 20b, $2^N$ power supply potentials do not need to be supplied to the memory cell 20b, and only two power supply potentials at an H level and an L level are supplied. Thus, the circuit configuration of the memory cell 20b can be simplified.

The case where binary (1-bit) potentials are supplied as each of the potentials $V_{D1}$ to $V_{DN}$ is described above; however, one embodiment of the present invention is not limited thereto. For example, 3-level potentials, 4-level potentials, or potentials having more levels can be supplied as each of the potentials $V_{D1}$ to $V_{DN}$.

In the case where, for example, M-bit ($2^M$-level) potentials are supplied to each of the potentials $V_{D1}$ and $V_{D2}$ in the memory cell 20a (M is a natural number of two or more), the potential $V_{FN1}$ can be M×2-bit ($2^{M \times 2}$-level) potentials. That is, M×2-bit data can be written to the memory cell 20a. In this case, not $2^{M \times 2}$ but $2^M$ power supply potentials are supplied to the memory cell 20a, so that the circuit configuration can be simplified.

In the case where M-bit ($2^M$-level) potentials are supplied to each of the potentials $V_{D1}$ to $V_{DN}$ in the memory cell 20b, the potential $V_{FN1}$ can be M×N-bit ($2^{M \times N}$-level) potentials. That is, M×N-bit data can be written to the memory cell 20b. In this case, not $2^{M \times N}$ but $2^M$ power supply potentials are supplied to the memory cell 20b, so that the circuit configuration can be simplified.

In the memory cells 20a and 20b, the switches $S_1$ to $S_N$ are formed using transistors, for example. In particular, an OS transistor including an oxide semiconductor in its channel formation region is preferably used.

It is supposed that 1-bit data is retained in the node $FN_1$ for 10 years, for example. In the case where the power source voltage is higher than or equal to 2 V and lower than or equal to 3.5 V, the storage capacitance $(C_1+C_2+C_{Tr})$ is 21 fF, and the acceptable amount of change in stored potential is less than 0.5 V, the leakage current from the node $FN_1$ needs to be lower than $33 \times 10^{-24}$ A in order that a change in stored potential is less than the acceptable range at 85° C. for 10 years. In the case where the leakage current from other components is much lower than the above and a leakage current occurs almost exclusively in the switch $S_1$, each OS transistor used for the switch $S_1$ with a channel width of 350 nm preferably has a leakage current per unit area of lower than $93 \times 10^{-24}$ A/μm. In the memory cell 20a having the above configuration, data can be retained at 85° C. for 10 years.

It is supposed that 4-bit data is retained in the node $FN_1$ for 10 years, for example. In the case where the power source voltage is higher than or equal to 2 V and lower than or equal to 3.5 V, the storage capacitance $(C_1+C_2+C_{Tr})$ is 0.1 fF, the distribution width of a stored potential is less than 30 mV, and the acceptable amount of change in stored potential is less than 80 mV, the leakage current from the node $FN_1$ needs to be lower than $0.025 \times 10^{-24}$ A in order that a change in stored potential is less than the acceptable range at 85° C. for 10 years. In the case where the leakage current from other components is much lower than the above and a leakage current occurs almost exclusively in the switch $S_1$, each OS transistor used for the switch $S_1$ with a channel width of 60 nm preferably has a leakage current per unit area of lower than $0.423 \times 10^{-24}$ A/μm. In the memory cell 20a having the above configuration, data can be retained at 85° C. for 10 years.

It is supposed that 8-bit data is retained in the node $FN_1$, for 10 years, for example. In the case where the power source voltage is higher than or equal to 2 V and lower than or equal to 3.5 V, the storage capacitance $(C_1+C_{Tr})$ is 0.1 fF, the distribution width of a stored potential is less than 2 mV, and the acceptable amount of change in stored potential is less than 5 mV, the leakage current from the node $FN_1$ needs to be lower than $0.0016 \times 10^{-24}$ A in order that a change in stored potential is less than the acceptable range at 85° C. for 10 years. In the case where the leakage current from other components is much lower than the above and a leakage current occurs almost exclusively in the switch $S_1$, each OS transistor used for the switch $S_1$ with a channel width of 60 nm preferably has a leakage current per unit area of lower than $0.026 \times 10^{-24}$ A/μm. In the memory cell 20a having the above configuration, data can be retained at 85° C. for 10 years.

Furthermore, an OS transistor can be formed over a substrate over which another transistor has been already formed. For example, the memory cell 20a can be formed in the following manner: the transistor M0 is formed over a silicon wafer; an OS transistor serving as the switch $S_1$ is fainted thereover; and an OS transistor serving as the switch $S_2$ is further formed thereover.

Similarly, the above steps are repeated until an OS transistor serving as the switch $S_N$ is formed, whereby the memory cell 20b can be formed.

(Configuration Example of Memory Cell)

Figure 12A:
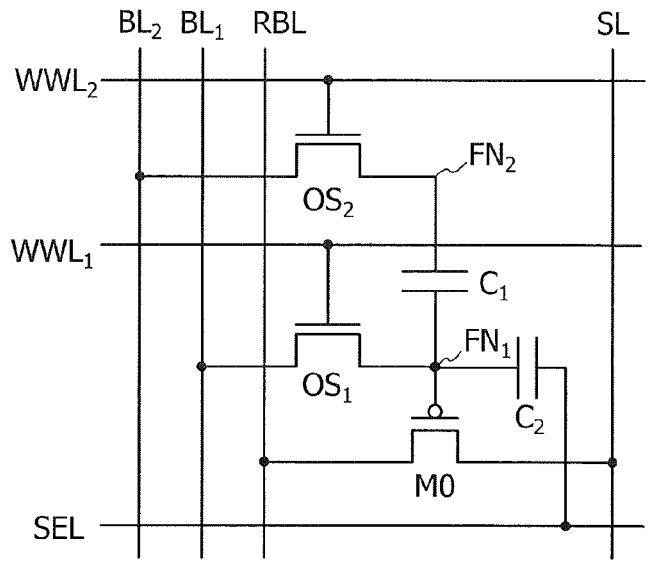
FIGS. 12A and 12B are circuit diagrams each illustrating a configuration example of a memory cell.
Figure 12B:
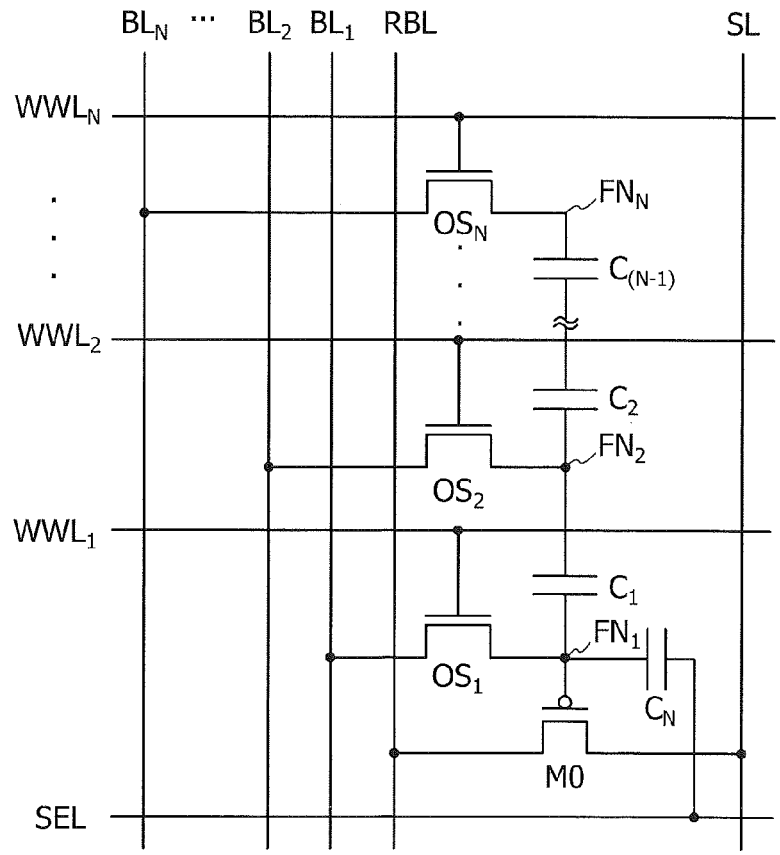

FIG. 12A is a circuit diagram illustrating a configuration example of a memory cell 200a to and from which multilevel data can be written and read. FIG. 12B is a circuit diagram illustrating a configuration example of a memory cell 200b to and from which multilevel data can be written and read.

The memory cell 200a has a configuration example where wirings and transistors are added to the memory cell 20a of FIG. 10A from which data can be read. Similarly, the memory cell 200b has a configuration example where wirings and transistors are added to the memory cell 20b of FIG. 10B from which data can be read.

The memory cell 200a includes the transistors $OS_1$ and $OS_2$, the transistors M0, the capacitors $C_1$ and $C_2$, the wirings $WWL_1$ and $WWL_2$, the wirings $BL_1$ and $BL_2$, the wiring RBL, the wiring SEL, and the wiring SL. The transistors $OS_1$ and $OS_2$ correspond to the switches $S_1$ and $S_2$ of the memory cell 20a.

In the memory cell 200a, a first terminal of the capacitor $C_1$ is electrically connected to a gate of the transistor M0. One of a source and a drain of the transistor $OS_1$ is electrically connected to the gate of the transistor M0. The other of the source and the drain of the transistor $OS_1$ is electrically connected to the wiring $BL_1$. A gate of the transistor $OS_1$ is electrically connected to the wiring $WWL_1$. One of a source and a drain of the transistor $OS_2$ is electrically connected to a second terminal of the capacitor $C_1$. The other of the source and the drain of the transistor $OS_2$ is electrically connected to the wiring $BL_2$. A gate of the transistor $OS_2$ is electrically connected to the wiring $WWL_2$. One of a source and a drain of the transistor M0 is electrically connected to the wiring RBL. The other of the source and the drain of the transistor M0 is electrically connected to the wiring SL. A first terminal of the capacitor $C_2$ is electrically connected to the gate of the transistor M0. A second terminal of the capacitor $C_2$ is electrically connected to the wiring SEL.

The memory cell 200b includes the transistors $OS_1$ to $OS_N$, the transistor M0, the capacitors $C_1$ to $C_N$, the wirings $WWL_1$ to $WWL_N$, the wirings $BL_1$ to $BL_N$, the wiring RBL, the wiring SEL, and the wiring SL. The transistors $OS_1$ to $OS_N$ correspond to the switches $S_1$ to $S_N$ of the memory cell 20b.

In the memory cell 200b, the first terminal of the capacitor $C_1$ is electrically connected to the gate of the transistor M0. One of the source and the drain of the transistor $OS_1$ is electrically connected to the gate of the transistor M0. The other of the source and the drain of the transistor $OS_1$ is electrically connected to the wiring $BL_1$. The gate of the transistor $OS_1$ is electrically connected to the wiring $WWL_1$. The first terminal of the capacitor $C_2$ is electrically connected to the second terminal of the capacitor $C_1$. One of the source and the drain of the transistor $OS_2$ is electrically connected to the second terminal of the capacitor $C_1$. The other of the source and the drain of the transistor $OS_2$ is electrically connected to the wiring $BL_2$. The gate of the transistor $OS_2$ is electrically connected to the wiring $WWL_2$. In this manner, the above connection relationship is repeated until a first terminal of the capacitor $C_{(N-1)}$ is electrically connected to a second terminal of the capacitor $C_{(N-2)}$. One of a source and a drain of the transistor $OS_{(N-1)}$ is electrically connected to the second terminal of the capacitor $C_{(N-2)}$. The other of the source and the drain of the transistor $OS_{(N-1)}$ is electrically connected to the wiring $BL_{(N-1)}$. A gate of the transistor $OS_{(N-1)}$ is electrically connected to the wiring $WWL_{(N-1)}$. In addition, one of a source and a drain of the transistor $OS_N$ is electrically connected to a second terminal of capacitor $C_{(N-1)}$. The other of the source and the drain of the transistor $OS_N$ is electrically connected to the wiring $BL_N$. A gate of the transistor $OS_N$ is electrically connected to the wiring $WWL_N$. One of the source and the drain of the transistor M0 is electrically connected to the wiring RBL. The other of the source and the drain of the transistor M0 is electrically connected to the wiring SL. The first terminal of the capacitor $C_N$ is electrically connected to the gate of the transistor M0. The second terminal of the capacitor $C_N$ is electrically connected to the wiring SEL.

In the following description, the transistors $OS_1$ to $OS_N$ are n-channel transistors, and the transistor M0 is a p-channel transistor.

<Operation Example of Memory Cell (Writing Operation)>

Next, a writing operation example of the memory cell 200a is described with reference to FIG. 13. Note that the following description can be applied to the memory cell 200b.

FIG. 13 is a timing chart of a writing operation of the memory cell 200a. From the top, the potentials of the wiring $WWL_1$, the wiring $WWL_2$, the wiring $BL_1$, the wiring $BL_2$, the node $FN_1$, and the node $FN_2$ are shown sequentially. Furthermore, the timing chart is divided into periods P0 to P4 to show timing of operations.

Although not shown, during the periods P0 to P4, L-level potentials are supplied to the wirings RBL and SL and an H-level potential is supplied to the wiring SEL.

First, the period P0 is a preparation period, during which the wirings $WWL_1$, $WWL_2$, $BL_1$, and $BL_2$ are at L levels.

Next, in the period P1, H-level potentials are supplied to the wirings $WWL_1$ and $WWL_2$ and the transistors $OS_1$ and $OS_2$ are turned on.

Then, in the period P2, the potential $V_{D1}$ is supplied to the wiring $BL_1$ and written to the node $FN_1$.

Then, in the period P3, an L-level potential is supplied to the wiring $WWL_1$, and the transistor $OS_1$ is turned off. As a result, the node $FN_1$ is brought into an electrically floating state. In addition, the potential $V_{D2}$ is supplied to the wiring $BL_2$ and written to the node $FN_2$. As a result, the potential of the node $FN_1$ is changed owing to capacitive coupling. The potential of the node $FN_1$ can have four potentials (4-level potentials) of $V_{F1}$ to $V_{F4}$ in accordance with the values of the potentials $V_{D1}$ and $V_{D2}$.

Next, in the period P4, an L-level potential is supplied to the wiring $WWL_2$, and the transistor $OS_2$ is turned off. As a result, the charges written to the nodes $FN_1$ and $FN_2$ are held.

Through the above operations, multilevel (4-level, in this case) data is written to the memory cell 200a.

<Operation Example of Memory Cell (Reading Operation)>

Next, a reading operation example of the memory cell 200a is described with reference to FIG. 14. Note that the following description can be applied to the memory cell 200b.

Figure 14:
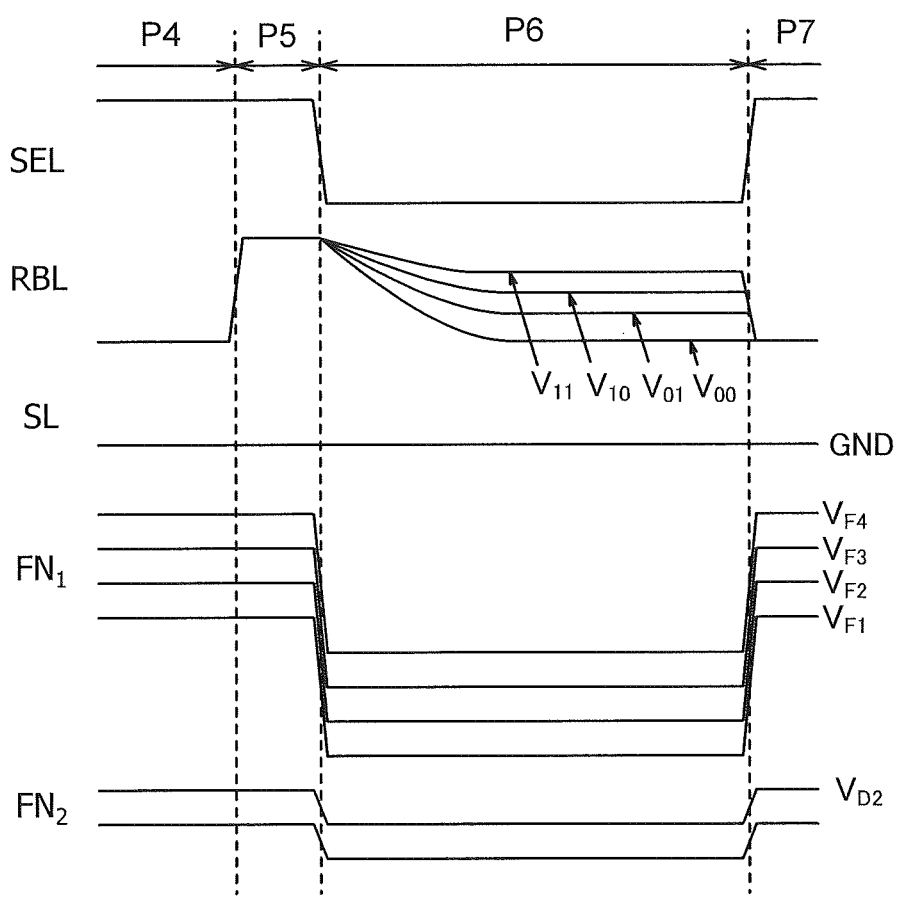
FIG. 14 is a timing chart illustrating an operation example of a memory cell.

FIG. 14 is a timing chart of a reading operation of the memory cell 200a. From the top, the potentials of the wiring SEL, the wiring RBL, the wiring SL, the node $FN_1$, and the node $FN_2$ are shown sequentially. Furthermore, the timing chart is divided into periods P4 to P7 to show timing of operations.

The period P4 in FIG. 14 is taken over from the period P4 in FIG. 13.

Although not shown, during the periods P4 to P7, L-level potentials are supplied to the wirings $WWL_1$ and $WWL_2$. That is, the transistors $OS_1$ and $OS_2$ maintain an off state, and the charges written to the nodes $FN_1$ and $FN_2$ are kept held.

Then, in the period P5, an H-level potential is supplied to the wiring RBL, and a potential difference between the wirings RBL and SL occurs. Since the transistor M0 maintains an off state, current does not flow between the wirings RBL and SL.

Next, in the period P6, an L-level potential is supplied to the wiring SEL. As a result, the potential of the node $FN_1$ decreases and $V_{GS}$ (a potential difference between a gate and a source) of the transistor M0 is lower than $V_{TH}$ (a threshold voltage of the transistor M0), so that the transistor M0 is turned on. At the same time, the wiring RBL is shut off from the power source and brought into an electrically floating state.

During the period P6, current flows between the wirings RBL and SL. The wiring RBL is electrically floating; thus, the potential of the wiring RBL gradually decreases. Finally, when $V_{GS}$ of the transistor M0 becomes higher than $V_{TH}$, flow of current is stopped and a decrease in potential of the wiring RBL is stopped.

The potential of the wiring RBL at this time is converted into digital data, whereby data written to the nodes $FN_1$ and $FN_2$ can be read.

Then, in the period P7, an L-level potential is supplied to the wiring RBL and an H-level potential is supplied to the wiring SEL, whereby the memory cell 200a is returned to the state in the period P4.

Through the above operations, multilevel data written to the memory cell 200a can be read.

Although, in FIG. 13 and FIG. 14, an example where 1-bit (binary) potentials are supplied to each of the potentials $V_{D1}$ and $V_{D2}$ and 2-bit (4-level) potentials are written to the memory cell 200a is illustrated, one embodiment of the present invention is not limited thereto. For example, M-bit ($2^M$ level) potentials may be supplied to each of the potentials $V_{D1}$ and $V_{D2}$ (M is a natural number of two or more), and M×2-bit ($2^{M\times 2}$-level) potentials may be written to the memory cell 200a.

Modification examples of the memory cells 200a and 200b are described below.

Modification Example 1

Figure 15A:
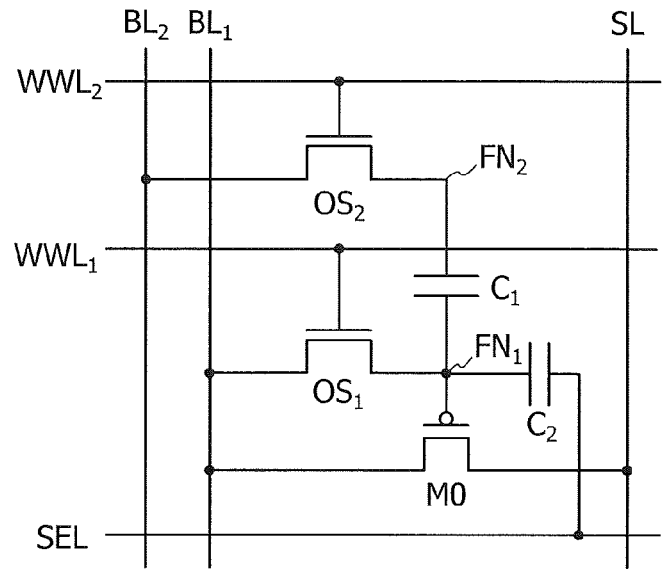
FIGS. 15A and 15B are circuit diagrams each illustrating a configuration example of a memory cell.
Figure 15B:
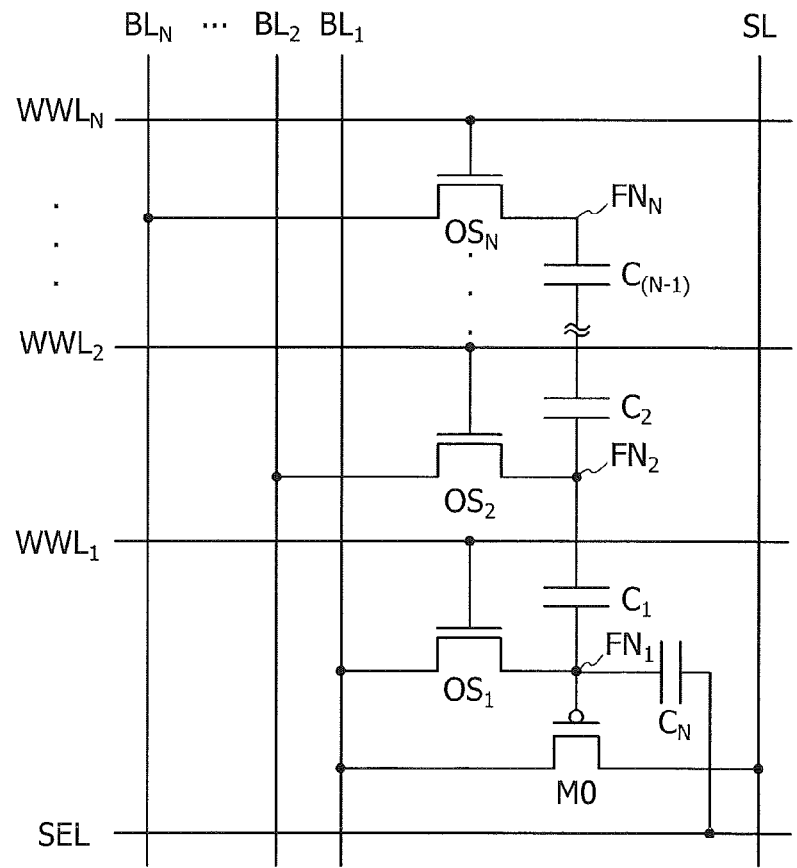

In the memory cells 200a and 200b, one wiring may serve as both the wiring RBL and the wiring $BL_1$. FIGS. 15A and 15B illustrate circuit diagrams in that case. In memory cells 201a and 201b shown in FIGS. 15A and 15B, the wiring $BL_1$ also serves as the wiring RBL. With such a configuration, for example, data written to the memory cell 201a or 201b can be read through the wiring $BL_1$, the data can be corrected by a correction circuit provided outside, and the corrected data can be written to the node $FN_1$ through the wiring $BL_1$.

Modification Example 2

Figure 16A:
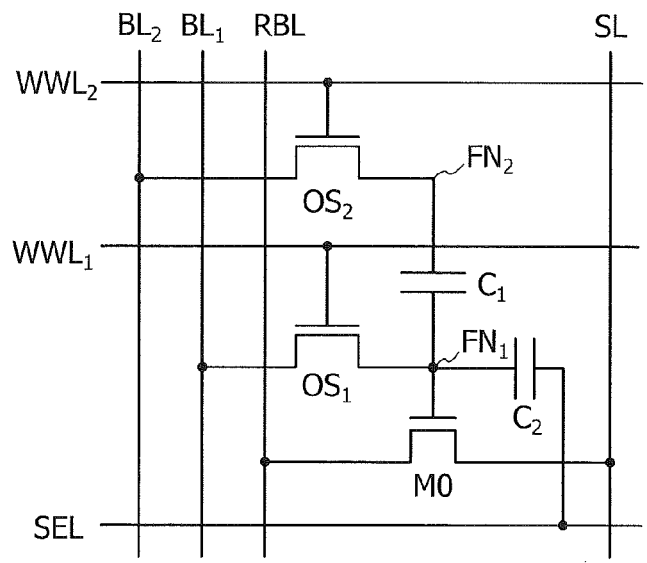
FIGS. 16A and 16B are circuit diagrams each illustrating a configuration example of a memory cell.
Figure 16B:
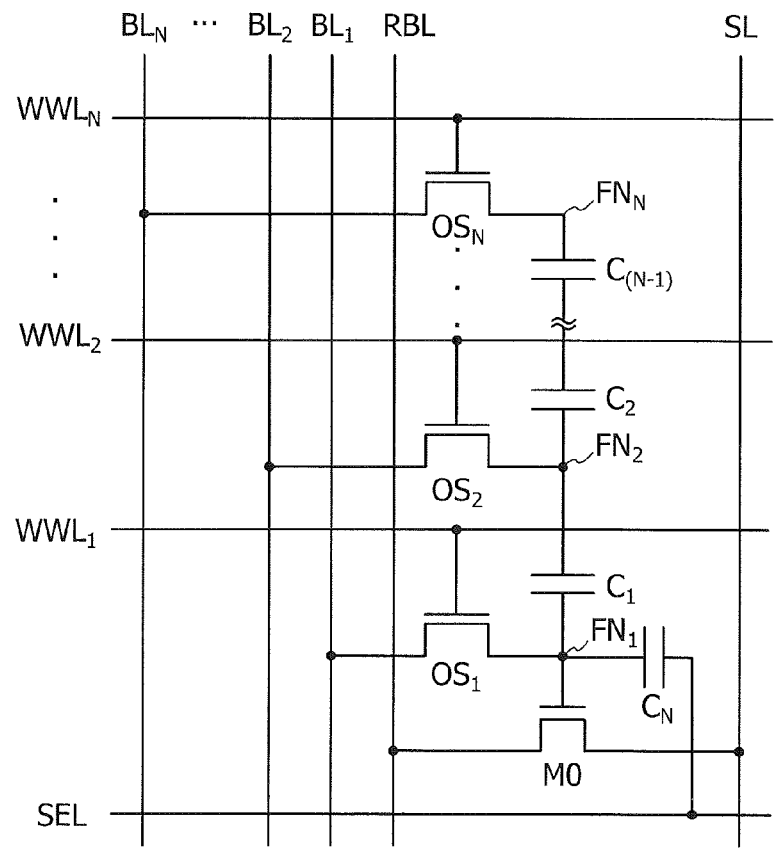

In the memory cells 200a and 200b, the transistor M0 may be an n-channel transistor. FIGS. 16A and 16B illustrate circuit diagrams in that case. In memory cells 202a and 202b shown in FIGS. 16A and 16B, the transistors M0 operates as an n-channel transistor.

Modification Example 3

Figure 17A:
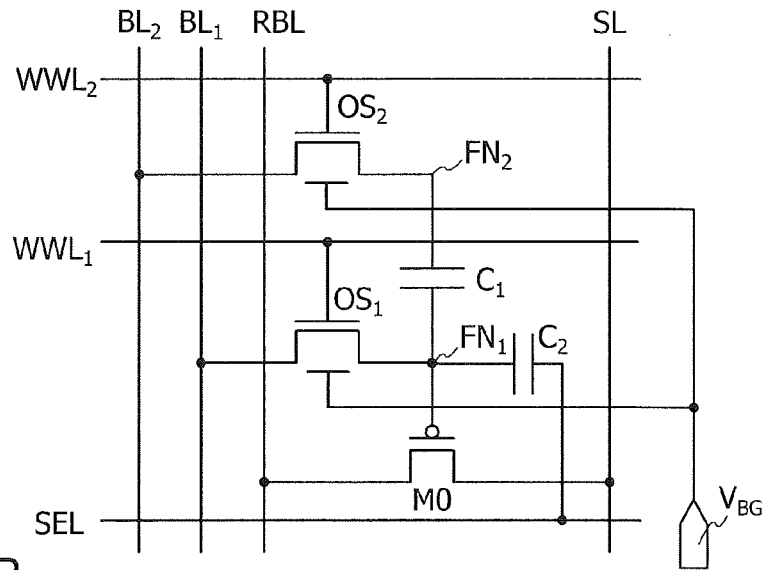
FIGS. 17A and 17B are circuit diagrams each illustrating a configuration example of a memory cell.
Figure 17B:
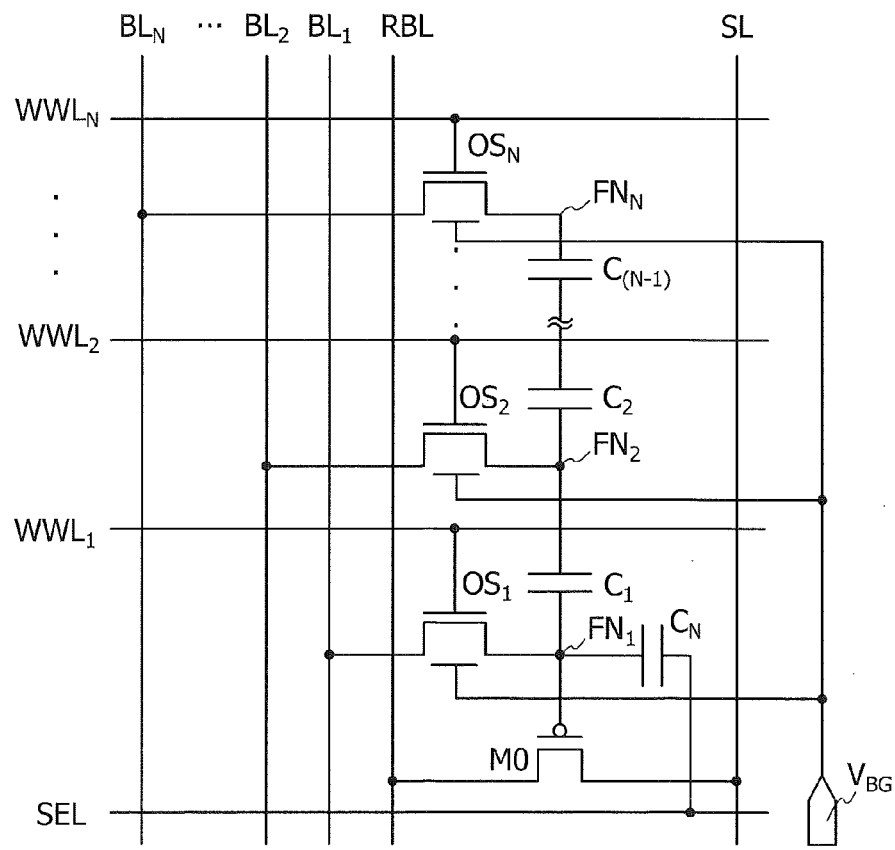

In the memory cells 200a and 200b, the transistors $OS_1$ to $OS_N$ each may be provided with a second gate. FIGS. 17A and 17B illustrate circuit diagrams in that case. In memory cells 203a and 203b shown in FIGS. 17A and 17B, each of the transistors $OS_1$ to $OS_N$ is provided with a second gate, and a potential $V_{BG}$ is supplied to the second gate. When each of the transistors $OS_1$ to $OS_N$ is provided with a second gate, the threshold voltage of the transistor can be controlled to achieve a normally-off transistor. Note that the second gate of each of the transistors $OS_1$ to $OS_N$ may be provided to overlap with a first gate with a semiconductor layer provided therebetween.

Modification Example 4

Figure 18A:
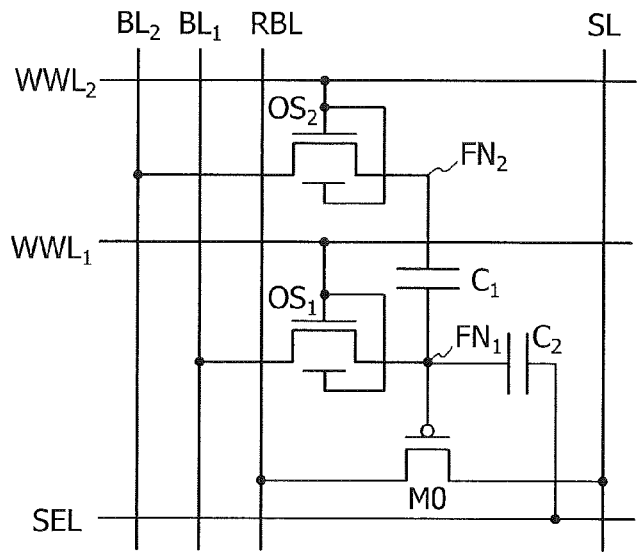
FIGS. 18A and 18B are circuit diagrams each illustrating a configuration example of a memory cell.
Figure 18B:
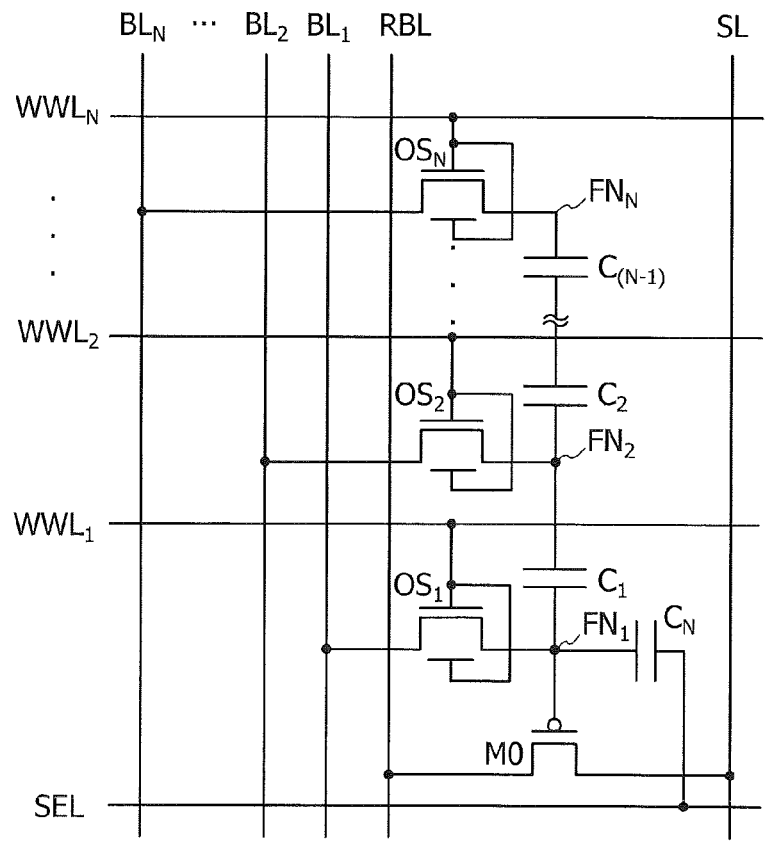

In the memory cells 200a and 200b, the transistors $OS_1$ to $OS_N$ each may be provided with a second gate and the second gate may be connected to a first gate. FIGS. 18A and 18B illustrate circuit diagrams in that case. In memory cells 204a and 204b shown in FIGS. 18A and 18B, each of the transistors $OS_1$ to $OS_N$ is provided with a second gate, and the second gate is connected to a first gate. The first gate and the second gate are connected to each other, whereby the on-state current of the transistors $OS_1$ to $OS_N$ can be increased. Note that the second gate of each of the transistors $OS_1$ to $OS_N$ may be provided to overlap with the first gate with a semiconductor layer provided therebetween.

Modification Example 5

Figure 41A:
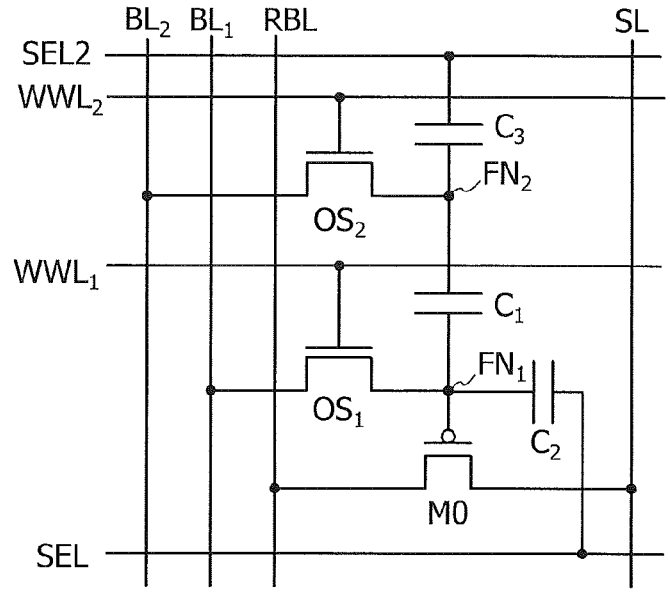
FIGS. 41A and 41B are circuit diagrams each illustrating a configuration example of a memory cell.

In the memory cell 200a, the node $FN_2$ may be provided with a capacitor $C_3$. FIG. 41A illustrates a circuit diagram in that case. In a memory cell 205a shown in FIG. 41A, a first terminal of the capacitor $C_3$ is electrically connected to the node $FN_2$ and a second terminal of the capacitor $C_3$ is electrically connected to a wiring SEL2. The potentials of the wirings SEL and SEL2 are controlled, whereby data can be read from the memory cell 205a.

Figure 41B:
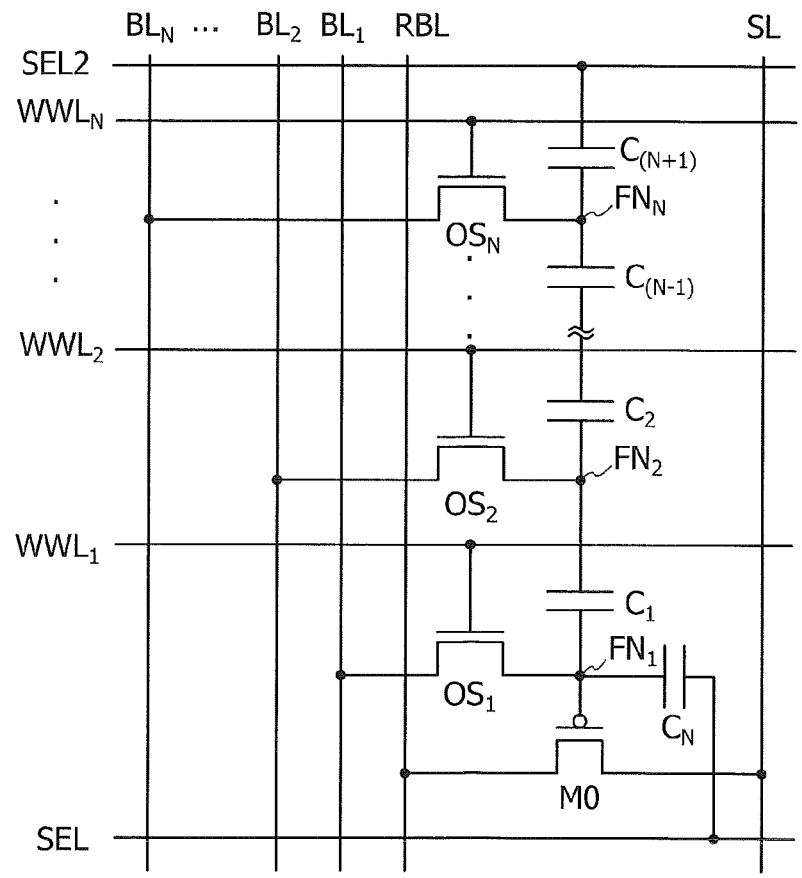

Similarly, in the memory cell 200b, the node $FN_N$ may be provided with a capacitor $C_{(N+1)}$. FIG. 41B illustrates a circuit diagram in that case. In a memory cell 205b shown in FIG. 41B, a first terminal of the capacitor $C_{(N+1)}$ is electrically connected to the node $FN_N$ and a second terminal of the capacitor $C_{(N+1)}$ is electrically connected to a wiring SEL2. The potentials of the wirings SEL and SEL2 are controlled, whereby data can be read from the memory cell 205b.

Embodiment 3

In this embodiment, an example of a semiconductor device that can include the memory cell described in Embodiment 1 will be described with reference to FIG. 19, FIG. 20, FIG. 21, and FIG. 22.

<Structure Example of Semiconductor Device>

Figure 19:
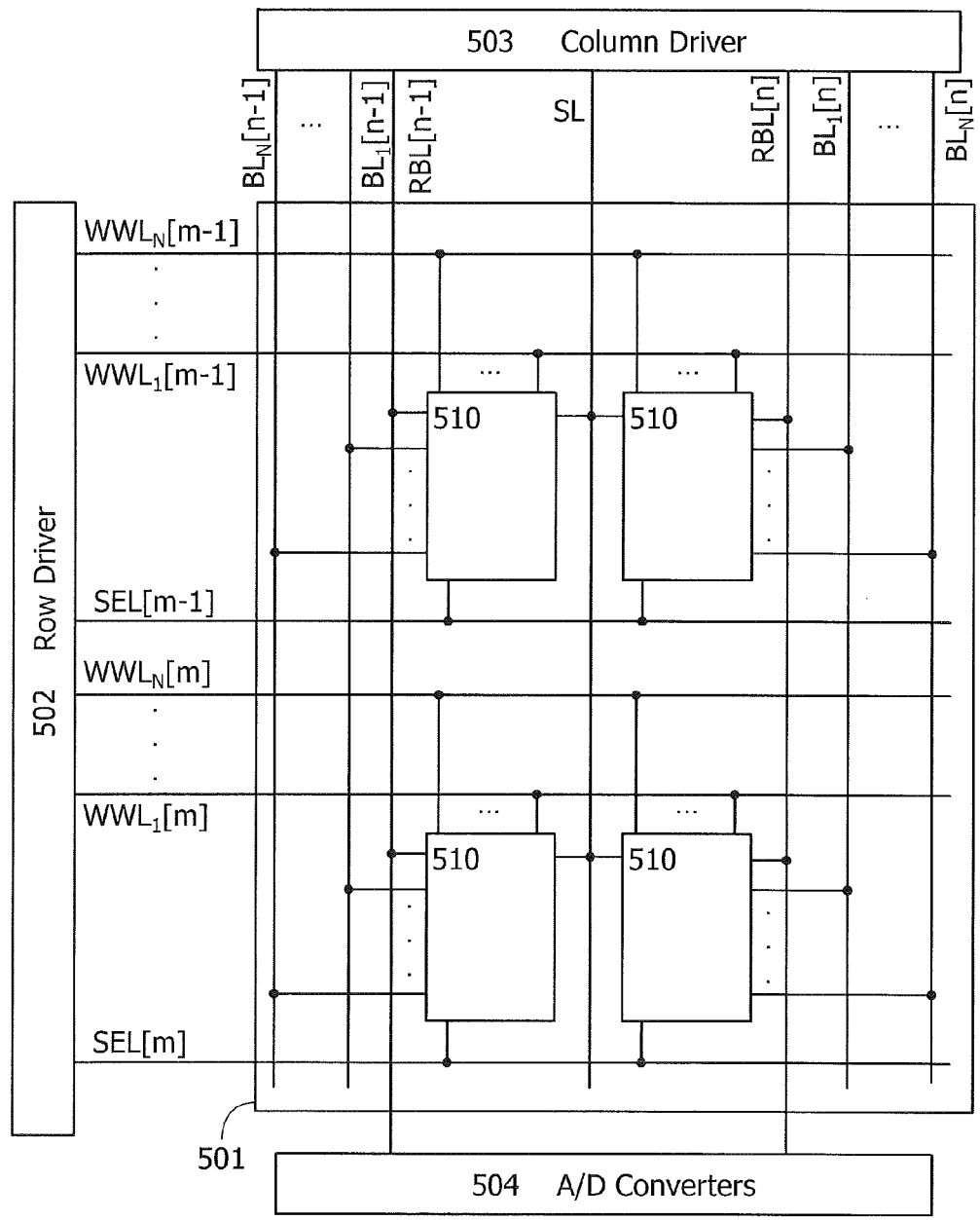
FIG. 19 is a circuit block diagram illustrating a configuration example of a semiconductor device.

FIG. 19 is a block diagram illustrating a structure example of a semiconductor device including a memory cell 510.

A semiconductor device 500 in FIG. 19 includes a memory cell array 501 having the plurality of memory cells 510, a row driver 502, a column driver 503, and A/D converters 504. The semiconductor device 500 includes the memory cells 510 arranged in a matrix of m rows (m is a natural number of two or more) and n columns (n is a natural number of two or more). FIG. 19 illustrates wirings $WWL_1$[m−1] to $WWL_N$[m−1] and a wiring SEL[m−1] that are connected to the memory cells 510 in an (m−1)th row, wirings $WWL_1$[m] to $WWL_N$[m] and a wiring SEL[m] that are connected to the memory cells 510 in an m-th row, wirings $BL_1$[n−1] to $BL_N$[n−1] and a wiring RBL[n−1] that are connected to the memory cells 510 in an (n−1)th column, wirings $BL_1$[n] to $BL_N$[n] and a wiring RBL[n] that are connected to the memory cells 510 in an n-th column, and the wiring SL connected to the memory cells 510 in the (n−1)th column and the n-th column.

As the memory cell 510, the memory cell described in Embodiment 1 or 2 can be used.

In the memory cell array 501 in FIG. 19, the memory cells 510 are arranged in a matrix.

In the memory cell array 501 shown in FIG. 19, the power supply line SL is shared by adjacent memory cells. With such a structure, the area occupied by the power supply line SL is reduced. Thus, a semiconductor device with this structure can have high memory capacity per unit area.

The row driver 502 is a circuit having a function of controlling on and off states of the transistors connected to the wirings $WWL_1$ to $WWL_N$ and a function of controlling the potential of the wiring SEL. With the row driver 502, the memory cells 510 can be selected row by row, and data can be written and read to/from the selected memory cells 510 in the semiconductor device 500.

The column driver 503 is a circuit having functions of giving data to the wirings $BL_1$ to $BL_N$ in the memory cells 510 of each column, initializing the potential of the wiring RBL, bringing the wiring RBL into an electrically floating state, and supplying a potential to the wiring SL. With the column driver 503, the memory cells 510 can be selected column by column, and data can be written and read to/from the selected memory cells 510 in the semiconductor device 500.

The A/D converter 504 is a circuit having a function of converting the potential of the wiring RBL that is an analog value into a digital value and outputting the digital value to the outside. Specifically, the A/D converter 504 is a flash A/D converter. The A/D converters 504 enable the semiconductor device 500 to output, to the outside, the potential of the wiring RBL that corresponds to data read from the memory cell 510.

Note that the A/D converter 504 is regarded as a flash A/D converter. However, the A/D converter 504 may be a successive approximation A/D converter, a multi-slope A/D converter, or a delta-sigma A/D converter.

<Structure Example of Row Driver>

Figure 20:
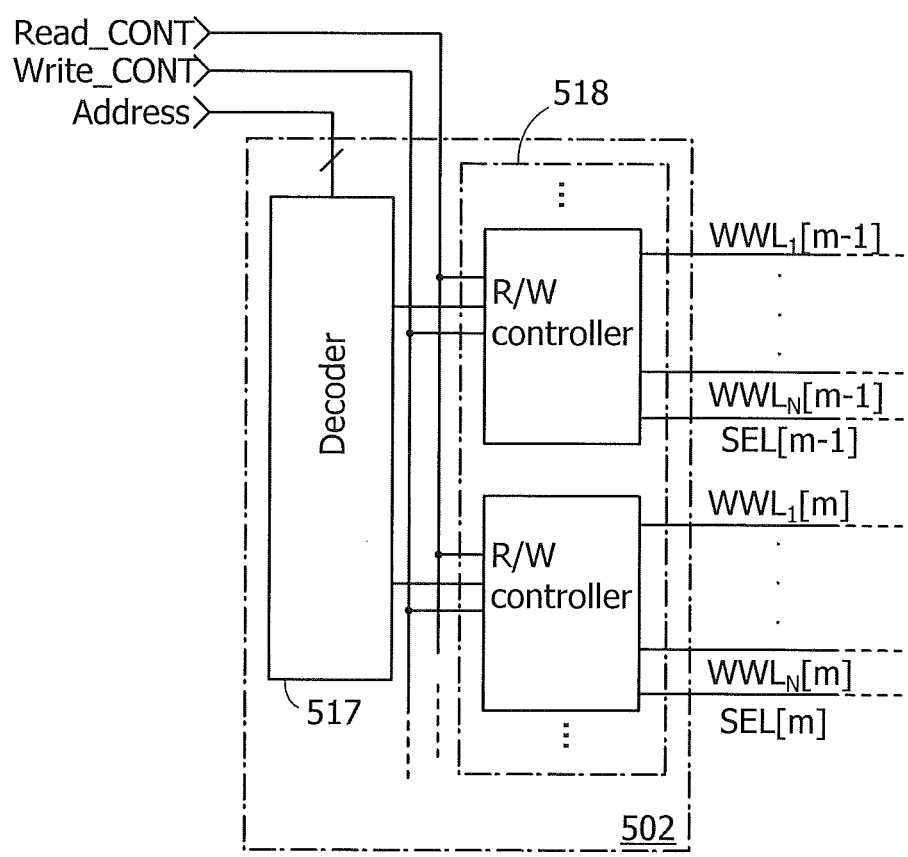
FIG. 20 is a circuit block diagram illustrating a configuration example of a row driver.

FIG. 20 is a block diagram illustrating a structure example of the row driver 502 in FIG. 19.

The row driver 502 in FIG. 20 includes a decoder 517 and read/write controllers 518. The read/write controller 518 is connected to the wirings $WWL_1$ to $WWL_N$ and the wiring SEL, and is provided in each row.

The decoder 517 is a circuit that outputs a signal for selecting any of the rows. Specifically, the decoder 517 receives an address signal (Address) and selects the read/write controller 518 in any of rows in accordance with the address signal Address. With the decoder 517, the row driver 502 can select a given row to write or read data.

The read/write controller 518 is a circuit having a function of outputting a write signal and selectively outputting a read signal, in a row selected by the decoder 517. Specifically, the read/write controller 518 is a circuit that receives a write control signal Write_CONT or a read control signal Read_CONT and selectively outputs a write signal or a read signal in accordance with the signal. With the read/write controllers 518, the row driver 502 can select and output the write signal or the read signal in the row selected by the decoder 517.

<Structure Example of Column Driver>

Figure 21:
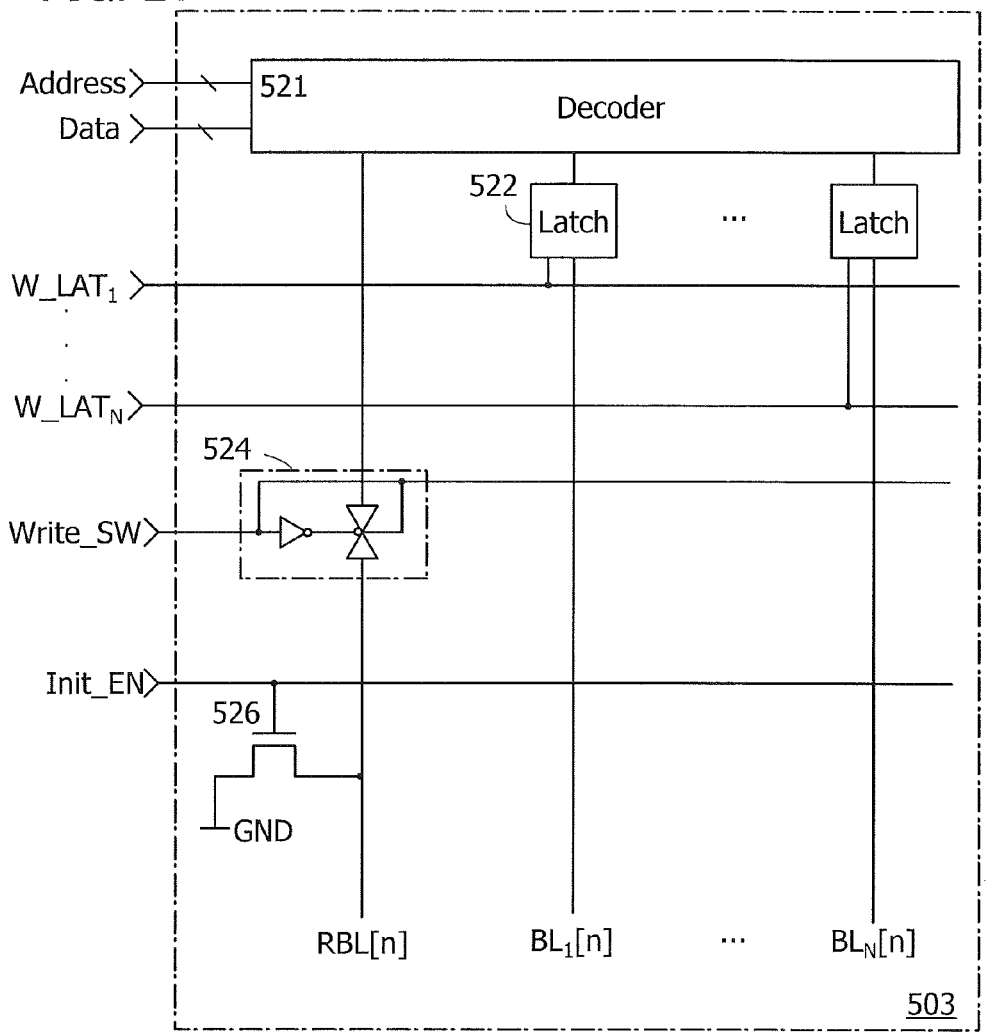
FIG. 21 is a circuit block diagram illustrating a configuration example of a column driver.

FIG. 21 is a block diagram illustrating a structure example of the column driver 503 in FIG. 19.

The column driver 503 in FIG. 21 includes a decoder 521, latch circuits 522, a switch circuit 524, and a transistor 526. The latch circuits 522, the switch circuit 524, and the transistor 526 are provided for each column. The latch circuits 522 in each column are provided for the wirings $BL_1$ to $BL_N$. Furthermore, the switch circuit 524 and the transistor 526 in each column are connected to the wiring RBL.

The decoder 521 is a circuit having a function of selecting a column and sorting and outputting input data. Specifically, the decoder 521 receives an address signal (Address) and data (Data) and outputs the data Data to the latch circuit 522 of any of columns in accordance with the address signal Address. The decoder 521 allows the column driver 503 to select a given column and write data.

Note that the data Data input to the decoder 521 is N-bit digital data. The N-bit digital data is a signal represented by binary data of '1' or '0' for each bit. Specifically, 2-bit digital data is data represented by '00', '01', '10', and '11'. The decoder 521 has a function of dividing the N-bit digital data Data for each bit and supplying the data to the wirings $BL_1$ to $BL_N$.

The latch circuit 522 has a function of temporarily storing the input data Data. Specifically, the latch circuit 522 is a flip-flop circuit that receives latch signals $W\_LAT_1$ to $W\_LAT_N$, stores the data Data, and outputs the data Data to the memory cell 510 in accordance with the latch signals $W\_LAT_1$ to $W\_LAT_N$. The latch circuit 522 enables the column driver 503 to write data at an opportune time.

The switch circuit 524 has a function of bringing the wiring RBL into an electrically floating state. Specifically, the switch circuit 524 includes an analog switch and an inverter. The switch circuit 524 makes the wiring RBL electrically floating by turning off the analog switch in accordance with a switch control signal Write_SW.

The transistor 526 has a function of supplying a potential GND to the wiring RBL and a function of bringing the wiring RBL into an electrically floating state. Specifically, the transistor 526 is a switch that supplies the potential GND to the wiring RBL in accordance with an initialization control signal Init_EN, and then brings the wiring RBL into an electrically floating state. The transistor 526 enables the column driver 503 to keep the wiring RBL in an electrically floating state after the potential GND is applied to the wiring RBL.

Figure 38:
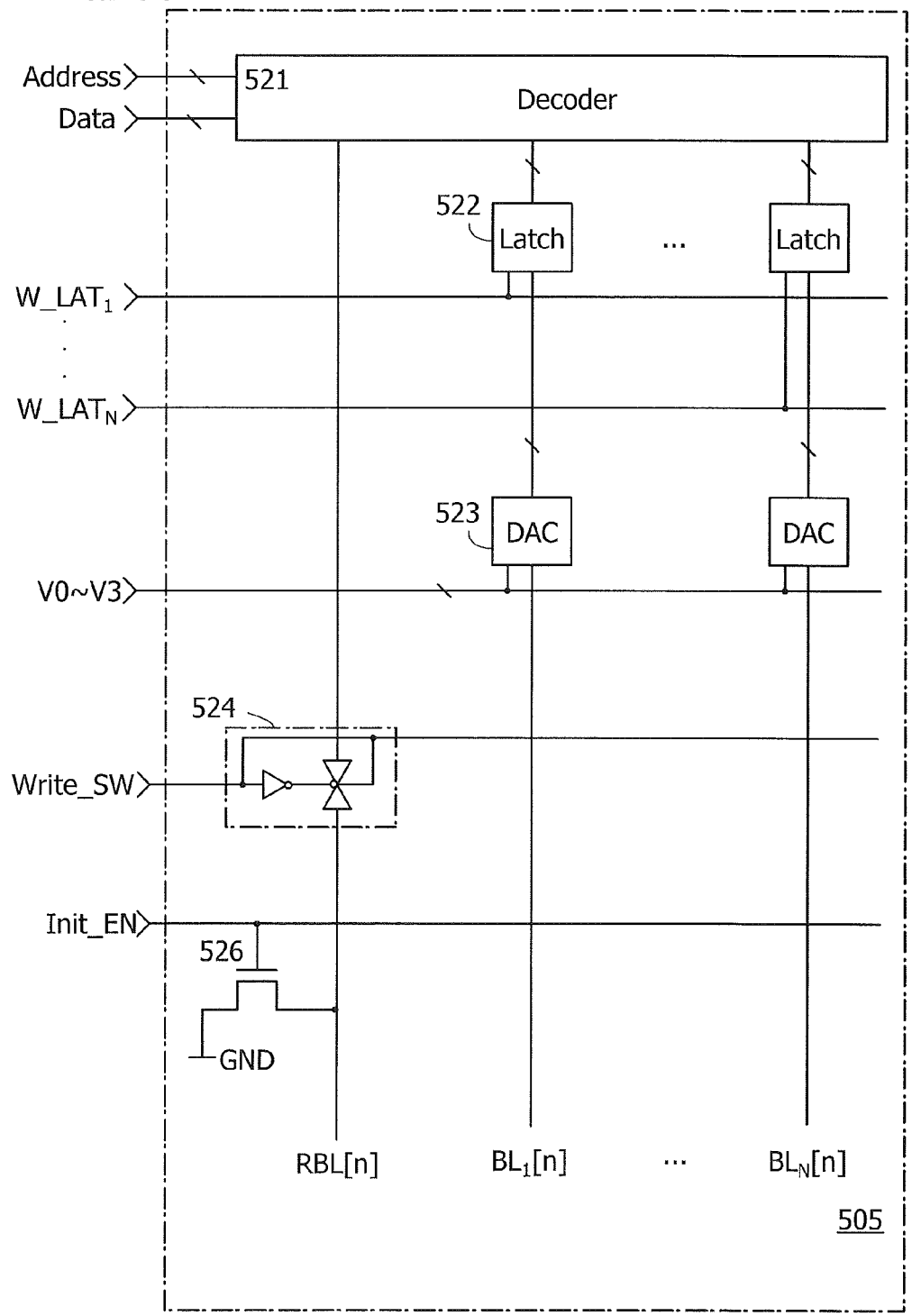
FIG. 38 is a circuit block diagram illustrating a configuration example of a column driver.

Although FIG. 21 shows the case where the decoder 521 divides the N-bit data for each bit and supplies the data to the wirings $BL_1$ to $BL_N$, one embodiment of the present invention is not limited thereto. For example, the decoder 521 may divide the N-bit data for each two or more bits and supply the data to the wirings $BL_1$ to $BL_N$. FIG. 38 shows a structure example of a column driver at this time. A column driver 505 in FIG. 38 is different from the column driver 503 in FIG. 21 in that D/A converters 523 are provided for the wirings $BL_1$ to $BL_N$.

The D/A converter 523 is a circuit having a function of converting input digital data into analog data. Specifically, the D/A converter 523 can convert 2-bit data, for example, into one of four potentials (V0 to V3) and output the potential.

<Structure Example of A/D Converter>

Figure 22:
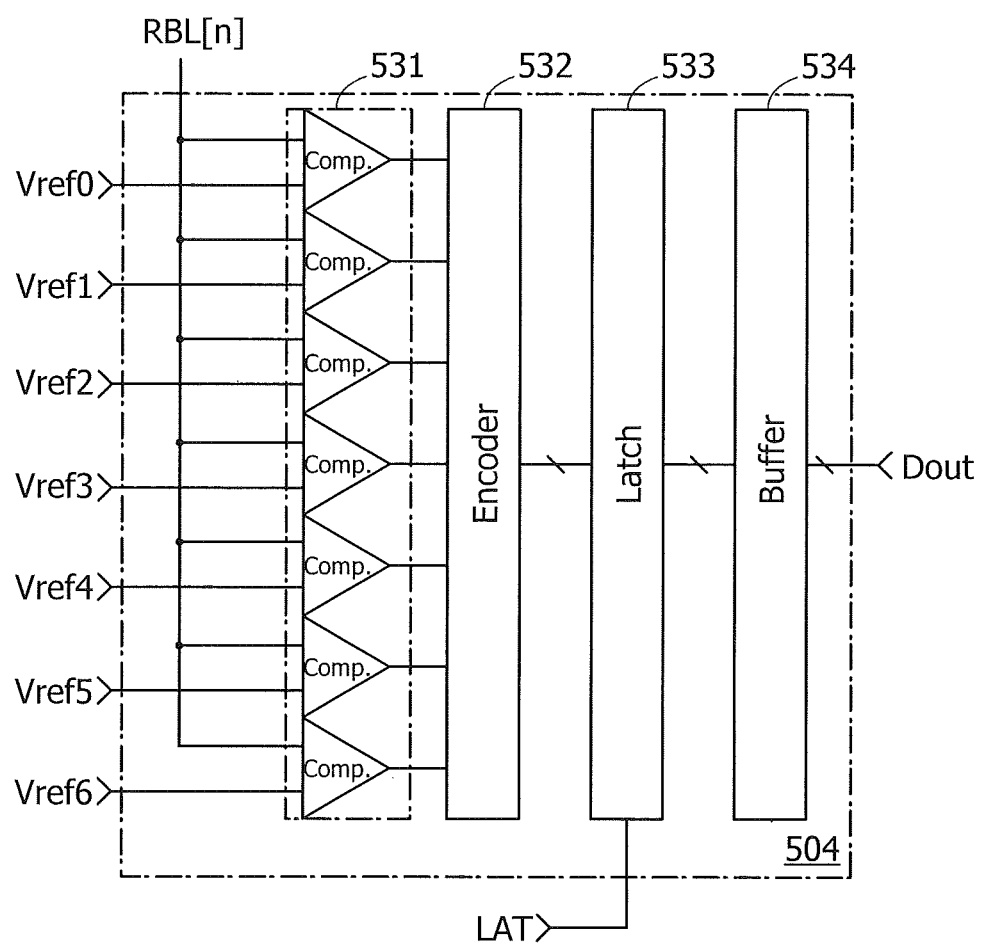
FIG. 22 is a circuit block diagram illustrating a configuration example of an A/D converter.

FIG. 22 is a block diagram illustrating a structure example of the A/D converter 504 in FIG. 19.

The A/D converter 504 in FIG. 22 includes a comparator 531, an encoder 532, a latch circuit 533, and a buffer 534. The buffer 534 in each column outputs data Dout.

The comparator 531 is a circuit having a function of determining which of the levels of multilevel data the potential of the wiring RBL corresponds to, by comparing the levels of the potential of the wiring RBL and the potentials of reference voltages Vref0 to Vref6. Specifically, the comparator 531 includes a plurality of comparators to which the potential of the wiring RBL and a corresponding one of the reference voltages Vref0 to Vref6 are supplied, and determines which of two potentials among the reference voltages Vref0 to Vref6 the potential of the wiring RBL is between. With the comparator 531, the A/D converter 504 can determine which of the levels of the multilevel data the potential of the wiring RBL corresponds to.

Note that the reference voltages Vref0 to Vref6 illustrated in FIG. 22 are potentials that are supplied when multilevel data is 3-bit data, that is, 8-level data.

The encoder 532 is a circuit having a function of generating a multi-bit digital signal based on a signal for determining the potential of the wiring RBL that is output from the comparator 531. Specifically, the encoder 532 encodes an H-level or L-level signal output from the plurality of comparators 531 to generate a digital signal. With the encoder 532, the A/D converter 504 can change data read from the memory cell 510 into digital data.

The latch circuit 533 has a function of temporarily storing input digital data. Specifically, the latch circuit 533 is a flip-flop circuit that receives a latch signal LAT, stores data, and outputs the data to the buffer 534 in accordance with the latch signal LAT. With the latch circuit 533, the A/D converter 504 can output data at an opportune time. Note that the latch circuit 533 can be omitted.

The buffer 534 is a circuit having a function of amplifying data output from the latch circuit 533 and outputting the amplified data as an output signal Dout. Specifically, the buffer 534 is a circuit provided with an even number of inverter circuits. The buffer 534 allows the A/D converter 504 to reduce noise of a digital signal. Note that the buffer 534 can be omitted.

Embodiment 4

In this embodiment, structure examples of an OS transistor that can be used for the switches $S_1$ to $S_N$ and the transistors $OS_1$ to $OS_N$ described in Embodiment 1 are shown.

<Structure Example 1 of Transistor>

Figure 23A:
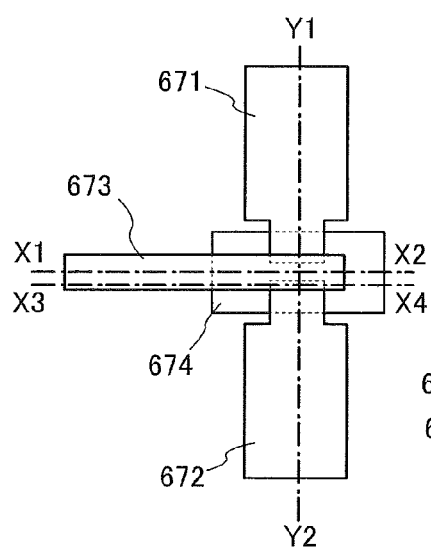
FIG. 23A is a top view and FIGS. 23B to 23D are cross-sectional views illustrating a structure example of a transistor.
Figure 23B:
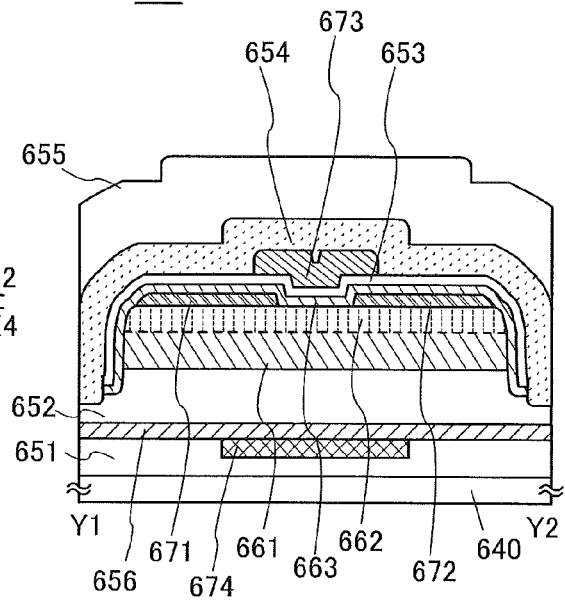
Figure 23C:
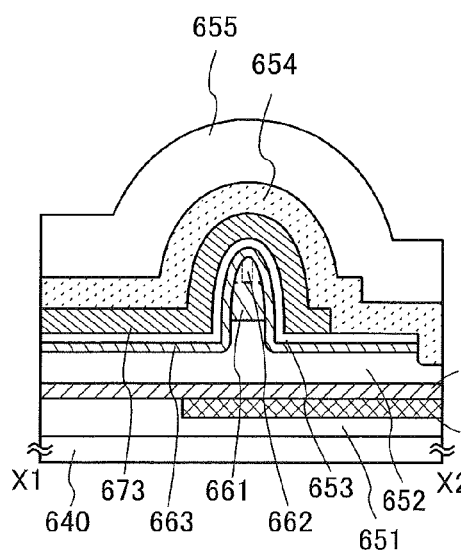
Figure 23D:
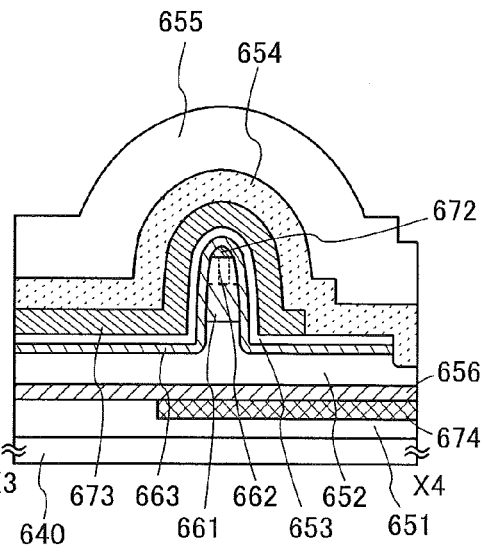

FIGS. 23A to 23D are a top view and cross-sectional views of a transistor 600. FIG. 23A is the top view. FIG. 23B illustrates a cross section along dashed-dotted line Y1-Y2 in FIG. 23A. FIG. 23C illustrates a cross section along dashed-dotted line X1-X2 in FIG. 23A. FIG. 23D illustrates a cross section along dashed-dotted line X3-X4 in FIG. 23A. In FIGS. 23A to 23D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The transistor 600 includes a substrate 640; an insulating film 651 over the substrate 640; a conductive film 674 over the insulating film 651; an insulating film 656 over the insulating film 651 and the conductive film 674; an insulating film 652 over the insulating film 656; a first semiconductor 661 and a second semiconductor 662 stacked over the insulating film 652 in this order; a conductive film 671 and a conductive film 672 in contact with the top surface of the semiconductor 662; a third semiconductor 663 in contact with the semiconductor 661, the semiconductor 662, the conductive film 671, and the conductive film 672; an insulating film 653 and a conductive film 673 over the semiconductor 663; an insulating film 654 over the conductive film 673 and the insulating film 653; and an insulating film 655 over the insulating film 654. Note that the first semiconductor 661, the second semiconductor 662, and the third semiconductor 663 are collectively referred to as a semiconductor 660.

The conductive film 671 functions as a source electrode of the transistor 600. The conductive film 672 functions as a drain electrode of the transistor 600.

The conductive film 673 functions as a first gate electrode of the transistor 600.

The insulating film 653 functions as a first gate insulating film of the transistor 600.

The conductive film 674 has a function as a second gate electrode of the transistor 600.

The insulating films 656 and 652 have a function as a second gate insulating film of the transistor 600.

Potentials applied to the conductive films 673 and 674 may be the same or different from each other. Note that the conductive film 674 is unnecessary in some cases.

As illustrated in FIG. 23C, a side surface of the semiconductor 662 is surrounded by the conductive film 673. With such a structure, the semiconductor 662 can be electrically surrounded by an electric field of the conductive film 673 (a transistor structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that high current in an on state (on-state current) can be achieved. The s-channel structure enables a transistor to operate at high frequency.

The s-channel structure, because of its high on-state current, is suitable for a semiconductor device such as large-scale integration (LSI) which requires a miniaturized transistor. A semiconductor device including the miniaturized transistor can have a high integration degree and high density. The transistor preferably has, for example, a region where a channel length is greater than or equal to 10 nm and less than 1 µm, more preferably greater than or equal to 10 nm and less than 100 nm, still more preferably greater than or equal to 10 nm and less than 70 nm, yet still more preferably greater than or equal to 10 nm and less than 60 nm, and yet still more preferably greater than or equal to 10 nm and less than 30 nm. In addition, the transistor preferably has, for example, a region where a channel width is greater than or equal to 10 nm and less than 1 µm, more preferably greater than or equal to 10 nm and less than 100 nm, still more preferably greater than or equal to 10 nm and less than 70 nm, yet still more preferably greater than or equal to 10 nm and less than 60 nm, and yet still more preferably greater than or equal to 10 nm and less than 30 nm.

Since a high on-state current can be obtained, the s-channel structure is suitable for a transistor that needs to operate at high frequency. A semiconductor device including the transistor can operate at high frequency.

The insulating film 651 has a function of electrically isolating the substrate 640 and the conductive film 674 from each other.

The insulating film 652 preferably includes an oxide. In particular, the insulating film 652 preferably includes an oxide material from which part of oxygen is released by heating. The insulating film 652 preferably includes an oxide containing oxygen in excess of that in the stoichiometric composition. Part of oxygen is released by heating from the oxide film containing oxygen in excess of that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulating film 656 has a function of preventing oxygen contained in the insulating film 652 from decreasing by bonding to metal contained in the conductive film 674.

The insulating film 654 has a function of blocking oxygen, hydrogen, water, alkali metal, alkaline earth metal, and the like. Providing the insulating film 654 can prevent outward diffusion of oxygen from the semiconductor 660 and entry of hydrogen, water, or the like into the semiconductor 660 from the outside.

Next, semiconductors which can be used as the semiconductors 661 to 663 or the like will be described below.

In the transistor 600, it is preferable that the current flowing between a source and drain in an off state (off-state current) be low. An example of a transistor with a low off-state current is a transistor including an oxide semiconductor as a semiconductor.

The semiconductor 662 is, for example, an oxide semiconductor containing indium (In). The semiconductor 662 has a high carrier mobility (electron mobility) when containing, for example, indium. The semiconductor 662 preferably contains an element M. The element M is preferably aluminum (Al), gallium (Ga), tin (Sn), or the like. Other elements which can be used as the element M include boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap may be used. For example, the energy gap of the semiconductor 662 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 is preferably a CAAC-OS film which will be described later.

For example, the semiconductor 661 and the semiconductor 663 include one or more, or two or more elements other than oxygen included in the semiconductor 662. Since the semiconductor 661 and the semiconductor 663 each include one or more, or two or more elements other than oxygen included in the semiconductor 662, an interface state is less likely to be formed at the interface between the semiconductor 661 and the semiconductor 662 and the interface between the semiconductor 662 and the semiconductor 663.

In the case of using an In-M-Zn oxide as the semiconductor 661 and the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case where the semiconductor 661 is formed by a sputtering method, a sputtering target with the above composition, for example, a sputtering target containing In, M, and Zn at an atomic ratio of 1:3:2, is preferably used.

In the case where an In-M-Zn oxide is used for the semiconductor 662 and the summation of In and M is assumed to be 100 atomic %, the proportions of In and M are preferably set to be greater than 25 atomic % and less than 75 atomic %, respectively, and more preferably greater than 34 atomic % and less than 66 atomic %, respectively. In the case where the semiconductor 662 is formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductor 662 may contain In, Ga, and Zn at an atomic ratio of around 4:2:3.

In the case of using an In-M-Zn oxide as the semiconductor 663, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 663 and the semiconductor 661 may be formed using the same type of oxide. Note that the semiconductor 661 and/or the semiconductor 663 do/does not necessarily contain indium in some cases. For example, the semiconductor 661 and/or the semiconductor 663 may be gallium oxide.

Figure 24A:
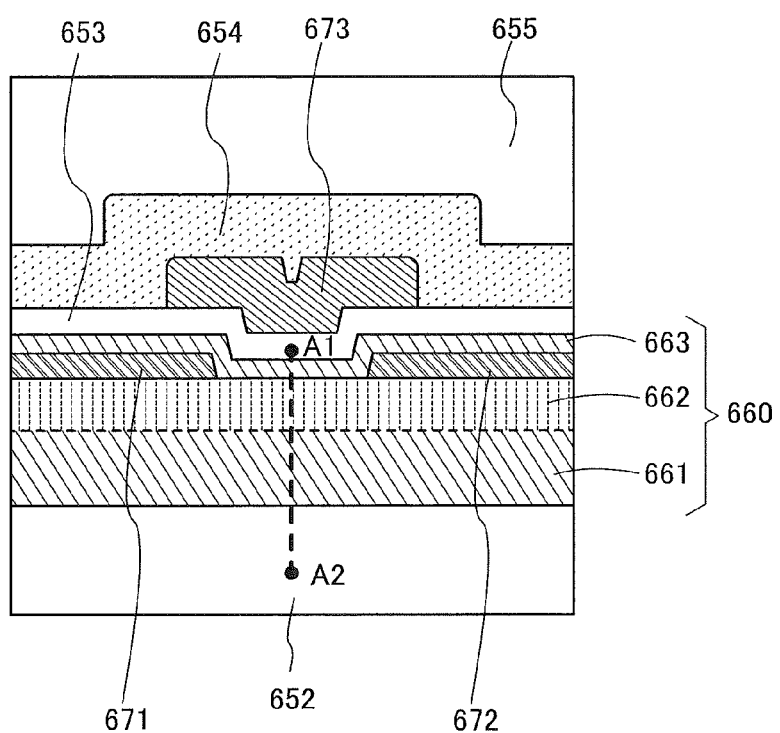
FIG. 24A is a cross-sectional view and FIG. 24B is an energy band diagram illustrating a structure example of a transistor.
Figure 24B:
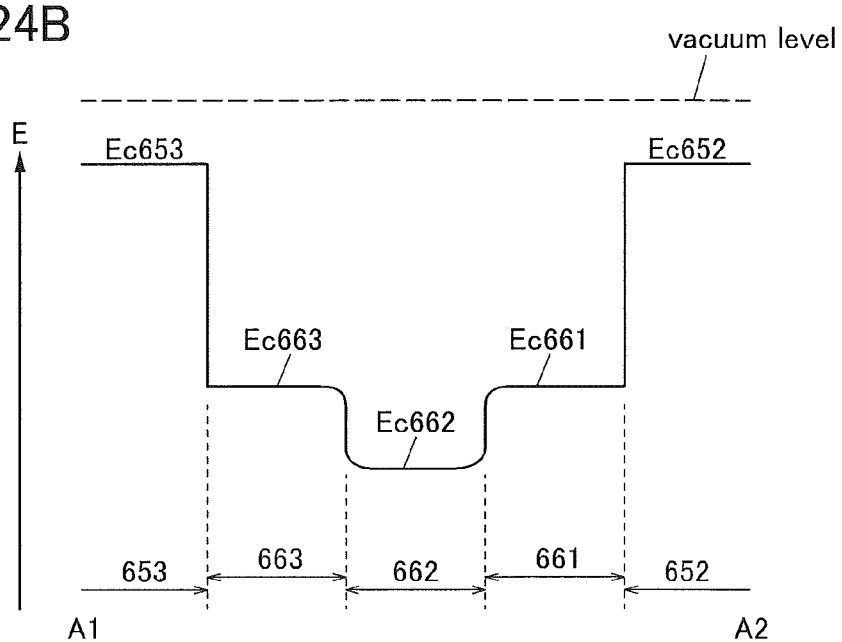

Next, a function and an effect of the semiconductor 660 in which the semiconductor 661, the semiconductor 662, and the semiconductor 663 are stacked will be described using an energy band diagram in FIG. 24B. FIG. 24A is an enlarged view of the channel portion of the transistor 600 illustrated in FIG. 23B. FIG. 24B shows an energy band structure of a portion along the chain line A1-A2 in FIG. 24A. FIG. 24B illustrates the energy band structure of a channel formation region of the transistor 600.

In FIG. 24B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 652 and the insulating film 653 are insulators, Ec652 and Ec653 are closer to the vacuum level than Ec661, Ec662, and Ec663 (i.e., the insulating film 652 and the insulating film 653 have a smaller electron affinity than the semiconductor 661, the semiconductor 662, and the semiconductor 663).

As the semiconductor 662, an oxide having an electron affinity higher than those of the semiconductors 661 and 663 is used. For example, as the semiconductor 662, an oxide having an electron affinity higher than those of the semiconductors 661 and 663 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 662 having the highest electron affinity among the semiconductors 661 to 663.

Here, in some cases, there is a mixed region of the semiconductor 661 and the semiconductor 662 between the semiconductor 661 and the semiconductor 662. Furthermore, in some cases, there is a mixed region of the semiconductor 662 and the semiconductor 663 between the semiconductor 662 and the semiconductor 663. The mixed region has a low interface state density. For that reason, the stack of the semiconductor 661, the semiconductor 662, and the semiconductor 663 has a band structure where energy at each interface and in the vicinity of the interface is changed continuously (continuous junction).

At this time, electrons move mainly in the semiconductor 662, not in the semiconductor 661 and the semiconductor 663. As described above, when the interface state density at the interface between the semiconductor 661 and the semiconductor 662 and the interface state density at the interface between the semiconductor 662 and the semiconductor 663 are decreased, electron movement in the semiconductor 662 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 μm×1 μm of the top surface or the bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using, for example, a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth in the semiconductor 662 or in a certain region of the semiconductor 662, which is measured by secondary ion mass spectrometry (SIMS), is higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having an oxygen-transmitting property (a layer through which oxygen passes or is transmitted).

In the case where the transistor has an s-channel structure, a channel is formed in the whole of the semiconductor 662. Therefore, as the semiconductor 662 has a larger thickness, a channel region becomes larger. In other words, the thicker the semiconductor 662 is, the larger the on-state current of the transistor is.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm Meanwhile, the semiconductor 663 has a function of blocking entry of elements other than oxygen (such as hydrogen and silicon) included in the adjacent insulator into the semiconductor 662 where a channel is formed. For this reason, it is preferable that the semiconductor 663 have a certain thickness. For example, the semiconductor 663 may have a region with a thickness of greater than or equal to 0.3 nm, preferably greater than or equal to 1 nm, more preferably greater than or equal to 2 nm. The semiconductor 663 preferably has an oxygen blocking property to suppress outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, the distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region with a silicon concentration measured by SIMS analysis of higher than or equal to $1 \times 10^{16}$ atoms/cm$^3$ and lower than $1 \times 10^{19}$ atoms/cm$^3$, preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$ is provided between the semiconductor 662 and the semiconductor 661. A region with a silicon concentration measured by SIMS of higher than or equal to $1 \times 10^{16}$ atoms/cm$^3$ and lower than $1 \times 10^{19}$ atoms/cm$^3$, preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$ is provided between the semiconductor 662 and the semiconductor 663.

It is preferable to reduce the concentration of hydrogen in the semiconductor 661 and the semiconductor 663 in order to reduce the concentration of hydrogen in the semiconductor 662. The semiconductor 661 and the semiconductor 663 each have a region in which the concentration of hydrogen measured by SIMS is higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$. It is preferable to reduce the concentration of nitrogen in the semiconductor 661 and the semiconductor 663 in order to reduce the concentration of nitrogen in the semiconductor 662. The semiconductor 661 and the semiconductor 663 each have a region in which the concentration of nitrogen measured by SIMS is higher than or equal to $1 \times 10^{16}$ atoms/cm$^3$ and lower than $5 \times 10^{19}$ atoms/cm$^3$, preferably higher than or equal to $1 \times 10^{16}$ atoms/cm$^3$ and lower than or equal to $5 \times 10^{18}$ atoms/cm$^3$, more preferably higher than or equal to $1 \times 10^{16}$ atoms/cm$^3$ and lower than or equal to $1 \times 10^{18}$ atoms/cm$^3$, still more preferably higher than or equal to $1 \times 10^{16}$ atoms/cm$^3$ and lower than or equal to $5 \times 10^{17}$ atoms/cm$^3$.

The above three-layer structure is an example. For example, a two-layer structure without the semiconductor 661 or the semiconductor 663 may be employed. A four-layer structure in which any one of the semiconductors shown as examples of the semiconductor 661, the semiconductor 662, and the semiconductor 663 is provided under or over the semiconductor 661 or under or over the semiconductor 663 may be employed. An n-layer structure (n is an integer of 5 or more) in which any one of the semiconductors shown as examples of the semiconductor 661, the semiconductor 662, and the semiconductor 663 is provided at two or more of the following positions: over the semiconductor 661, under the semiconductor 661, over the semiconductor 663, and under the semiconductor 663.

<<Method for Manufacturing Transistor>>

A method for manufacturing the transistor 600 illustrated in FIGS. 23A to 23D will be described below with reference to FIGS. 25A to 25D and FIGS. 26A to 26D. Note that cross-sectional views of the transistor in the channel length direction (cross-sectional views along dashed-dotted line Y1-Y2 in FIG. 23A) are shown on the left side of FIGS. 25A to 25D and FIGS. 26A to 26D, and cross-sectional views of the transistor in the channel width direction (cross-sectional views along dashed-dotted line X1-X2 in FIG. 23A) are shown on the right side of FIGS. 25A to 25D and FIGS. 26A to 26D.

Figure 25A:
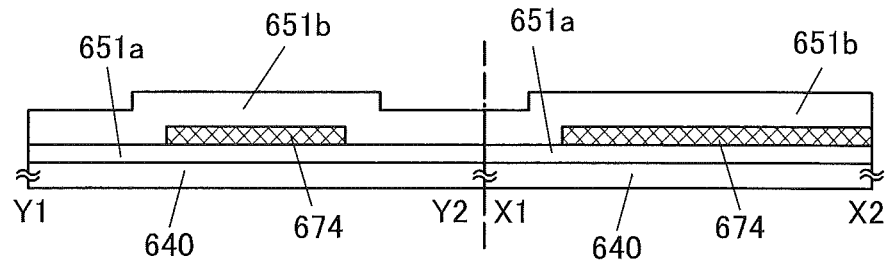
FIGS. 25A to 25D are cross-sectional views illustrating a method for manufacturing a transistor.

First, an insulating film 651a is formed over the substrate 640. Then, the conductive film 674 is formed, followed by an insulating film 651b (FIG. 25A).

As the substrate 640, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like, a compound semiconductor substrate made of silicon carbide, silicon germanium, gallium arsenide, indium phosphide, zinc oxide, or gallium oxide, or the like is used. The above semiconductor substrate in which an insulator region is provided, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 640. As a method for providing a transistor over a flexible substrate, there is a method in which the transistor is formed over a non-flexible substrate and then the transistor is separated and transferred to the substrate 640 which is a flexible substrate. In that case, a separation layer is preferably provided between the non-flexible substrate and the transistor. As the substrate 640, a sheet, a film, or a foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 640 has a small thickness, the weight of the semiconductor device can be reduced. When the substrate 640 has a small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the substrate 640 which is a flexible substrate, for example, metal, an alloy, resin, glass, or fiber thereof can be used. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyimide (e.g., nylon or aramid), polyimide, polycarbonate, acrylic, and polytetrafluoroethylene (PTFE). In particular, aramid is preferably used for the flexible substrate 640 because of its low coefficient of linear expansion.

As a material for the insulating films 651a and 651b, a material containing silicon oxide, silicon nitride, silicon oxynitride, or silicon nitride oxide is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and a "nitride oxide" refers to a material that contains nitrogen at a higher proportion than oxygen.

The insulating films 651a and 651b may be formed using silicon oxide with high step coverage which is formed by reacting tetraethyl orthosilicate (TEOS), silane, or the like with oxygen, nitrous oxide, or the like.

The insulating films 651a and 651b may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like. In particular, it is preferable that the insulating films be formed by a CVD method, more preferably a plasma CVD method because coverage can be further improved. It is preferable to use a thermal CVD method, an MOCVD method, or an ALD method in order to reduce plasma damage.

In the case of using a semiconductor substrate as the substrate 640, the insulating film 651a may be formed using a thermal oxide film.

The conductive film 674 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive film 674 can be formed by a sputtering method, a CVD method (including a thermal CVD method, an MOCVD method, a PECVD method, and the like), an MBE method, an ALD method, a PLD method, or the like.

Figure 25B:
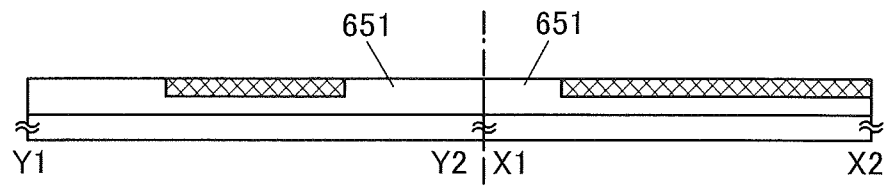

Next, a surface of the insulating film 651b is subjected to planarization by a chemical mechanical polishing (CMP) method (see FIG. 25B).

As the insulating film 651b, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of borophosphosilicate glass (BPSG).

Furthermore, an example of a film which can be formed by a coating method is a film of hydrogen silsesquioxane (HSQ).

Hereinafter, the insulating films 651a and 651b are collectively referred to as the insulating film 651.

Figure 25C:
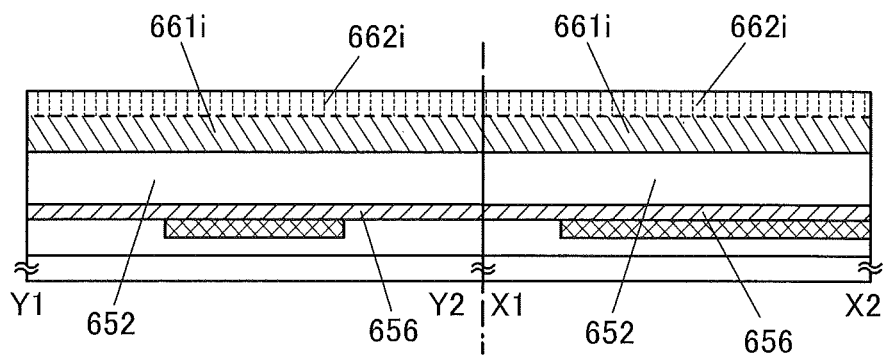

Next, the insulating film 656, the insulating film 652, a semiconductor 661i, and a semiconductor 662i are formed (see FIG. 25C).

The insulating films 656 and 652 may be formed by a sputtering method, a CVD method (including a thermal CVD method, an MOCVD method, a PECVD method, and the like), an MBE method, an ALD method, a PLD method, or the like.

The insulating film 656 preferably has a blocking effect against oxygen, hydrogen, water, alkali metal, alkaline earth metal, and the like. The insulating film 656 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The insulating film 652 preferably contains an oxide that can supply oxygen to the semiconductor 660. For example, for the insulating film 652, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

To make the insulating film 652 contain excess oxygen, the insulating film 652 may be formed in an oxygen atmosphere, for example. Alternatively, a region containing excess oxygen may be formed by introducing oxygen into the insulating film 652 that has been formed. Both the methods may be combined.

For example, oxygen (at least including any of oxygen radicals, oxygen atoms, and oxygen ions) may be introduced into the insulating film 652 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, or the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 652 is formed, the insulating film 652 may be subjected to planarization treatment using a CMP method or the like to improve the planarity of the top surface thereof.

The semiconductors 661i and 662i are preferably formed successively without being exposed to the air. The semiconductors 661i and 662i are formed by a sputtering method, a CVD method (including a thermal CVD method, an MOCVD method, a PECVD method, and the like), an MBE method, a PLD method, an ALD method, or the like.

The description of the semiconductors 661 and 662 in FIGS. 23A to 23D and FIGS. 24A and 24B can be referred to for a material that can be used for the semiconductors 661i and 662i.

Note that in the case where In—Ga—Zn oxide layers formed by an MOCVD method are used as the semiconductors 661i and 662i, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Still alternatively; diethylzinc or the like may be used instead of dimethylzinc.

Here, after the semiconductor 661i is formed, oxygen may be introduced into the semiconductor 661i. For example, oxygen (including at least any of oxygen radicals, oxygen atoms, and oxygen ions) is introduced into the semiconductor 661i which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, or the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

After the semiconductors 661i and 662i are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after the formation of semiconductor films or may be performed after the semiconductor films are processed into the island-shaped semiconductors 661 and 662. Through the heat treatment, oxygen can be supplied to the semiconductors from the insulating film 652 and the oxide film; thus, oxygen vacancies in the semiconductors can be reduced.

Figure 25D:
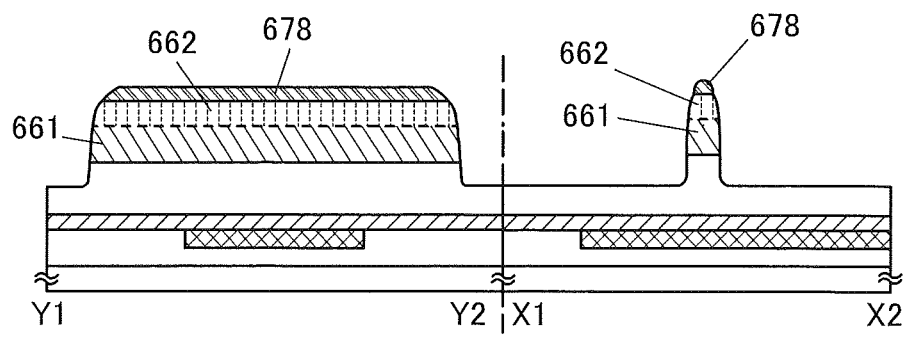

Then, the semiconductors 661i and 662i are processed with the use of a hard mask 678, so that the island-shaped semiconductors 661 and 662 are formed (see FIG. 25D). Note that, in some cases, part of the insulating film 652 is etched in the etching of the semiconductors 661i and 662i to reduce the thickness of a portion of the insulating film 652. For this reason, the insulating film 652 is preferably formed to have a large thickness so as not to be removed by the etching.

The hard mask 678 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are more preferably formed using a Cu—Mn alloy, in which case manganese oxide formed at the interface with an insulator containing oxygen has a function of preventing Cu diffusion.

The hard mask 678 is preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The hard mask 678 can be formed by a sputtering method, a CVD method (including a thermal CVD method, an MOCVD method, a PECVD method, and the like), an MBE method, an ALD method, a PLD method, or the like.

Figure 26A:
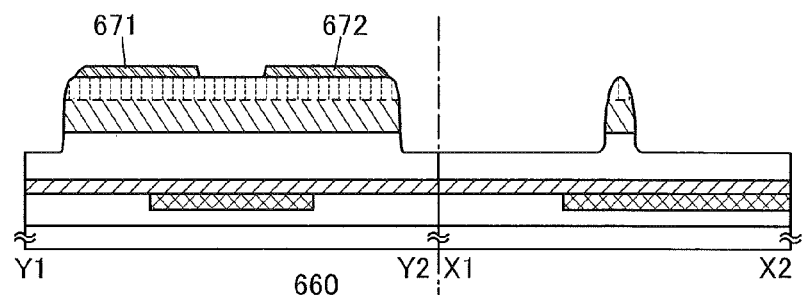
FIGS. 26A to 26D are cross-sectional views illustrating a method for manufacturing a transistor.
Figure 26B:
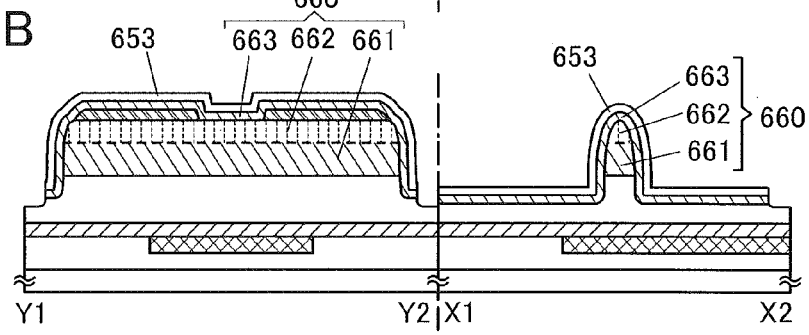

Next, a resist mask is formed, and the hard mask 678 is processed into the conductive films 671 and 672 by etching (see FIG. 26A). Note that in some cases, upper portions of the semiconductor 662 and the insulating film 652 are partly etched in etching of the hard mask 678, so that a portion not overlapping with the conductive film 671 or 672 is thinned. For this reason, the semiconductor 662 is preferably formed to have a large thickness in advance in consideration of the etching depth.

Then, the semiconductor 663 and the insulating film 653 are formed. After that, a resist mask is formed, the semiconductor 663 and the insulating film 653 are processed by etching, and the resist mask is removed (see FIG. 26B).

Figure 26C:
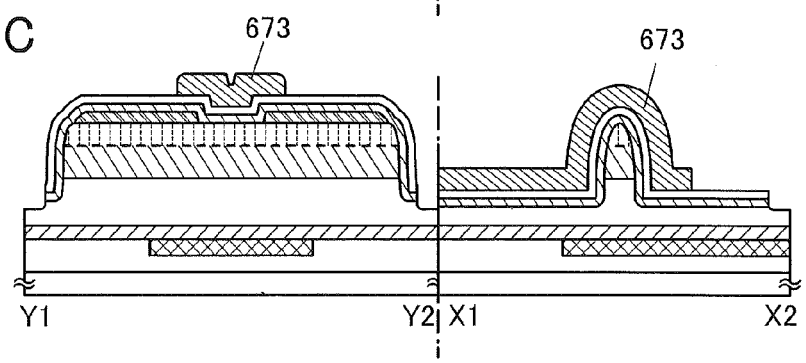

Next, the conductive film 673 is deposited, a resist mask is formed, the conductive film 673 is processed by etching, and the resist mask is removed, whereby a gate electrode is formed (see FIG. 26C).

The semiconductor 663, the insulating film 653, and the conductive film 673 can be formed by a sputtering method, a CVD method (including a thermal CVD method, an MOCVD method, a PECVD method, and the like), an MBE method, a PLD method, an ALD method, or the like. In particular, it is preferable to use a CVD method, more preferably a plasma CVD method, because coverage can be further improved. It is preferable to use a thermal CVD method, an MOCVD method, or an ALD method in order to reduce plasma damage.

The semiconductor 663 and the insulating film 653 may be etched after the conductive film 673 is formed. The etching may be performed with a resist mask, for example. Alternatively, the insulating film 653 and the semiconductor 663 may be etched using the conductive film 673 as a mask.

After the semiconductor 663 is formed, oxygen may be introduced into the semiconductor 663. For example, oxygen (including at least any of oxygen radicals, oxygen atoms, and oxygen ions) is introduced into the semiconductor 663 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

The description of the semiconductor 663 in FIGS. 23A to 23D and FIGS. 24A and 24B can be referred to for a material that can be used for the semiconductor 663.

The insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack including any of the above materials. The insulating film 653 may contain lanthanum (La), nitrogen, or zirconium (Zr) as an impurity.

An example of a layered structure of the insulating film 653 is described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, the thickness of the insulating film 653 can be made large as compared with the case where silicon oxide is used; as a result, a leakage current due to a tunnel current can be low. That is, it is possible to provide a transistor with a low off-state current.

Next, the insulating film 654 is formed. The insulating film 654 has a blocking effect against oxygen, hydrogen, water, alkali metal, alkaline earth metal, and the like. The insulating film 654 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, more preferably a plasma CVD method, because coverage can be further improved. It is preferable to use a thermal CVD method, an MOCVD method, or an ALD method in order to reduce plasma damage.

The insulating film 654 preferably has a blocking effect against oxygen, hydrogen, water, alkali metal, alkaline earth metal, and the like. The insulating film 654 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. In addition, oxygen contained in the aluminum oxide film can be diffused into the semiconductor 660.

After the insulating film 654 is formed, heat treatment is preferably performed. Through this heat treatment, oxygen can be supplied to the semiconductor 660 from the insulating film 652 or the like; thus, oxygen vacancies in the semiconductor 660 can be reduced. Because oxygen released from the insulating film 652 is blocked by the insulating film 656 and the insulating film 654 at this time, the oxygen can be effectively confined. Thus, the amount of oxygen that is supplied to the semiconductor 660 can be increased, so that oxygen vacancies in the semiconductor 660 can be effectively reduced.

Figure 26D:
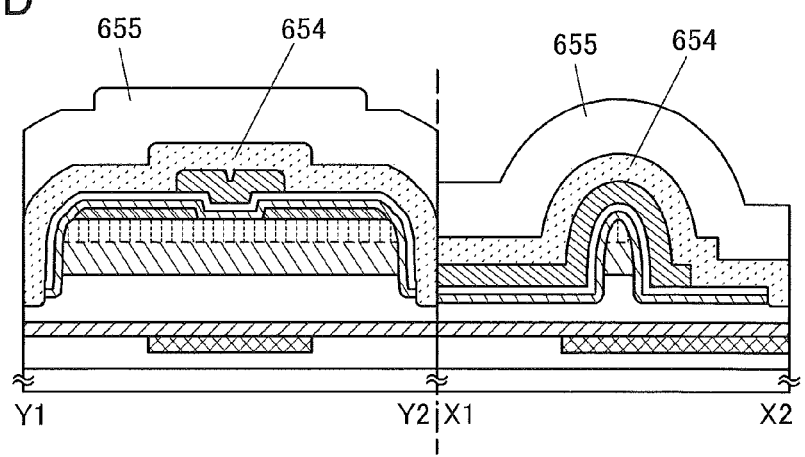

Next, the insulating film 655 is formed (see FIG. 26D). The insulating film 655 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, more preferably a plasma CVD method, because coverage can be improved. It is preferable to use a thermal CVD method, an MOCVD method, or an ALD method in order to reduce plasma damage. In the case where the insulating film 655 is formed using an organic insulating material such as an organic resin, a coating method such as a spin coating method may be used. After the insulating film 655 is formed, the top surface thereof is preferably subjected to planarization treatment.

The insulating film 655 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 655, an organic resin such as a polyimide resin, a polyamide resin, an acrylic resin, a siloxane resin, an epoxy resin, or a phenol resin can be used. The insulating film 655 may be a stack including any of the above materials.

<Structure Example 2 of Transistor>

In the transistor 600 in FIGS. 23A to 23D, the conductive film 674 is not necessarily provided.

Figure 27A:
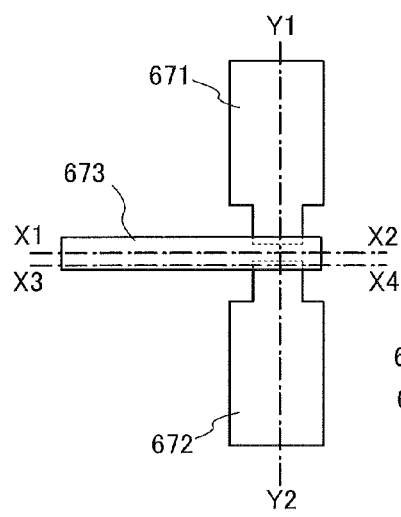
FIG. 27A is a top view and FIGS. 27B to 27D are cross-sectional views illustrating a structure example of a transistor.
Figure 27B:
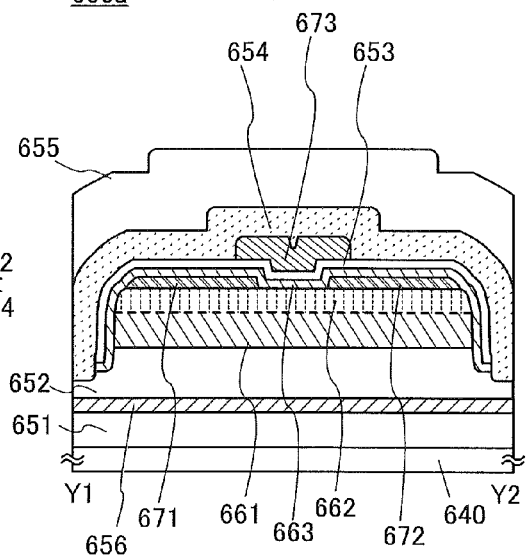
Figure 27C:
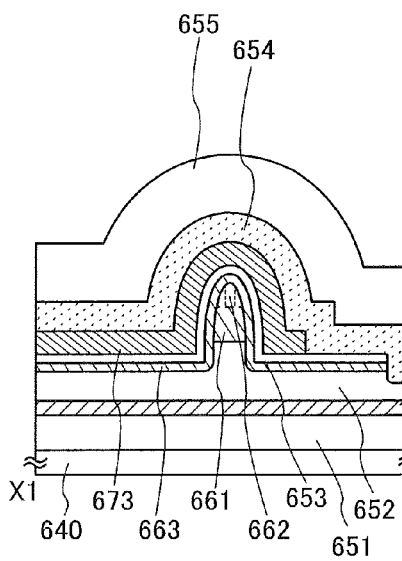
Figure 27D:
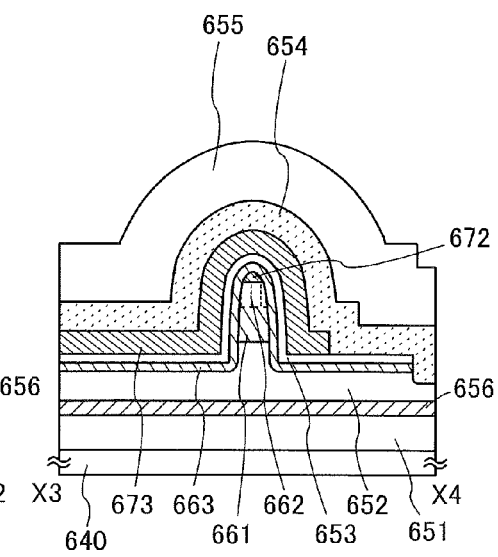

FIGS. 27A to 27D show an example of such a case. FIGS. 27A to 27D are a top view and cross-sectional views of a transistor 600a. FIG. 27A is the top view. FIG. 27B illustrates a cross section along dashed-dotted line Y1-Y2 in FIG. 27A. FIG. 27C illustrates a cross section along dashed-dotted line X1-X2 in FIG. 27A. FIG. 27D illustrates a cross section along dashed-dotted line X3-X4 in FIG. 27A. In FIGS. 27A to 27D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

<Structure Example 3 of Transistor>

In the transistor 600 in FIGS. 23A to 23D, the conductive film 673 and the conductive film 674 may be connected to each other. FIGS. 28A to 28D show an example of such a case.

Figure 28A:
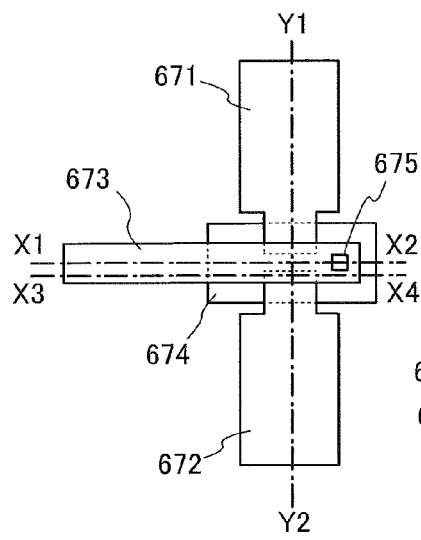
FIG. 28A is a top view and FIGS. 28B to 28D are cross-sectional views illustrating a structure example of a transistor.
Figure 28B:
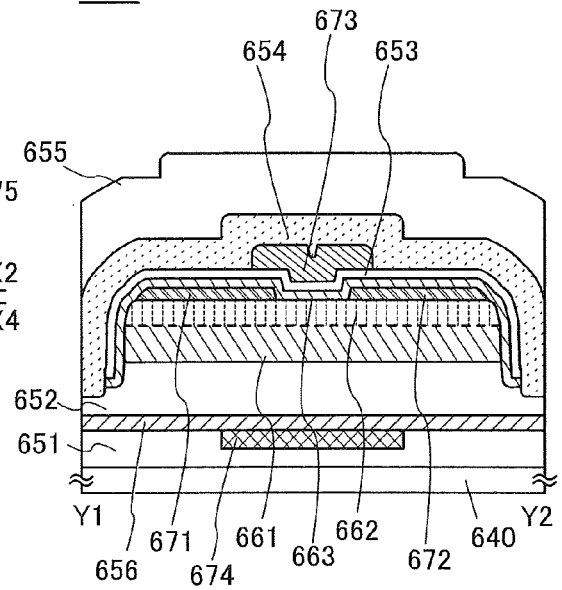
Figure 28C:
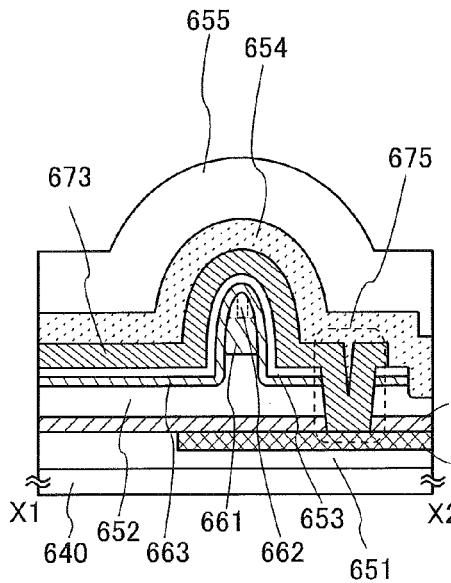
Figure 28D:
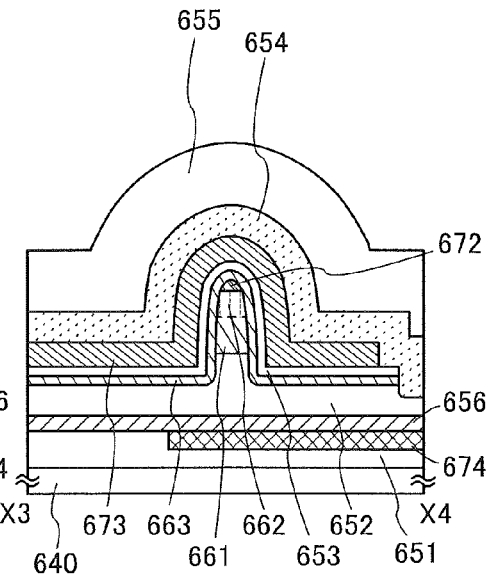

FIGS. 28A to 28D are a top view and cross-sectional views of a transistor 600b. FIG. 28A is the top view. FIG. 28B illustrates a cross section along dashed-dotted line Y1-Y2 in FIG. 28A. FIG. 28C illustrates a cross section along dashed-dotted line X1-X2 in FIG. 28A. FIG. 28D illustrates a cross section along dashed-dotted line X3-X4 in FIG. 28A. In FIGS. 28A to 28D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

In the transistor 600b, an opening portion 675 is provided in the insulating film 653, the semiconductor 663, the insulating film 652, and the insulating film 656, and the conductive film 673 and the conductive film 674 are connected to each other through the opening portion 675.

<Structure Example 4 of Transistor>

Figure 29:
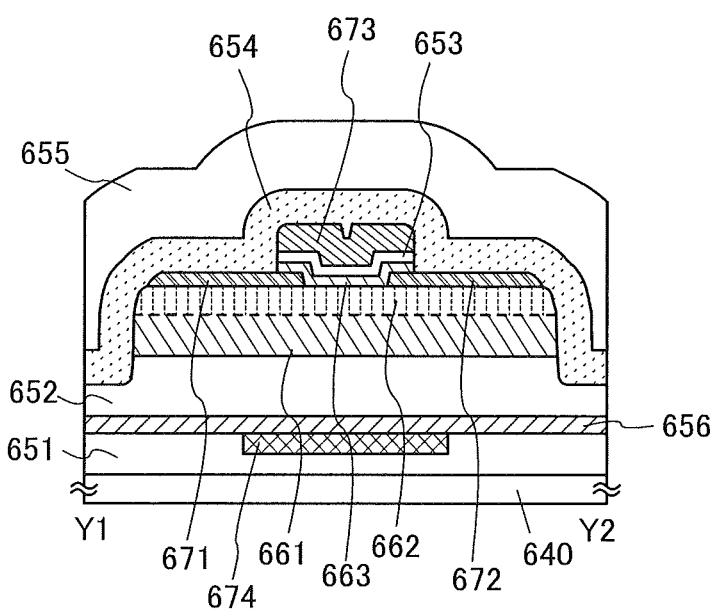
FIG. 29 is a cross-sectional view illustrating a structure example of a transistor.

In the transistor 600 illustrated in FIGS. 23A to 23D, the semiconductor 663 and the insulating film 653 may be etched at the same time when the conductive film 673 is formed by etching. FIG. 29 shows an example of such a case.

FIG. 29 illustrates a transistor 600c in which the semiconductor 663 and the insulating film 653 in FIG. 23B are provided only under the conductive film 673.

<Structure Example 5 of Transistor>

Figure 30:
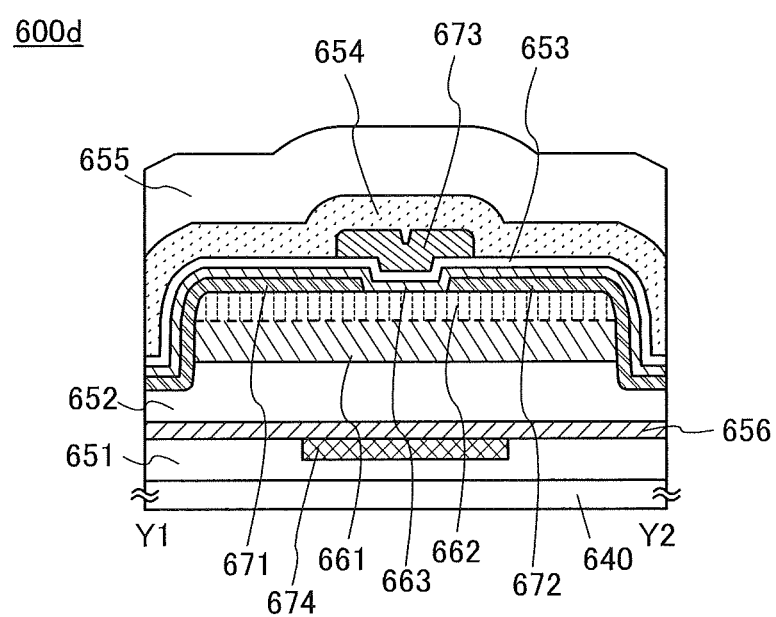
FIG. 30 is a cross-sectional view illustrating a structure example of a transistor.

In the transistor 600 illustrated in FIGS. 23A to 23D, the conductive films 671 and 672 may be in contact with side surfaces of the semiconductors 661 and 662. FIG. 30 shows an example of such a case.

FIG. 30 illustrates a transistor 600d in which the conductive films 671 and 672 in FIG. 23B are in contact with the side surfaces of the semiconductors 661 and 662.

<Structure Example 6 of Transistor>

Figure 31:
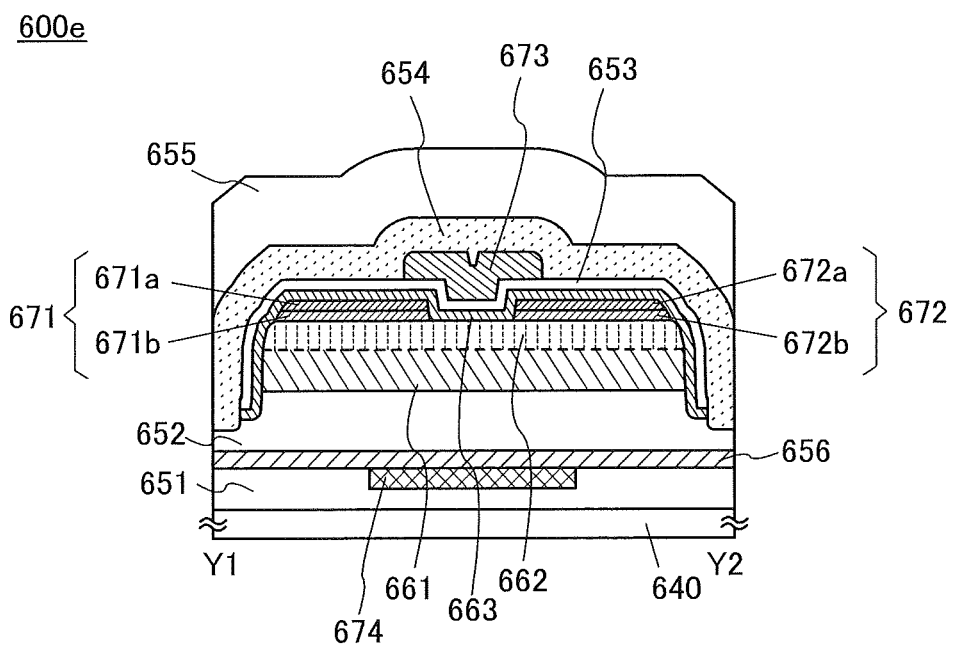
FIG. 31 is a cross-sectional view illustrating a structure example of a transistor.

In the transistor 600 illustrated in FIGS. 23A to 23D, the conductive film 671 may be a stack including a conductive film 671a and a conductive film 671b. Furthermore, the conductive film 672 may be a stack including a conductive film 672a and a conductive film 672b. FIG. 31 illustrates an example of such a case.

FIG. 31 illustrates a transistor 600e in which the conductive film 671 and the conductive film 672 in FIG. 23B are a stack including the conductive films 671a and 671b and a stack including the conductive films 672a and 672b, respectively.

The conductive films 671b and 672b may be formed using a transparent conductor, an oxide semiconductor, a nitride semiconductor, or an oxynitride semiconductor, for example. The conductive films 671b and 672b may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671b and 672b may have a property of transmitting visible light. Alternatively, the conductive films 671b and 672b may have a property of not transmitting visible light, ultraviolet light, infrared light, or X-rays by reflecting or absorbing it. In some cases, such a property can suppress a change in electrical characteristics of the transistor due to stray light.

The conductive films 671b and 672b may preferably be formed using a layer which does not form a Schottky barrier with the semiconductor 662. Accordingly, on-state characteristics of the transistor can be improved.

Each of the conductive films 671a and 672a may be formed to have, for example, a single-layer structure or a layered structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671*b* and 672*b* may preferably be formed using a film having a resistance higher than that of the conductive films 671*a* and 672*a*. The conductive films 671*b* and 672*b* may preferably be formed using a film having a resistance lower than that of the channel of the transistor. For example, the conductive films 671*b* and 672*b* may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 671*b* and 672*b* having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671*b* and 672*b* (e.g., the film on the drain side) may preferably be provided.

<Structure Example 7 of Transistor>

Figure 32A:
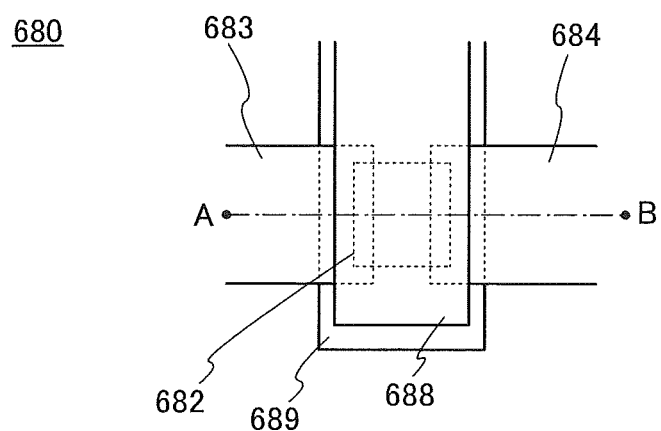
FIG. 32A is a top view and FIG. 32B is a cross-sectional view illustrating a structure example of a transistor.
Figure 32B:
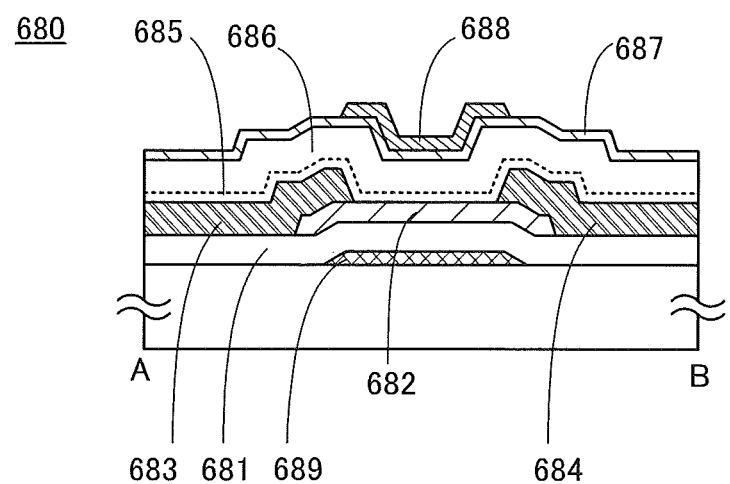

FIGS. 32A and 32B are a top view and a cross-sectional view of a transistor 680. FIG. 32A is the top view. FIG. 32B illustrates a cross section along dashed-dotted line A-B in FIG. 32A. In FIGS. 32A and 32B, some components are scaled up or down or omitted for easy understanding. The direction of the dashed-dotted line A-B may be referred to as a channel length direction.

The transistor 680 illustrated in FIG. 32B includes a conductive film 689 serving as a first gate, a conductive film 688 serving as a second gate, a semiconductor 682, a conductive film 683 and a conductive film 684 serving as a source and a drain, an insulating film 681, an insulating film 685, an insulating film 686, and an insulating film 687.

The conductive film 689 is on an insulating surface. The conductive film 689 overlaps with the semiconductor 682 with the insulating film 681 provided therebetween. The conductive film 688 overlaps with the semiconductor 682 with the insulating films 685, 686, and 687 provided therebetween. The conductive films 683 and 684 are connected to the semiconductor 682.

The description of the conductive films 673 and 674 in FIGS. 23A to 23D can be referred to for the details of the conductive films 689 and 688.

The conductive films 689 and 688 may be supplied with different potentials, or may be supplied with the same potential at the same time. The conductive film 688 serving as a second gate electrode in the transistor 680 leads to stabilization of threshold voltage. Note that the conductive film 688 is unnecessary in some cases.

The description of the semiconductor 662 in FIGS. 23A to 23D can be referred to for the details of the semiconductor 682. The semiconductor 682 may be a single layer or a stack including a plurality of semiconductor layers.

The description of the conductive films 671 and 672 in FIGS. 23A to 23D can be referred to for the details of the conductive films 683 and 684.

The description of the insulating film 653 in FIGS. 23A to 23D can be referred to for the details of the insulating film 681.

The insulating films 685 to 687 are sequentially stacked over the semiconductor 682 and the conductive films 683 and 684 in FIG. 32B; however, an insulating film provided over the semiconductor 682 and the conductive films 683 and 684 may be a single layer or a stack including a plurality of insulating films.

In the case of using an oxide semiconductor as the semiconductor 682, the insulating film 686 preferably contains oxygen at a proportion higher than or equal to that in the stoichiometric composition and has a function of supplying part of oxygen to the semiconductor 682 by heating. Note that in the case where the semiconductor 682 is damaged at the time of formation of the insulating film 686 when the insulating film 686 is directly formed on the semiconductor 682, the insulating film 685 is preferably provided between the semiconductor 682 and the insulating film 686, as illustrated in FIG. 32B. The insulating film 685 preferably allows oxygen to pass therethrough, and causes little damage to the semiconductor 682 when the insulating film 685 is formed compared with the case of the insulating film 686. If damage to the semiconductor 682 can be reduced and the insulating film 686 can be formed directly on the semiconductor 682, the insulating film 685 is not necessarily provided.

For the insulating films 686 and 685, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 687 preferably has an effect of blocking diffusion of oxygen, hydrogen, and water. Alternatively, the insulating film 687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 687 has an effect of blocking diffusion of water, hydrogen, and the like, impurities such as water and hydrogen that exist in a resin in a panel or exist outside the panel can be prevented from entering the semiconductor 682. Since an oxide semiconductor is used as the semiconductor 682, part of water or hydrogen that enters the oxide semiconductor serves as an electron donor (donor). Thus, the use of the insulating film 687 having the blocking effect can prevent a shift in the threshold voltage of the transistor 680 due to generation of donors.

In addition, since an oxide semiconductor is used as the semiconductor 682, when the insulating film 687 has an effect of blocking diffusion of oxygen, diffusion of oxygen from the oxide semiconductor to the outside can be prevented. Accordingly, oxygen vacancies in the oxide semiconductor that serve as donors are reduced, so that a shift in the threshold voltage of the transistor 680 due to generation of donors can be prevented.

<Device Structure Example 1 of Chip>

Figure 33:
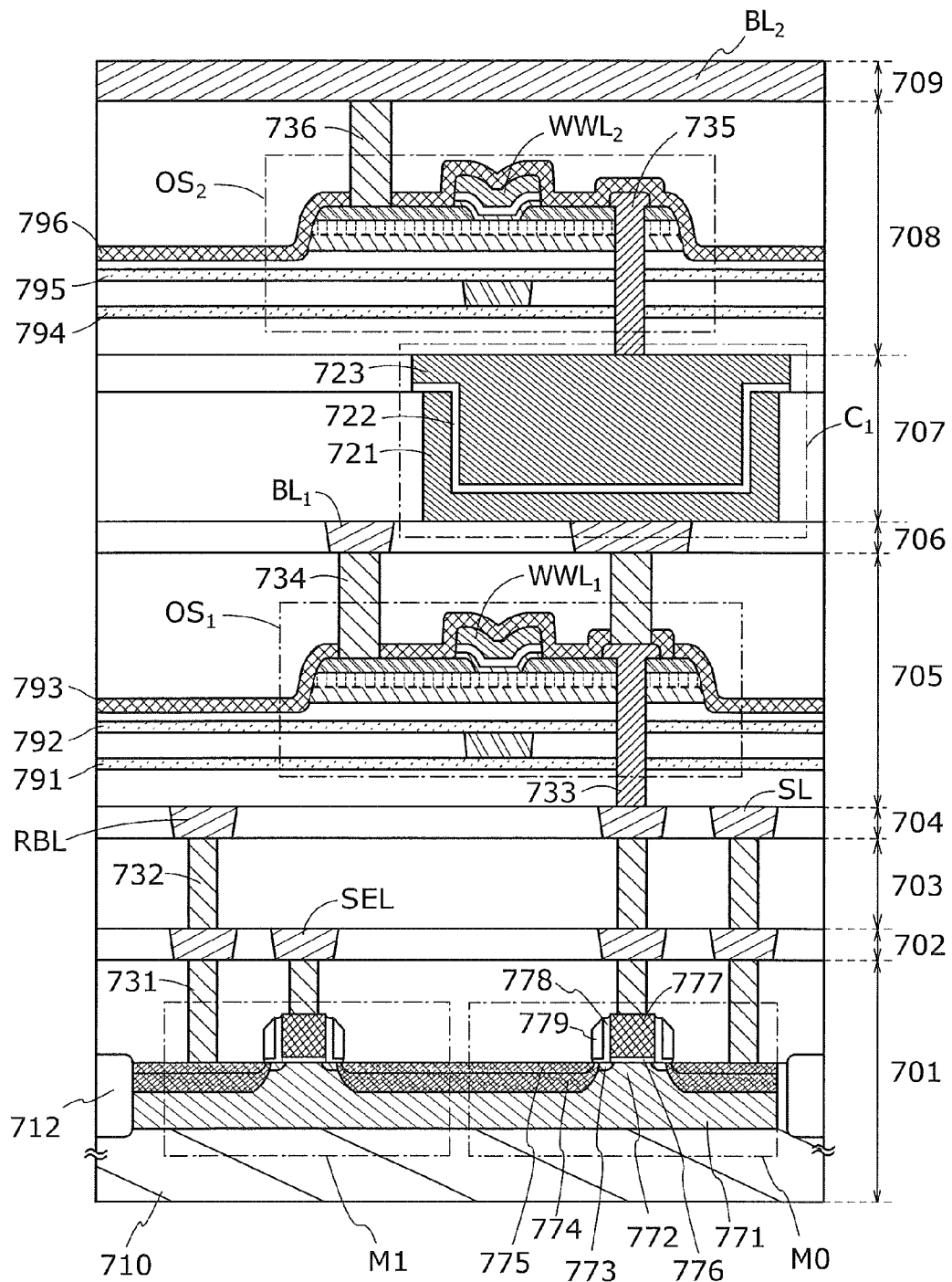
FIG. 33 is a cross-sectional view illustrating a structure example of a memory cell.

A cross-sectional view in FIG. 33 shows an example in which the memory cell 100*a* is formed in one chip.

The memory cell 100*a* in FIG. 33 includes layers 701, 702, 703, 704, 705, 706, 707, 708, and 709 in this order from the bottom.

The layer 701 includes a substrate 710, the transistors M0 and M1 formed using the substrate 710, an element isolation layer 712, and a plurality of plugs including a plug 731.

The layer 702 includes a plurality of wirings including the wiring SEL.

The layer 703 includes a plurality of plugs including a plug 732.

The layer 704 includes a plurality of wirings including the wirings SL and RBL.

The layer 705 includes the transistor $OS_1$, insulating films 791, 792, and 793, and a plurality of plugs including plugs 733 and 734. Furthermore, a gate of the transistor $OS_1$ serves as the wiring $WWL_1$.

The layer 706 includes a plurality of wirings including the wiring $BL_1$.

The layer 707 includes the capacitor $C_1$. The capacitor $C_1$ includes a first electrode 721, an insulating film 722, and a second electrode 723.

The layer 708 includes the transistor $OS_2$, insulating films 794, 795, and 796, and a plurality of plugs including plugs 735 and 736. Furthermore, a gate of the transistor $OS_2$ serves as the wiring $WWL_2$.

The layer 709 includes the wiring $BL_2$.

FIG. 33 shows a structure example of the memory cell 100a, and the memory cell 100a is not limited thereto. For example, the capacitor $C_1$ may be formed above the transistor $OS_2$. Alternatively, the capacitor $C_1$ may be provided in the layer between the transistor $OS_1$ and the transistors M0 and M1.

Furthermore, in the case where the memory cell 100b in which the transistors $OS_1$ to $OS_N$ are included is formed, the transistors $OS_3$ to $OS_N$ may be formed in this order over the transistor $OS_2$ in FIG. 33.

As the substrate 710, a single crystal semiconductor substrate or a polycrystalline semiconductor substrate of silicon or silicon carbide, a compound semiconductor substrate of silicon germanium, an SOI substrate, or the like can be used.

Examples of the substrate 710 are a glass substrate, a quartz substrate, a plastic substrate, a metal substrate, a stainless steel substrate, a substrate including stainless steel foil, a tungsten substrate, and a substrate including tungsten foil, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), a leather substrate, and a rubber substrate. When such a substrate is used, a transistor with excellent properties or a transistor with low power consumption can be formed, a device with high durability, high heat resistance can be provided, or reduction in weight or thickness can be achieved.

In the example illustrated in FIG. 33, a single crystal silicon wafer is used as the substrate 710.

The transistors M0 and M1 each include a channel formation region 772 formed in a well 771, low concentration impurity regions 773 and high concentration impurity regions 774 (also collectively referred to as an impurity region simply) provided so as to sandwich the channel formation region 772, conductive regions 775 provided in contact with the impurity regions, a gate insulating film 776 provided over the channel formation region 772, and a gate electrode 777 provided over the gate insulating film 776. Sidewall insulating films 778 and 779 are provided on side surfaces of the gate electrode 777. Note that the conductive regions 775 can be formed using metal silicide or the like.

As the transistors $OS_1$ and $OS_2$, any of the above-described transistor 600, transistors 600a to 600e, and transistor 680 can be used. FIG. 33 is a cross-sectional view in the case where the transistor 600c in FIG. 29 is used.

Insulating films 791 to 796 preferably include at least one layer that is formed using an insulator having a blocking effect against hydrogen, water, and the like. Water, hydrogen, and the like are factors that generate carriers in an oxide semiconductor; thus, providing such a blocking layer against hydrogen, water, and the like can improve reliability of the transistor M0. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

<Device Structure Example 2 of Chip>

Figure 34:
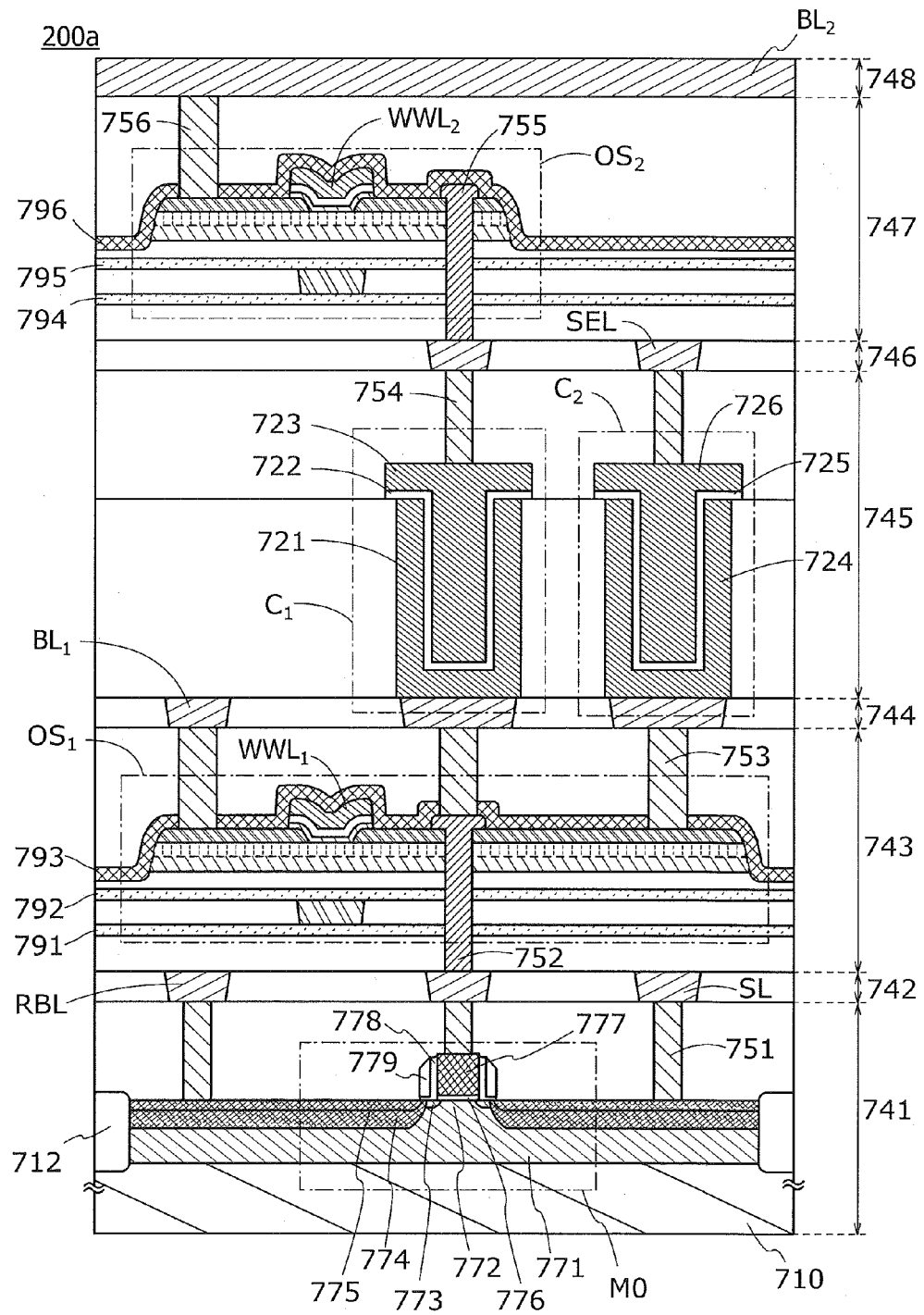
FIG. 34 is a cross-sectional view illustrating a structure example of a memory cell.

A cross-sectional view in FIG. 34 shows an example in which the memory cell 200a is formed in one chip.

The memory cell 200a in FIG. 34 includes layers 741, 742, 743, 744, 745, 746, 747, and 748 in this order from the bottom.

The layer 741 includes a substrate 710, the transistor M0 foiled using the substrate 710, an element isolation layer 712, and a plurality of plugs including a plug 751.

The layer 742 includes a plurality of wirings including the wiring SL.

The layer 743 includes the transistor $OS_1$, insulating films 791, 792, and 793, and a plurality of plugs including plugs 752 and 753. Furthermore, a gate of the transistor $OS_1$ serves as the wiring $WWL_1$.

The layer 744 includes a plurality of wirings including the wiring $BL_1$.

The layer 745 includes the capacitors $C_1$ and $C_2$, and a plurality of plugs including a plug 754. The capacitor $C_1$ includes a first electrode 721, an insulating film 722, and a second electrode 723. The capacitor $C_2$ includes a first electrode 724, an insulating film 725, and a second electrode 726.

The layer 746 includes a plurality of wirings including the wiring SEL.

The layer 747 includes the transistor $OS_2$, insulating films 794, 795, and 796, and a plurality of plugs including plugs 755 and 756. Furthermore, a gate of the transistor $OS_2$ serves as the wiring $WWL_2$.

The layer 748 includes the wiring $BL_2$.

FIG. 34 shows a structure example of the memory cell 200a, and the memory cell 200a is not limited thereto. For example, the capacitors $C_1$ and $C_2$ may be formed above the transistor $OS_2$. Alternatively, the capacitors $C_1$ and $C_2$ may be provided in the layer between the transistor $OS_1$ and the transistor M0.

Furthermore, in the case where the memory cell 200b in which the transistors $OS_1$ to $OS_N$ are included is formed, the transistors $OS_3$ to $OS_N$ may be formed in this order over the transistor $OS_2$ in FIG. 34.

The description in FIG. 33 can be referred to for the details of the substrate 710, the transistor M0, the transistors $OS_1$ and $OS_2$, and the insulating films 791 to 796.

The wirings and the plugs in FIG. 33 and FIG. 34 preferably have a single-layer structure or a layered structure of a conductive film containing a low-resistance material selected from copper (Cu), tungsten (VT), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the plugs are preferably formed using a low-resistance conductive material such as aluminum or copper. The plugs are more preferably formed using a Cu—Mn alloy, in which case manganese oxide formed at the interface with an insulator containing oxygen has a function of preventing Cu diffusion.

In FIG. 33 and FIG. 34, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a substance that contains more oxygen than nitrogen, and a nitride oxide refers to a substance that contains more nitrogen than oxygen.

Embodiment 5

In this embodiment, a CPU in which the memory cell described in Embodiment 1 or 2 can be used will be described.

Figure 35:
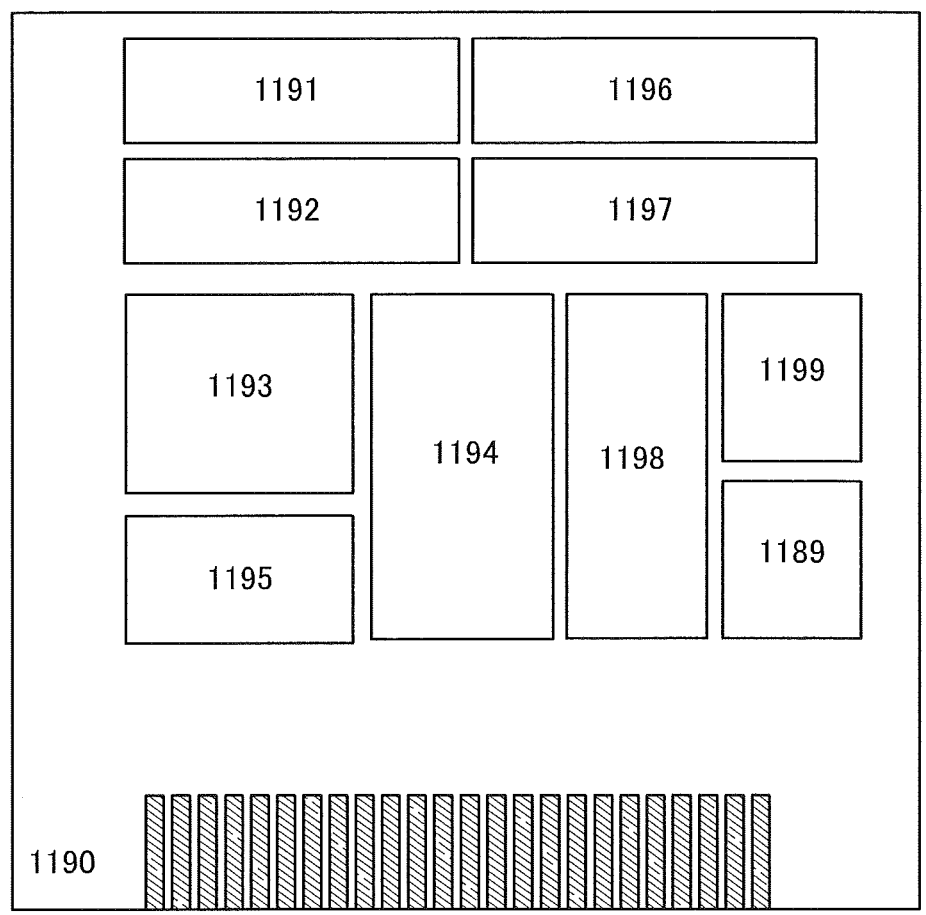
FIG. 35 is a block diagram illustrating a configuration example of a CPU.

FIG. 35 is a block diagram illustrating a configuration example of a CPU.

The CPU illustrated in FIG. 35 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 35 is just an example in which the configuration is simplified, and an actual CPU may have a variety of configurations depending on the application. For example, the CPU may have the following configuration: a structure including the CPU illustrated in FIG. 35 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 35, a memory cell is provided in the register 1196. For the memory cell of the register 1196, the memory cell described in Embodiment 1 or 2 can be used.

In the CPU illustrated in FIG. 35, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Embodiment 6

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 36A to 36F illustrate specific examples of these electronic devices.

Figure 36A:
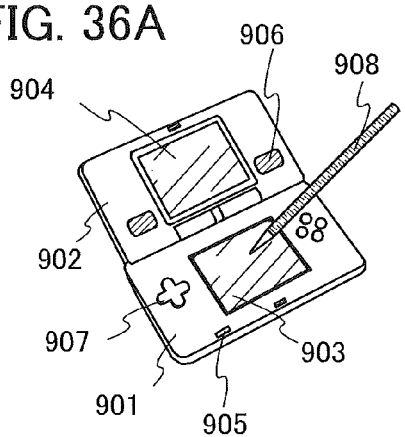
FIGS. 36A to 36F are perspective views each illustrating an example of an electronic device.

FIG. 36A illustrates a portable game machine, which includes a housing 901, a housing 902, a display portion 903, a display portion 904, a microphone 905, a speaker 906, an operation key 907, a stylus 908, and the like. Although the portable game machine in FIG. 36A has the two display portions 903 and 904, the number of display portions included in a portable game machine is not limited to this.

Figure 36B:
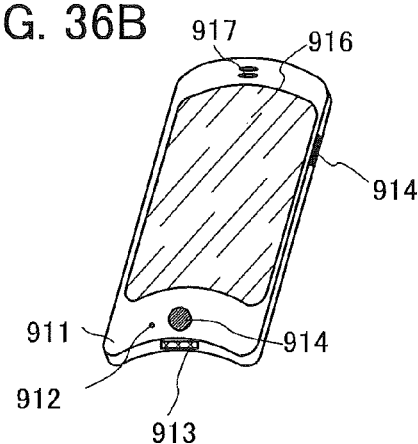

FIG. 36B illustrates a cellular phone, which is provided with a housing 911, a display portion 916, operation buttons 914, an external connection port 913, a speaker 917, a microphone 912, and the like. When the display portion 916 of the cellular phone illustrated in FIG. 36B is touched with a finger or the like, data can be input. Further, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 36C:
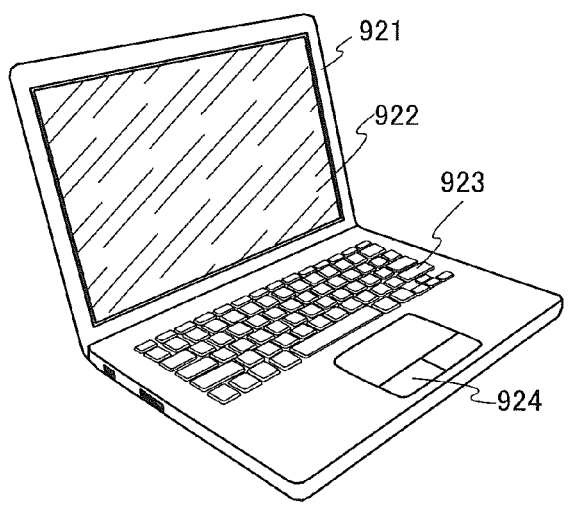

FIG. 36C illustrates a notebook personal computer, which includes a housing 921, a display portion 922, a keyboard 923, a pointing device 924, and the like.

Figure 36D:
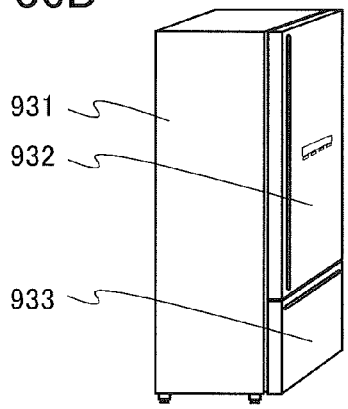

FIG. 36D illustrates an electric refrigerator-freezer, which includes a housing 931, a refrigerator door 932, a freezer door 933, and the like.

Figure 36E:
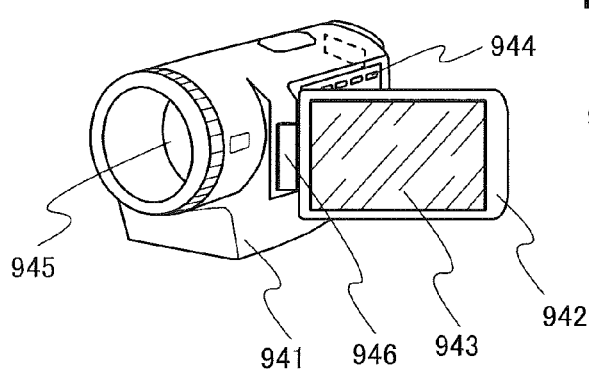

FIG. 36E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 36F:
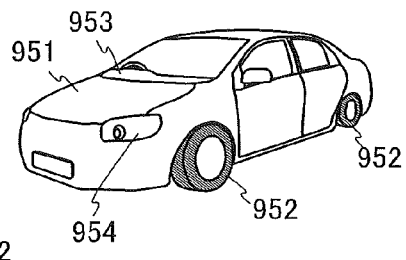
Figure 37A:
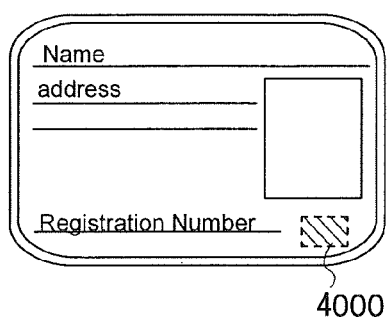
FIGS. 37A to 37F are perspective views each illustrating a usage example of an RFID tag.
Figure 37B:
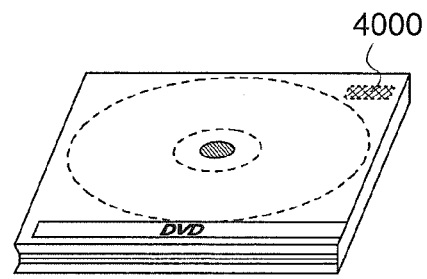
Figure 37C:
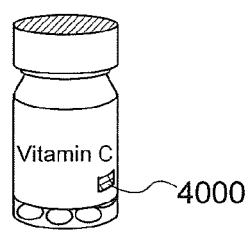
Figure 37D:
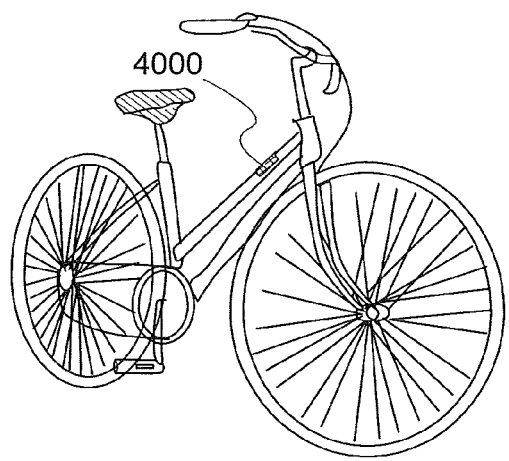
Figure 37E:
Figure 37F:
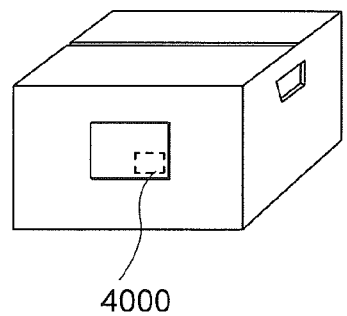

FIG. 36F illustrates a car, which includes a car body 951, wheels 952, a dashboard 953, lights 954, and the like.

Embodiment 7

In this embodiment, application examples of an RF tag that can be formed using the semiconductor device of one embodiment of the present invention will be described with reference to FIGS. 37A to 37F. The RF tag is widely used and can be provided for, for example, products such as bills, coins, securities, bearer bonds, documents (e.g., driver's licenses or resident's cards, see FIG. 37A), recording media (e.g., DVDs or video tapes, see FIG. 37B), packaging containers (e.g., wrapping paper or bottles, see FIG. 37C), vehicles (e.g., bicycles, see FIG. 37D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 37E and 37F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Embodiment 8

In this embodiment, the structure of an oxide semiconductor film that can be used for the OS transistor described in Embodiment 3 will be described.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

An oxide semiconductor film is classified into a single crystal oxide semiconductor film and a non-single-crystal oxide semiconductor film. Alternatively, an oxide semiconductor is classified into a crystalline oxide semiconductor and an amorphous oxide semiconductor, for example.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of the crystalline oxide semiconductor include a single crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in the direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the plan high-resolution TEM image of the CAAC-OS film observed in the direction substantially perpendicular to the sample surface, metal atoms are arranged in a triangular or hexagonal arrangement in the crystal parts. However, there is no regularity of arrangement of metal atoms between different crystal parts.

For example, when the structure of a CAAC-OS including an InGaZnO$_4$ crystal is analyzed by an out-of-plane method using an X-ray diffraction (XRD) apparatus, a peak may appear at a diffraction angle (2θ) of around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

Note that in analysis of the CAAC-OS film by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film with low impurity concentration. The impurity is an element other than the main components of the oxide semiconductor film, such as hydrogen, carbon, silicon, or a transition metal element. In particular, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS film is an oxide semiconductor having a low density of defect states. In some cases, oxygen vacancies in the oxide semiconductor film serve as carrier traps or serve as carrier generation sources when hydrogen is captured therein, for example.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

Note that in this specification and the like, the carrier density of a substantially intrinsic oxide semiconductor film is higher than or equal to $1\times10^{-9}/cm^3$ and lower than $8\times10^{11}/cm^3$, preferably lower than $1\times10^{11}/cm^3$, more preferably lower than $1\times10^{10}/cm^3$. With a highly purified intrinsic oxide semiconductor film, the transistor can have stable electric characteristics.

With the use of the CAAC-OS film in a transistor, variation in the electrical characteristics of the transistor due to irradiation with visible light or ultraviolet light is small.

Next, a microcrystalline oxide semiconductor will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the diameter of a crystal part (the electron diffraction is also referred to as selected-area electron diffraction). Meanwhile, spots appear in a nanobeam electron diffraction pattern of the nc-OS film when an electron beam having a probe diameter close to or smaller than the diameter of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film will be described.

The amorphous oxide semiconductor film is an oxide semiconductor film having disordered atomic arrangement and no crystal part and exemplified by an oxide semiconductor film that exists in an amorphous state, such as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak that shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. The growth of the crystal part occurs due to the crystallization of the a-like OS film, which is induced by a slight amount of electron beam employed in the TEM observation. In contrast, in the nc-OS film that have good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film depends on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

Specific examples of the above description will be given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stack including two or more of an amorphous oxide semiconductor film, an a-like OS film, a microcrystalline oxide semiconductor film, and a CAAC-OS film, for example.

This application is based on Japanese Patent Application serial no. 2014-249820 filed with Japan Patent Office on Dec. 10, 2014, the entire contents of which are hereby incorporated by reference.

What is claimed is:

1. A semiconductor device comprising:
   a transistor;
   a first switch;
   a second switch; and
   a first capacitor,
   wherein a first terminal of the capacitor is electrically connected to a gate of the transistor,
   wherein a first potential is supplied to the gate of the transistor through the first switch,
   wherein a second potential is supplied to a second terminal of the first capacitor through the second switch, and
   wherein a first capacitance value of the first capacitor is equal to a gate capacitance value of the transistor.

2. The semiconductor device according to claim 1, wherein the first switch and the second switch are transistors each including an oxide semiconductor in a channel formation region.

3. The semiconductor device according to claim 1,
   wherein the first switch is positioned over the transistor, and
   wherein the second switch is positioned over the first switch.

4. The semiconductor device according to claim 1,
   wherein the first switch and the second switch are transistors each including an oxide semiconductor in a channel formation region,
   wherein the first switch is positioned over the transistor, and
   wherein the second switch is positioned over the first switch.

5. The semiconductor device according to claim 1, further comprising a second capacitor,
   wherein a first terminal of the second capacitor is electrically connected to the gate of the transistor, and
   wherein a third potential is supplied to a second terminal of the second capacitor.

6. An electronic device comprising:
   the semiconductor device according to claim 1; and
   at least one of a microphone, a speaker, a display portion, and an operation key.

7. A semiconductor device comprising:
   a transistor;
   a first switch;
   a second switch; and
   a first capacitor,
   wherein a first terminal of the capacitor is electrically connected to a gate of the transistor,
   wherein a first potential is supplied to the gate of the transistor through the first switch,
   wherein a second potential is supplied to a second terminal of the first capacitor through the second switch, and
   wherein an absolute value of a difference between a first capacitance value of the first capacitor and a gate capacitance value of the transistor is within 20% of each of the first capacitance value and the gate capacitance value.

8. The semiconductor device according to claim 7, wherein the first switch and the second switch are transistors each including an oxide semiconductor in a channel formation region.

9. The semiconductor device according to claim 7,
   wherein the first switch is positioned over the transistor, and
   wherein the second switch is positioned over the first switch.

10. The semiconductor device according to claim 7,
    wherein the first switch and the second switch are transistors each including an oxide semiconductor in a channel formation region,
    wherein the first switch is positioned over the transistor, and
    wherein the second switch is positioned over the first switch.

11. The semiconductor device according to claim 7, further comprising a second capacitor,
    wherein a first terminal of the second capacitor is electrically connected to the gate of the transistor,
    wherein a third potential is supplied to a second terminal of the second capacitor, and
    wherein an absolute value of a difference between the first capacitance value and a sum of the gate capacitance value of the transistor and a second capacitance value of the second capacitor is within 20% of each of the first capacitance value and the sum.

12. An electronic device comprising:
    the semiconductor device according to claim 7; and
    at least one of a microphone, a speaker, a display portion, and an operation key.

13. A semiconductor device comprising:
    a transistor;
    first to N-th switches; and
    first to (N−1)-th capacitors,
    wherein N is a natural number of three or more,
    wherein a first terminal of the first capacitor is electrically connected to a gate of the transistor,
    wherein a first terminal of a J-th capacitor is electrically connected to a second terminal of a (J−1)-th capacitor,
    wherein J is a natural number of two or more and (N−1) or less,
    wherein a first potential is supplied to the gate of the transistor through the first switch,
    wherein a K-th potential is supplied to a second terminal of a (K−1)-th capacitor through a K-th switch,
    wherein K is a natural number of two or more and N or less,
    wherein a first capacitance value of the first capacitor is equal to a gate capacitance value of the transistor, and
    wherein a second capacitance value of the J-th capacitor is equal to a third capacitance value of the (J−1)-th capacitor.

14. The semiconductor device according to claim 13, further comprising an N-th capacitor,
    wherein a first terminal of the N-th capacitor is electrically connected to the gate of the transistor, and
    wherein an (N+1)-th potential is supplied to a second terminal of the N-th capacitor.

15. The semiconductor device according to claim 13, wherein the first to N-th switches are transistors each including an oxide semiconductor in a channel formation region.

16. The semiconductor device according to claim 13,
    wherein the first switch is positioned over the transistor, and
    wherein the K-th switch is positioned over the (K−1)-th switch.

17. The semiconductor device according to claim 13,
    wherein the first to N-th switches are transistors each including an oxide semiconductor in a channel formation region,
    wherein the first switch is positioned over the transistor, and
    wherein the K-th switch is positioned over the (K−1)-th switch.

18. An electronic device comprising:
    the semiconductor device according to claim 13; and
    at least one of a microphone, a speaker, a display portion, and an operation key.

* * * * *

UNITED STATES PATENT AND TRADEMARK OFFICE
CERTIFICATE OF CORRECTION

PATENT NO.      : 9,496,285 B2
APPLICATION NO. : 14/962809
DATED           : November 15, 2016
INVENTOR(S)     : Shuhei Nagatsuka It is certified that error appears in the above-identified patent and that said Letters Patent is hereby corrected as shown below:

In the Specification

Column 4, Line 5; Change "teen" to --term--.

Column 11, Line 5; Change "$C_1 \times \Delta V_{FN2}=(C_1+C_{Tr})\lambda\Delta V_{FN1}$" to --$C_1 \times \Delta V_{FN2}=(C_1+C_{Tr}) \times \Delta V_{FN1}$--.

Column 12, Line 24; Change "($2^M$level)" to --($2^M$-level)--.

Column 16, Line 18; Change "($2^M$ level)" to --($2^M$-level)--.

Column 19, Line 5; Change "$C_1C_N+C_{TR}$" to --$C_1=C_N+C_{TR}$--.

Column 19, Line 9; Change "$C_{(N-1)}=C_{(N-2)})=C_2=C_1$" to --$C_{(N-1)}=C_{(N-2)}=C_2=C_1$--.

Column 20, Line 53; Change "fainted" to --formed--.

Column 23, Line 24; Change "($2^M$ level)" to --($2^M$-level)--.

Column 31, Line 6; Change "Mare" to --M are--.

Column 36, Line 1; Change "polyimide" to --polyamide--.

Column 36, Line 12; Change "at, a higher" to --at a higher--.

Column 38, Line 12; Change "alternatively;" to --alternatively,--.

Column 39, Line 31; Change "foimed." to --formed.--.

Column 44, Line 36; Change "diffitsion" to --diffusion--.

Signed and Sealed this
Fourth Day of April, 2017

Michelle K. Lee
*Director of the United States Patent and Trademark Office*

CERTIFICATE OF CORRECTION (continued)
U.S. Pat. No. 9,496,285 B2

Column 46, Line 43; Change "foiled" to --formed--.

Column 47, Line 15; Change "(VT)," to --(W),--.

Column 53, Line 47; Change "0.29 mm" to --0.29 nm--.